(12) United States Patent
Mizutani et al.

(10) Patent No.: US 9,922,987 B1
(45) Date of Patent: Mar. 20, 2018

(54) THREE-DIMENSIONAL MEMORY DEVICE CONTAINING SEPARATELY FORMED DRAIN SELECT TRANSISTORS AND METHOD OF MAKING THEREOF

(71) Applicant: SANDISK TECHNOLOGIES LLC, Plano, TX (US)

(72) Inventors: Yuki Mizutani, San Jose, CA (US); James Kai, Santa Clara, CA (US); Fumiaki Toyama, Cupertino, CA (US); Shigehiro Fujino, Yokkaichi (JP); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/468,732

(22) Filed: Mar. 24, 2017

(51) Int. Cl.
| | |
|---|---|
| H01L 27/115 | (2017.01) |
| H01L 27/11548 | (2017.01) |
| H01L 27/11519 | (2017.01) |
| H01L 27/11556 | (2017.01) |
| H01L 27/11565 | (2017.01) |
| H01L 27/11575 | (2017.01) |
| H01L 27/11582 | (2017.01) |
| H01L 23/485 | (2006.01) |

(52) U.S. Cl.
CPC .. *H01L 27/11548* (2013.01); *H01L 27/11519* (2013.01); *H01L 27/11556* (2013.01); *H01L 27/11565* (2013.01); *H01L 27/11575* (2013.01); *H01L 27/11582* (2013.01); *H01L 23/485* (2013.01)

(58) Field of Classification Search
CPC ......... H01L 27/11565; H01L 27/11582; H01L 23/485

USPC .................................. 257/265, 331; 438/212
See application file for complete search history.

(56) References Cited

U.S. PATENT DOCUMENTS

| | | | |
|---|---|---|---|
| 5,915,167 A | 6/1999 | Leedy | |
| 9,331,094 B2 | 1/2016 | Pachamuthu et al. | |
| 9,368,509 B2 | 6/2016 | Pang et al. | |
| 2012/0206979 A1* | 8/2012 | Shin ................. | H01L 27/11582 365/185.26 |
| 2012/0314514 A1* | 12/2012 | Kwon .................... | G11C 7/18 365/189.09 |

(Continued)

OTHER PUBLICATIONS

U.S. Appl. No. 15/056,510, filed Feb. 29, 2016, SanDisk Technologies Inc.

(Continued)

*Primary Examiner* — George Fourson, III
(74) *Attorney, Agent, or Firm* — The Marbury Law Group PLLC

(57) ABSTRACT

Memory stack structures can be formed through an alternating stack of insulating layers and spacer material layers that are formed as, or are subsequently replaced with, electrically conductive layers. The memory stack structures can be formed as rows having a first pitch. Additional insulating layers and at least one drain select level dielectric layer are formed over the alternating stack. Drain select level openings are formed in rows having a smaller second pitch. Partial replacement of the at least one drain select level dielectric layer forms spaced apart electrically conductive line structures that surround a respective plurality of drain select level openings. Drain select level channel portions are subsequently formed in respective drain select level openings.

24 Claims, 49 Drawing Sheets

(56) References Cited

U.S. PATENT DOCUMENTS

| | | | |
|---|---|---|---|
| 2013/0049096 A1* | 2/2013 | Wang | H01L 29/7889 257/324 |
| 2015/0055413 A1* | 2/2015 | Alsmeier | G11C 14/0018 365/185.08 |
| 2015/0063024 A1* | 3/2015 | Yip | G11C 16/02 365/185.05 |
| 2016/0204122 A1 | 7/2016 | Shoji et al. | |
| 2016/0268285 A1* | 9/2016 | Okamoto | H01L 27/11573 |
| 2016/0268297 A1* | 9/2016 | Murakami | H01L 27/11582 |
| 2016/0268304 A1* | 9/2016 | Ikeda | H01L 27/11582 |
| 2016/0322376 A1* | 11/2016 | Lee | H01L 27/11529 |
| 2016/0343657 A1* | 11/2016 | Sawa | H01L 27/11582 |
| 2016/0365354 A1* | 12/2016 | Lee | H01L 27/11582 |
| 2017/0271364 A1* | 9/2017 | Sakuma | H01L 27/11582 |

OTHER PUBLICATIONS

U.S. Appl. No. 15/078,555, filed Mar. 23, 2016, SanDisk Technologies LLC.
U.S. Appl. No. 15/155,639, filed May 16, 2016, SanDisk Technologies LLC.
U.S. Appl. No. 15/174,030, filed Jun. 6, 2016, SanDisk Technologies LLC.
U.S. Appl. No. 15/219,652, filed Jul. 26, 2016, SanDisk Technologies LLC.
U.S. Appl. No. 15/219,719, filed Jul. 26, 2016, SanDisk Technologies LLC.
U.S. Appl. No. 15/225,492, filed Aug. 1, 2016, SanDisk Technologies LLC.
U.S. Appl. No. 15/286,063, filed Oct. 5, 2016, SanDisk Technologies LLC.
U.S. Appl. No. 15/332,429, filed Oct. 24, 2016, SanDisk Technologies LLC.
U.S. Appl. No. 15/337,235, filed Oct. 28, 2016, SanDisk Technologies LLC.
U.S. Appl. No. 15/354,067, filed Nov. 17, 2016, SanDisk Technologies LLC.
U.S. Appl. No. 15/354,795, filed Nov. 17, 2016, SanDisk Technologies LLC.

* cited by examiner

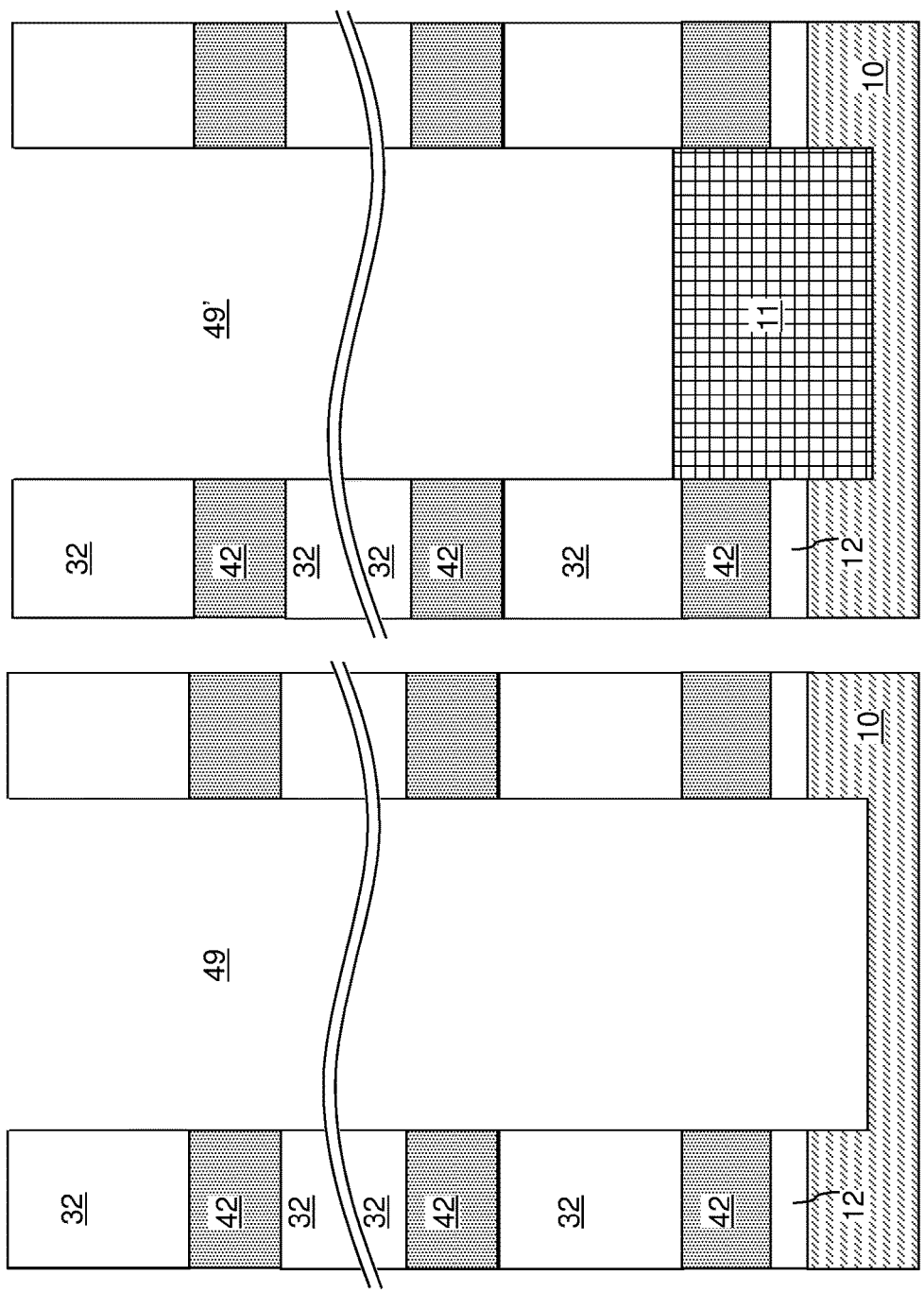

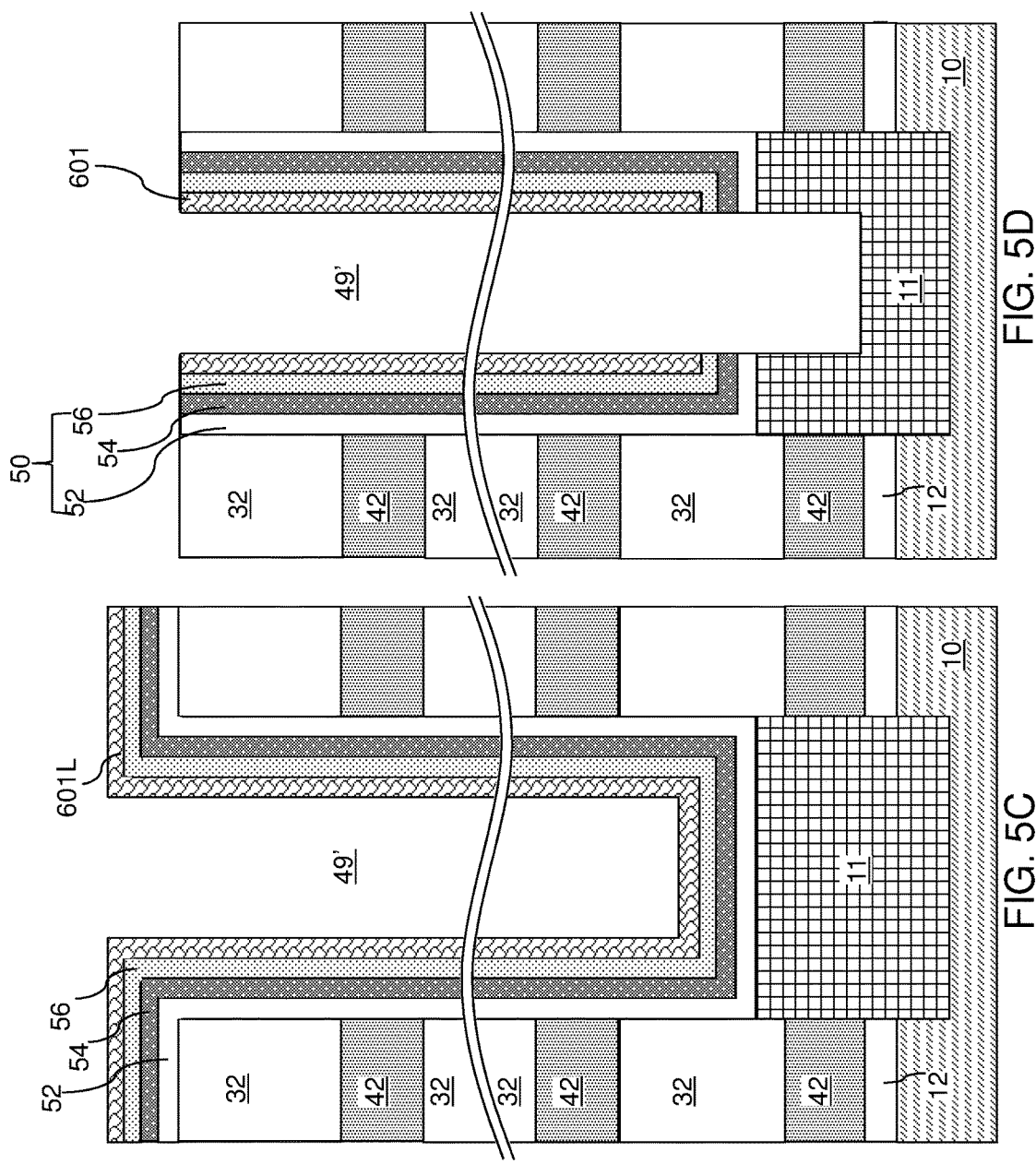

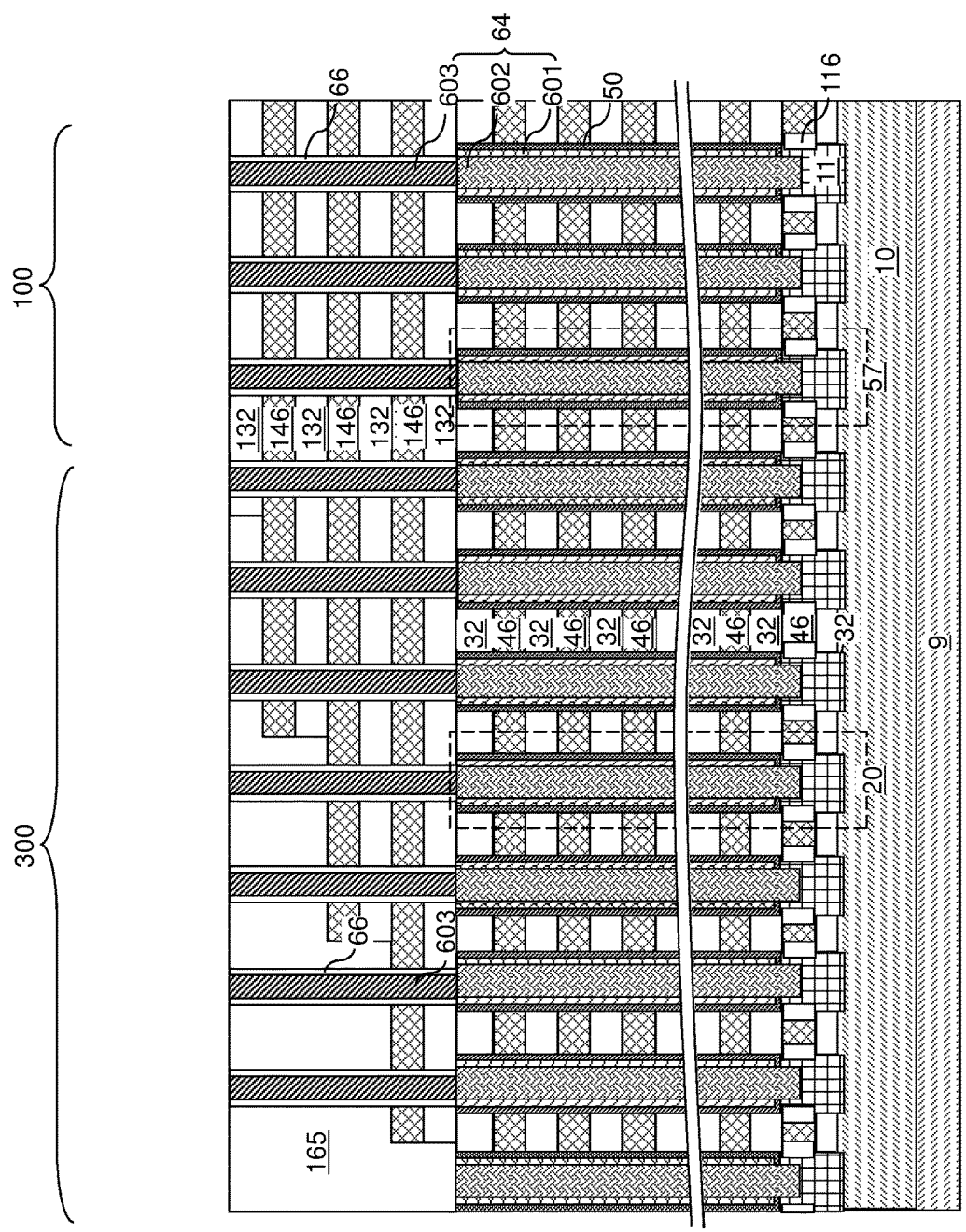

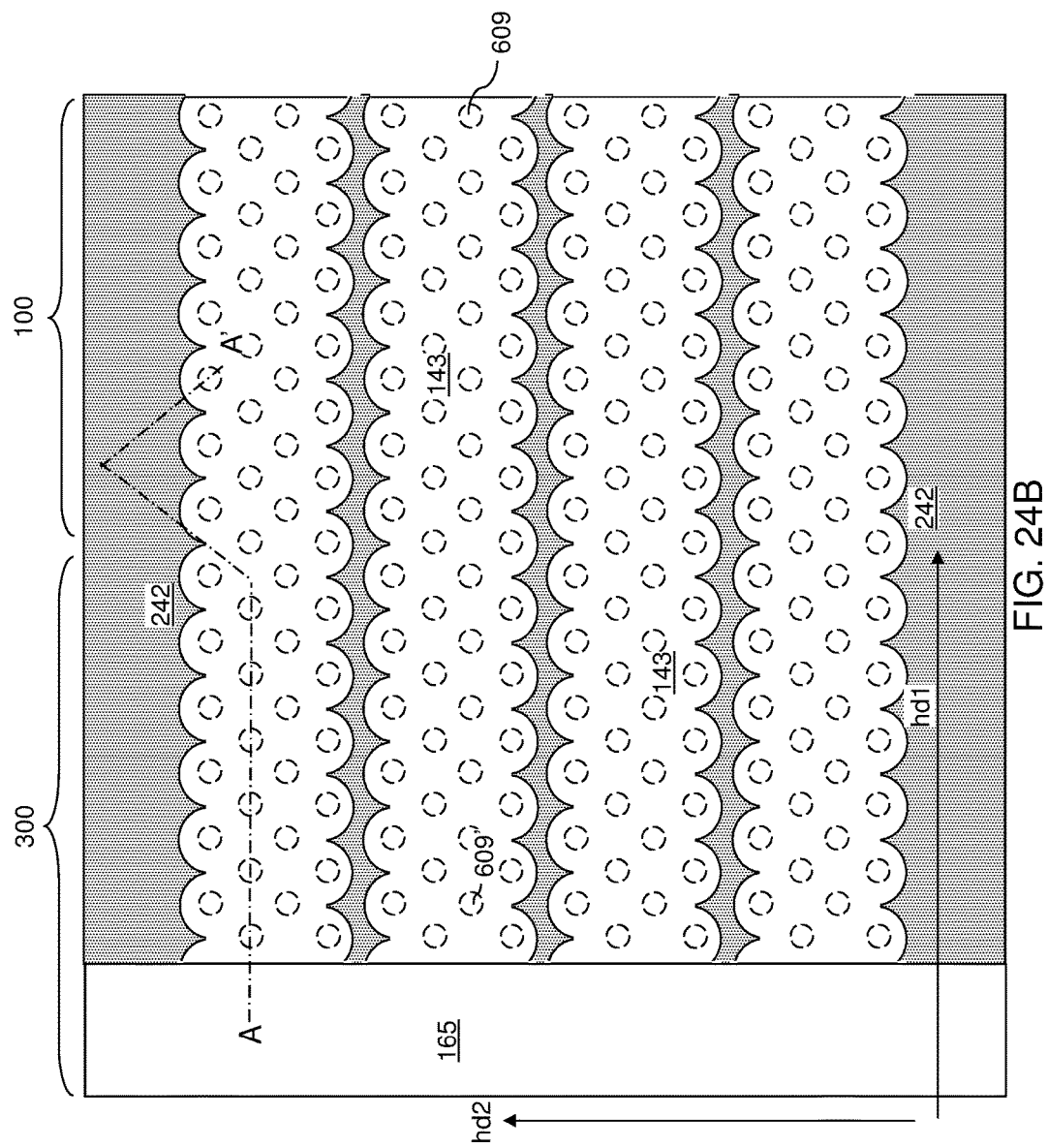

US 9,922,987 B1

THREE-DIMENSIONAL MEMORY DEVICE CONTAINING SEPARATELY FORMED DRAIN SELECT TRANSISTORS AND METHOD OF MAKING THEREOF

FIELD

The present disclosure relates generally to the field of semiconductor devices, and particular to a three-dimensional memory device containing separately formed drain side select transistors and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; at least one drain select level conductive layer located over the alternating stack, wherein each of the at least one drain select level conductive layer comprises electrically conductive line structures that laterally extend along a first horizontal direction and are laterally spaced apart among one another along a second horizontal direction; memory stack structures extending through the alternating stack, wherein each of the memory stack structures comprises a memory film and a memory level channel portion contacting an inner sidewall of the memory film; and drain select level channel portions vertically extending through the at least one drain select level conductive layer, contacting a respective memory level channel portion, and laterally surrounded by a respective drain select level gate dielectric and a respective one of the electrically conductive line structures at each level of the at least one drain select level conductive layer. The memory stack structures are arranged in rows that extend along the first horizontal direction with a first row-to-row pitch along the second horizontal direction across an area including two or more electrically conductive line structures of a same drain select level. For each electrically conductive line structure, a respective array of drain select level channel portions extends through the electrically conductive line structure, and drain select level channel portions within the respective array are arranged in rows that extend along the first horizontal direction with a second row-to-row pitch along the second horizontal direction. The second row-to-row pitch is less than the first row-to-row pitch.

According to another aspect of the present disclosure, a method of forming a three-dimensional memory device is provided. An alternating stack of insulating layers and spacer material layers is formed over a substrate. The spacer material layers are formed as, or are subsequently replaced by, electrically conductive layers. Memory openings are formed through the alternating stack. Memory stack structures are formed in the memory openings. Each of the memory stack structures comprises a memory film and a memory level channel portion contacting an inner sidewall of the memory film. At least one drain select level dielectric layer is formed over the alternating stack. Drain select level openings are formed through the at least one drain select level dielectric layer. Drain select level lateral recesses are formed by removing portions of the at least one drain select level dielectric layer. The drain select level lateral recesses are laterally spaced among one another by electrically insulating line structures that are remaining portions of the at least one drain select level dielectric layer. At least one drain select level conductive layer is formed in the drain select level lateral recesses. Each of the at least one drain select level conductive layer comprises electrically conductive line structures that laterally extend along a first horizontal direction and are laterally spaced apart among one another along a second horizontal direction. Drain select level gate dielectrics at a periphery of each of the drain select level openings. Drain select level channel portions are formed in remaining volumes of the drain select level openings.

BRIEF DESCRIPTION OF THE DRAWINGS

FIGS. 5A-5F are sequential schematic vertical cross-sectional views of a memory opening during formation of a memory stack structure according to the first embodiment of the present disclosure.

FIG. 18A is a schematic vertical cross-sectional view of the first exemplary structure after formation of drain select level channel portions in the drain select level openings according to the first embodiment of the present disclosure.

FIG. 24B is a top-down view of the second exemplary structure of FIG. 24A. The vertical plane A-A' is the plane of the schematic vertical cross-sectional view of FIG. 24A.

DETAILED DESCRIPTION

Figure 1:
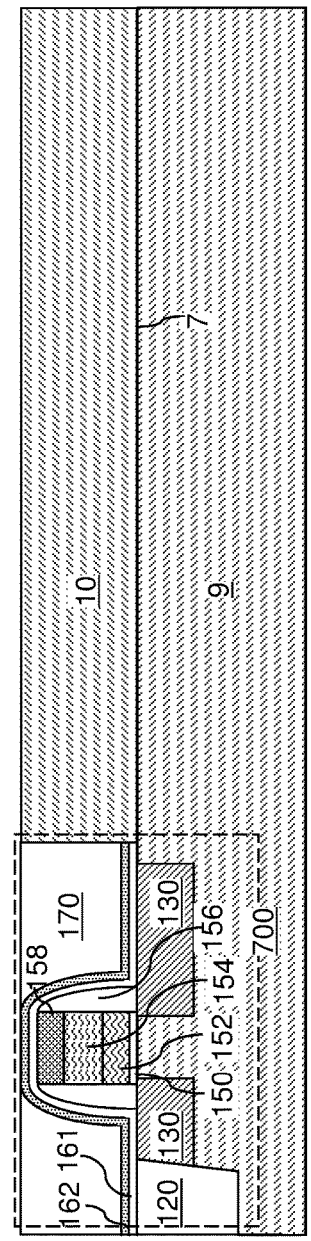
FIG. 1 is a schematic vertical cross-sectional view of a first exemplary structure after formation of at least one peripheral device, a semiconductor material layer, and a gate dielectric layer according to a first embodiment of the present disclosure.

As discussed above, the present disclosure is directed to a three-dimensional memory device containing separately formed drain side select transistors and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170. The semiconductor material layer 10 can be doped with electrical dopants of a first conductivity type, which can be p-type or n-type, The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer can be formed above the semiconductor material layer 10 and the planarization dielectric layer 170. The gate dielectric layer can be, for example, silicon oxide layer. The thickness of the gate dielectric layer can be in a range from 3 nm to 30 nm, although lesser and greater thicknesses can also be employed.

Figure 2:
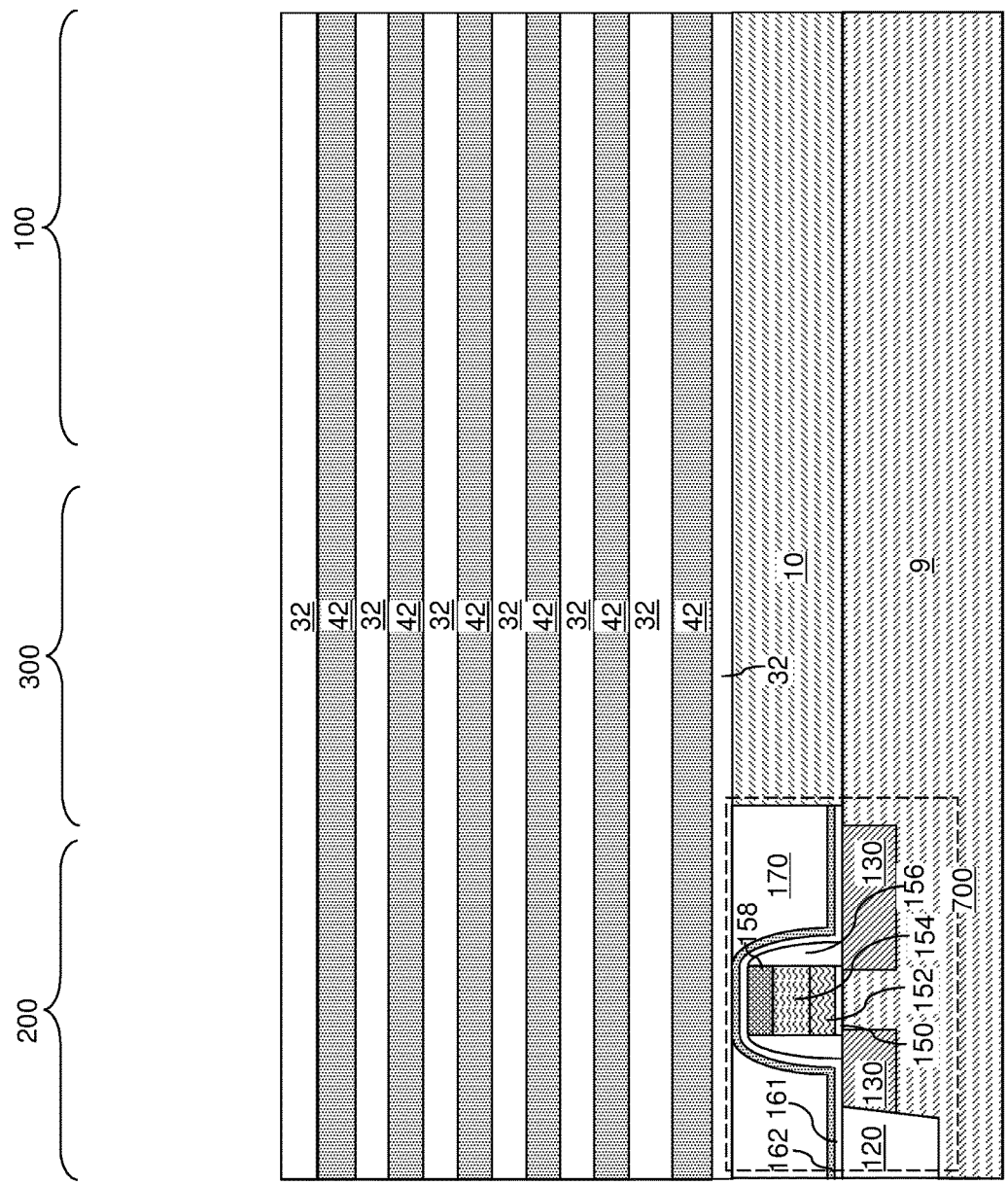
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42. The alternating stack (32, 42) can terminate with a topmost insulating layer 32.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Figure 3:
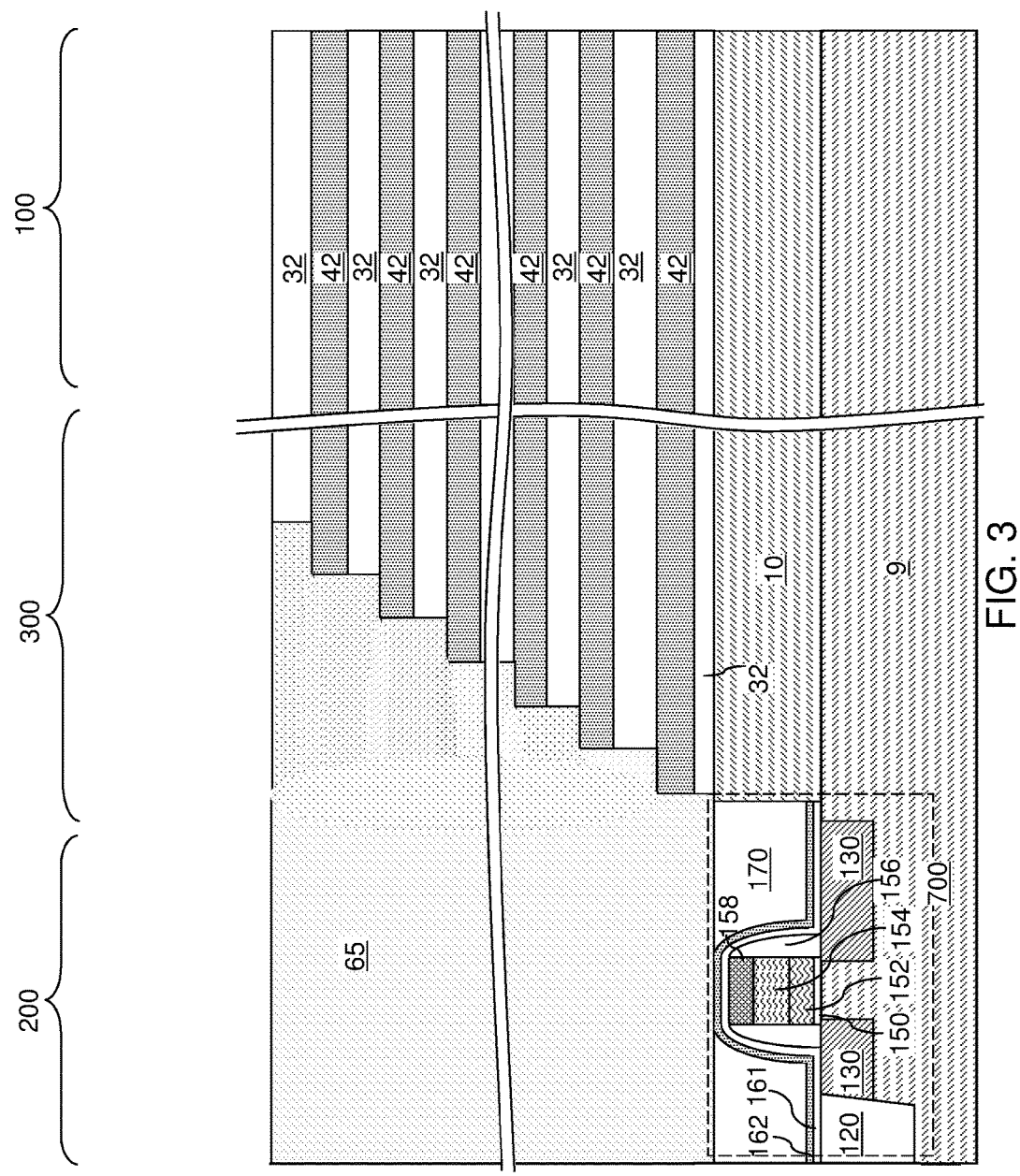
FIG. 3 is a schematic vertical cross-sectional view of the first exemplary structure after formation of stepped terraces and a retro-stepped dielectric material portion according to the first embodiment of the present disclosure.

Referring to FIG. 3, a stepped cavity can be formed within the contact region 300 which is located between the device region 100 and the peripheral region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
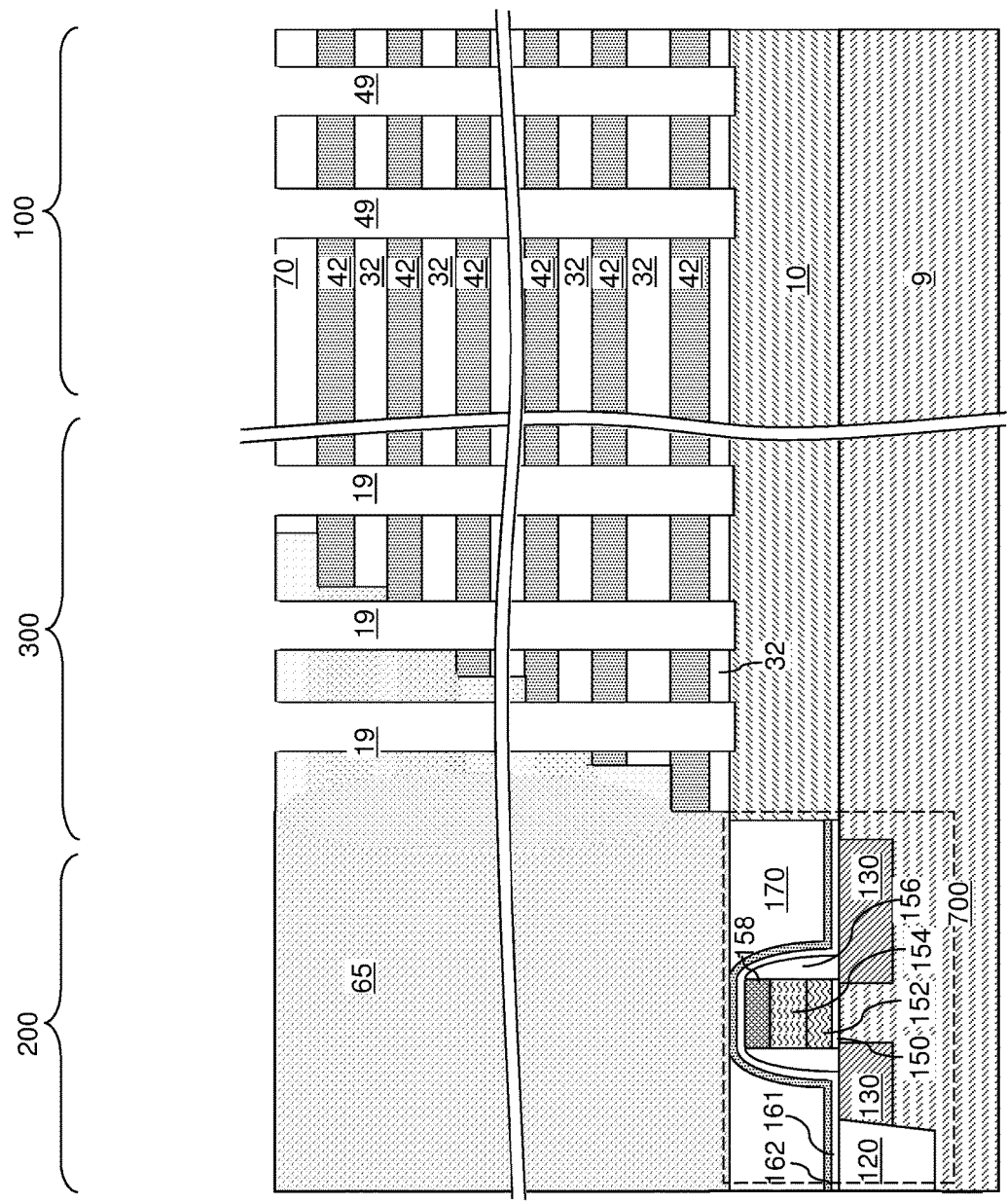
FIG. 4A is a schematic vertical cross-sectional view of the first exemplary structure after formation of memory openings and support openings according to the first embodiment of the present disclosure.
Figure 4B:
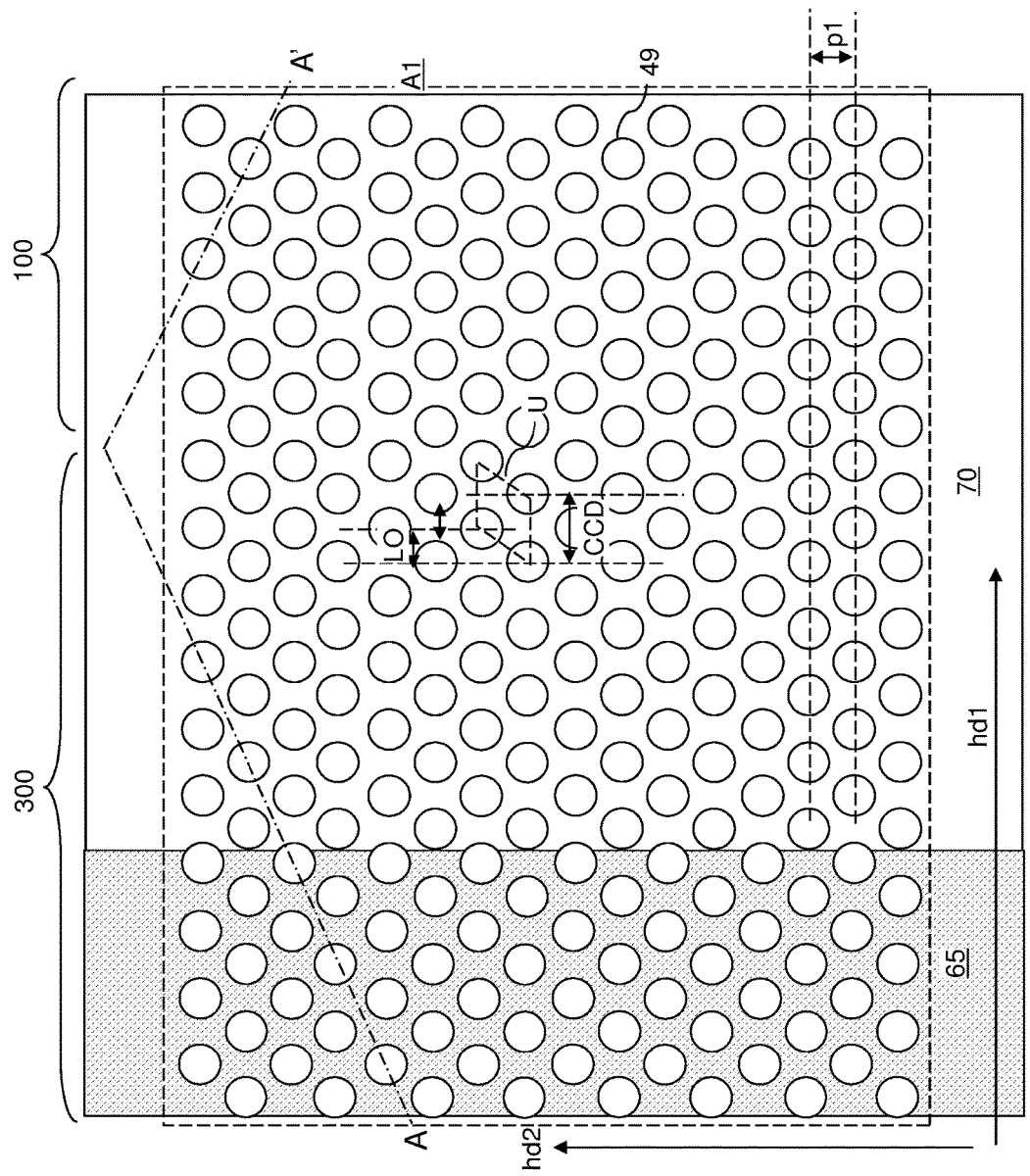
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the topmost insulating layer 32 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19.

As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array A1 of memory level openings is formed, which includes a two-dimensional array A1 of memory openings 49 formed in the memory array region 100 and a two-dimensional array of support openings 19 formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

In one embodiment, the memory openings 49 can be formed as a two-dimensional periodic array A1 including rows that extend along a first horizontal direction hd1 and having a uniform inter-row pitch (which is herein referred to as a first pitch p1) along a second horizontal direction hd2, which can be perpendicular to the first horizontal direction hd1. In one embodiment, a plurality of two-dimensional periodic arrays A1 (only one is shown in FIG. 4B) can be formed such that each two-dimensional periodic array is formed as a cluster that is laterally spaced from a neighboring two-dimensional periodic array along the second horizontal direction hd2. Each two-dimensional periodic array A1 can include respective rows that extend along the first horizontal direction hd1 and have a uniform inter-row pitch (i.e., the first pitch p1) along the second horizontal direction hd2.

In one embodiment, the memory openings 49 within each array of memory openings A1 can be arranged in rows that extend along the first horizontal direction hd1 with a first row-to-row pitch (i.e., the first pitch p1) along the second horizontal direction hd2 across an area defined by a neighboring pair of areas in which memory openings are absent. A lower backside trench can be subsequently formed within each of the areas in which memory openings are absent. In one embodiment, each array of memory openings 49 can be formed as a hexagonal array. As used herein, a "hexagonal array of memory openings" refers to an array of memory openings in which a unit cell U has a shape of parallelogram and includes four memory openings and a lateral offset LO (in the first or row direction hd1) between memory openings of adjacent rows is one half of the center-to-center distance CCD between neighboring memory openings within each row.

FIGS. 5A-5F illustrate structural changes in a memory opening 49, which is one of the memory openings 49 in the first exemplary structure of FIGS. 4A and 4B, during formation of a memory stack structure. The same structural change occurs simultaneously in each of the other memory openings 49 and the support openings 19.

Referring to FIG. 5A, a memory opening 49 in the exemplary device structure of FIGS. 4A and 4B is illustrated. The memory opening 49 extends through the topmost insulating layer 32, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial pedestal can be formed at the bottom portion of each memory opening 49 and each support openings 19, for example, by selective epitaxy. Each epitaxial pedestal 11 comprises a single crystalline semiconductor material in epitaxial alignment with the single crystalline semiconductor material of the semiconductor material layer 10. In one embodiment, the epitaxial pedestal 11 can be doped with electrical dopants of the same conductivity type as the semiconductor material layer 10. In one embodiment, the top surface of each epitaxial pedestal 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial pedestals 11 with a respective conductive material layer. The epitaxial pedestal 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial pedestal 11. In one embodiment, the epitaxial pedestal 11 can comprise single crystalline silicon. In one embodiment, the epitaxial pedestal 11 can have a doping of the first conductivity type, which is the same as the conductivity type of the semiconductor material layer 10 that the epitaxial pedestal contacts. If a semiconductor material layer 10 is not present, the epitaxial pedestal 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional memory-level semiconductor channel layer 601L can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional memory-level semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the memory-level semiconductor channel layer 601L includes amorphous silicon or polysilicon. The memory-level semiconductor channel layer 601L can be formed by a conformal deposition method such as low pressure chemical vapor deposition (LPCVD). The thickness of the memory-level semiconductor channel layer 601L can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 5D, the optional memory-level semiconductor channel layer 601L, the tunneling dielectric layer 56, the charge storage layer 54, the blocking dielectric layer 52 are sequentially anisotropically etched employing at least one anisotropic etch process. The portions of the memory-level semiconductor channel layer 601L, the tunneling dielectric layer 56, the charge storage layer 54, and the blocking dielectric layer 52 located above the top surface of the topmost insulating layer 32 can be removed by the at least one anisotropic etch process. Further, the horizontal portions of the memory-level semiconductor channel layer 601L, the tunneling dielectric layer 56, the charge storage layer 54, and the blocking dielectric layer 52 at a bottom of each cavity 49' can be removed to form openings in remaining portions thereof. Each of the memory-level semiconductor channel layer 601L, the tunneling dielectric layer 56, the charge storage layer 54, and the blocking dielectric layer 52 can be etched by anisotropic etch process.

Each remaining portion of the memory-level semiconductor channel layer 601L can have a tubular configuration, and is herein referred to as a first semiconductor channel portion 601. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the epitaxial pedestal 11 (or a surface of the semiconductor substrate layer 10 in case the epitaxial pedestals 11 are not employed) can be physically exposed underneath the opening through the first semiconductor channel portion 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial pedestal 11 (or of the semiconductor substrate layer 10 in case epitaxial pedestals 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel portion 601, the tunneling dielectric layer 56, the charge storage layer 54, and the blocking dielectric layer 52 can have vertically coincident sidewalls.

Figure 5F:
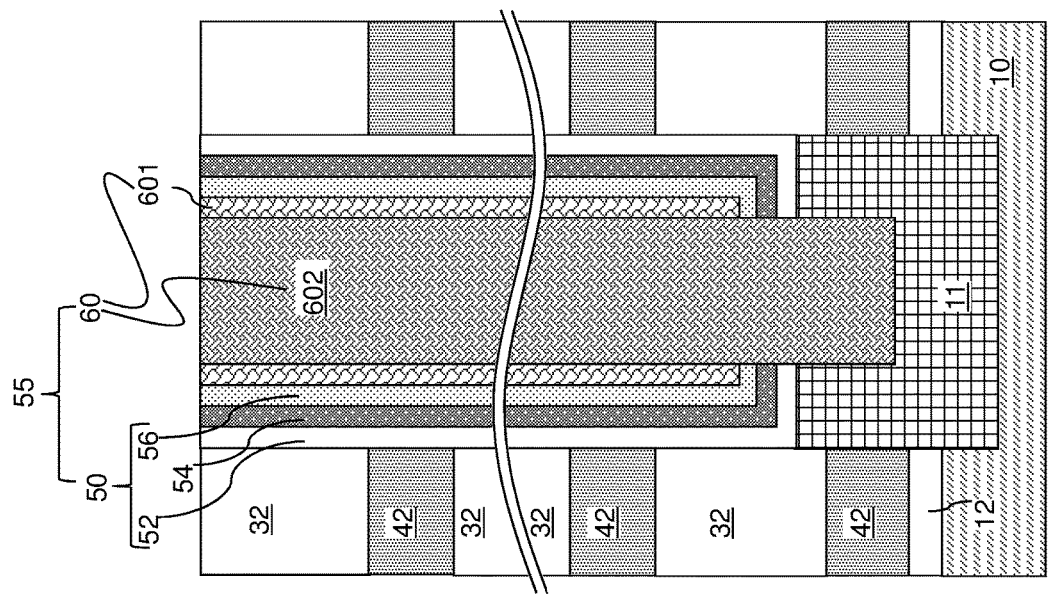
Figure 5E:
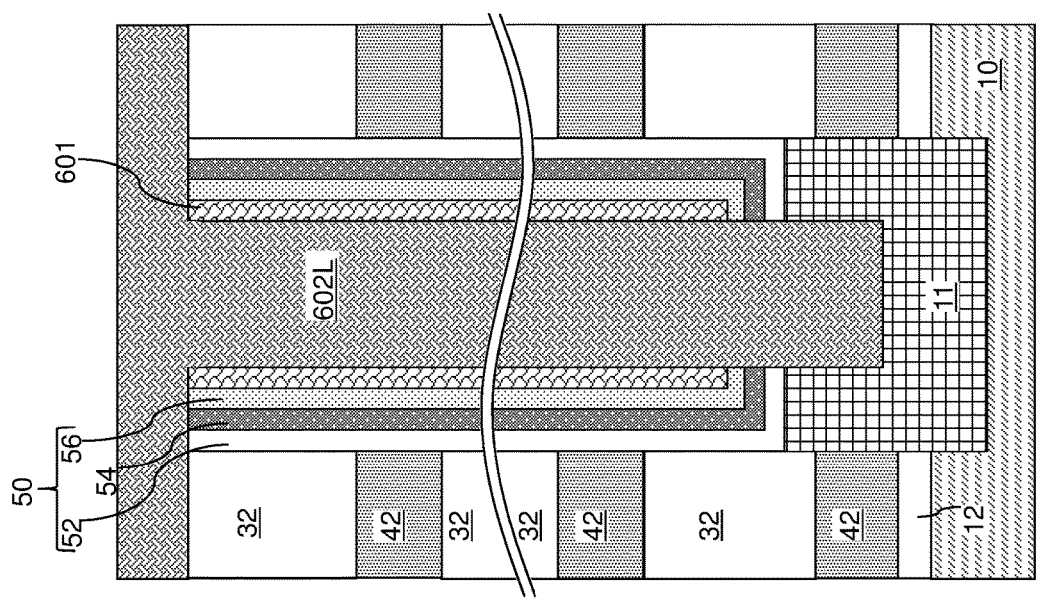

Referring to FIG. 5E, a second semiconductor channel layer 602L can be deposited directly on the semiconductor surface of the epitaxial pedestal 11 (or the semiconductor substrate layer 10 if portion 11 is omitted), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may fully fill the cavity in each memory opening 49.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 5F, the horizontal portion of the second semiconductor channel layer 602L located above the top surface of the topmost insulating layer 32 can be removed by a planarization process, which can employ a recess etch or chemical mechanical planarization (CMP). Each remaining portion of the second semiconductor channel layer 602L can be located entirety within a memory opening 49 or entirely within a support opening 19, and is herein referred to as a second semiconductor channel portion 602.

Each adjoining pair of a first semiconductor channel portion 601 and a second semiconductor channel portion 602 can collectively form a memory level channel portion 60 through which electrical current can flow when a vertical NAND device including the memory level channel portion 60 is turned on. A tunneling dielectric layer 56 is surrounded by a charge storage layer 54, and laterally surrounds a portion of the memory level channel portion 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 6:
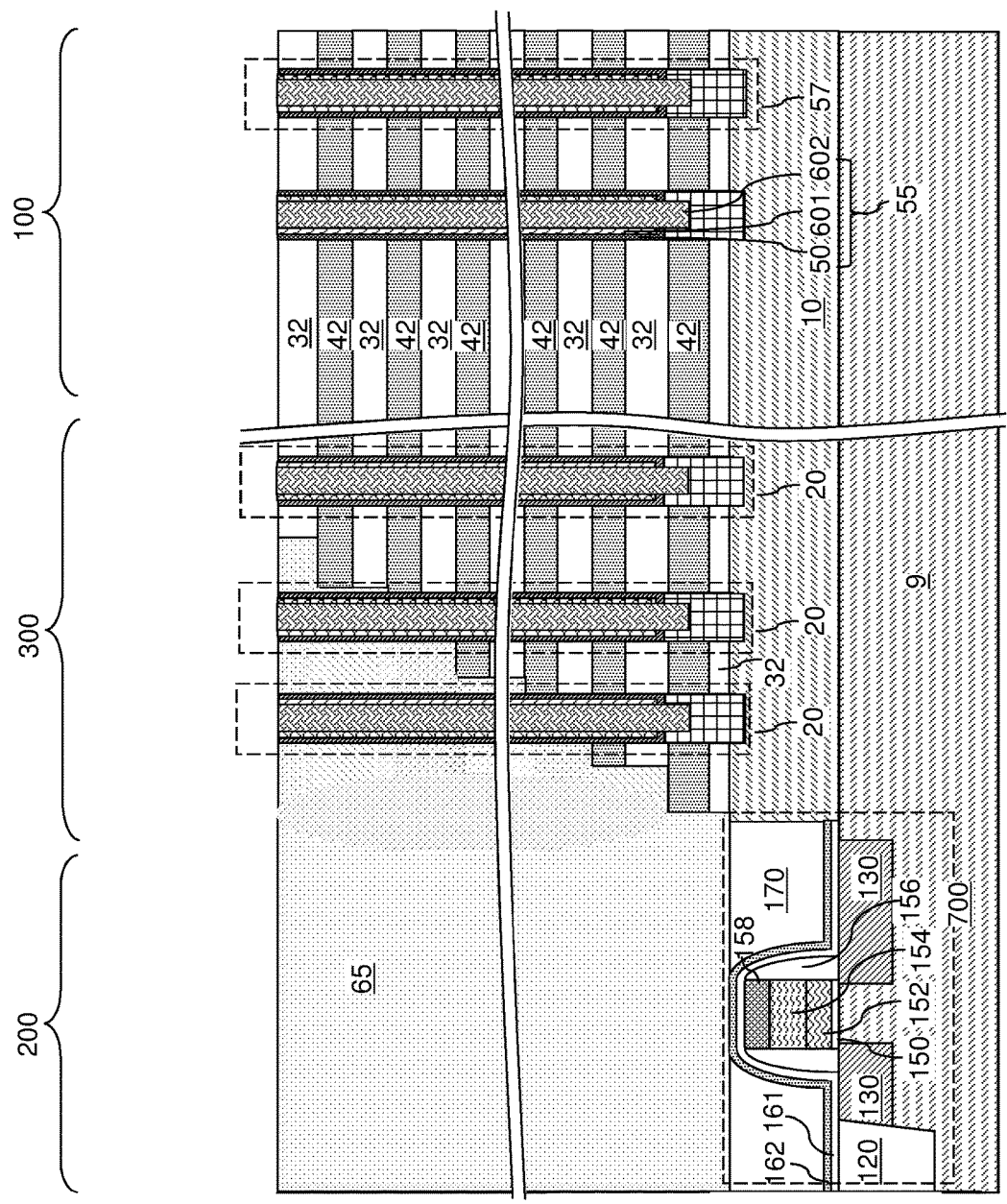
FIG. 6 is a schematic vertical cross-sectional view of the first exemplary structure after formation of the memory stack structures according to the first embodiment of the present disclosure.

Referring to FIG. 6, the first exemplary structure is illustrated after the processing steps of FIG. 5F. Each combination of a memory film 50 and a memory level channel portion 60 (which is a portion of a vertical semiconductor channel) within a memory opening 49 constitutes a memory stack structure 55. The memory stack structure 55 is a combination of a memory level channel portion 60, a tunneling dielectric layer 56, a plurality of memory elements as embodied as portions of the charge storage layer 54, and an optional blocking dielectric layer 52. Each combination of an epitaxial pedestal 11 and a memory stack structure 55 is herein referred to as a memory opening fill structure 57. Each combination of an epitaxial pedestal 11, a memory film 50, and a memory level channel portion 60 within each support opening 19 fills the respective support openings 19, and constitutes a support pillar structure 20.

An instance of a memory opening fill structure (11, 55) can be formed within each memory opening 49 of the structure of FIGS. 4A and 4B. An instance of the support pillar structure 20 can be formed within each support opening 19 of the structure of FIGS. 4A and 4B. Each exemplary memory stack structure 55 includes a memory level channel portion 60, which may comprise multiple semiconductor channel layers (601, 602), and a memory film 50. The memory film 50 may comprise a tunneling dielectric layer 56 laterally surrounding the memory level channel portion 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the memory level channel portion 60.

Figure 7A:
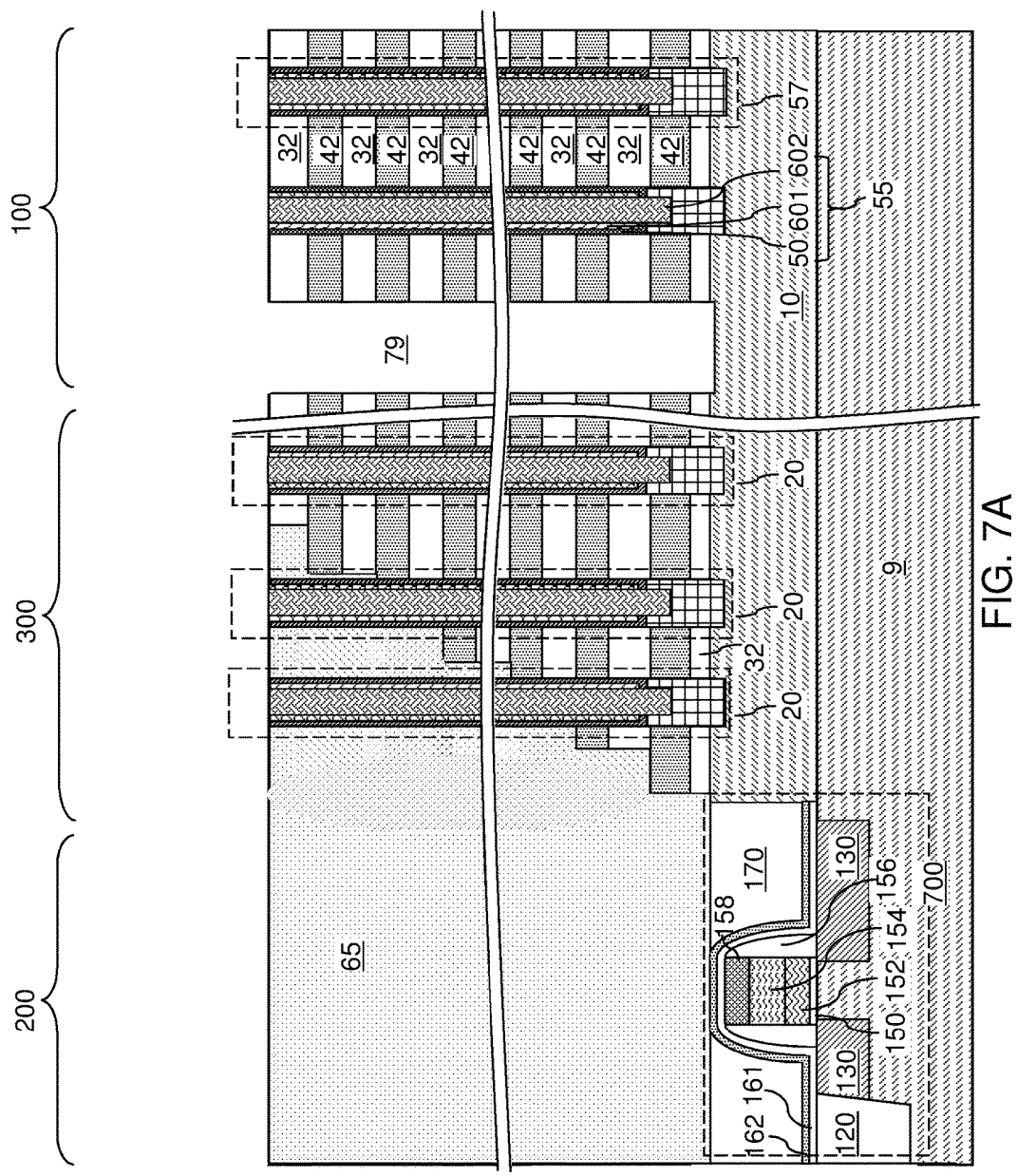
FIG. 7A is a schematic vertical cross-sectional view of the first exemplary structure after formation of backside contact trenches according to the first embodiment of the present disclosure.
Figure 7B:
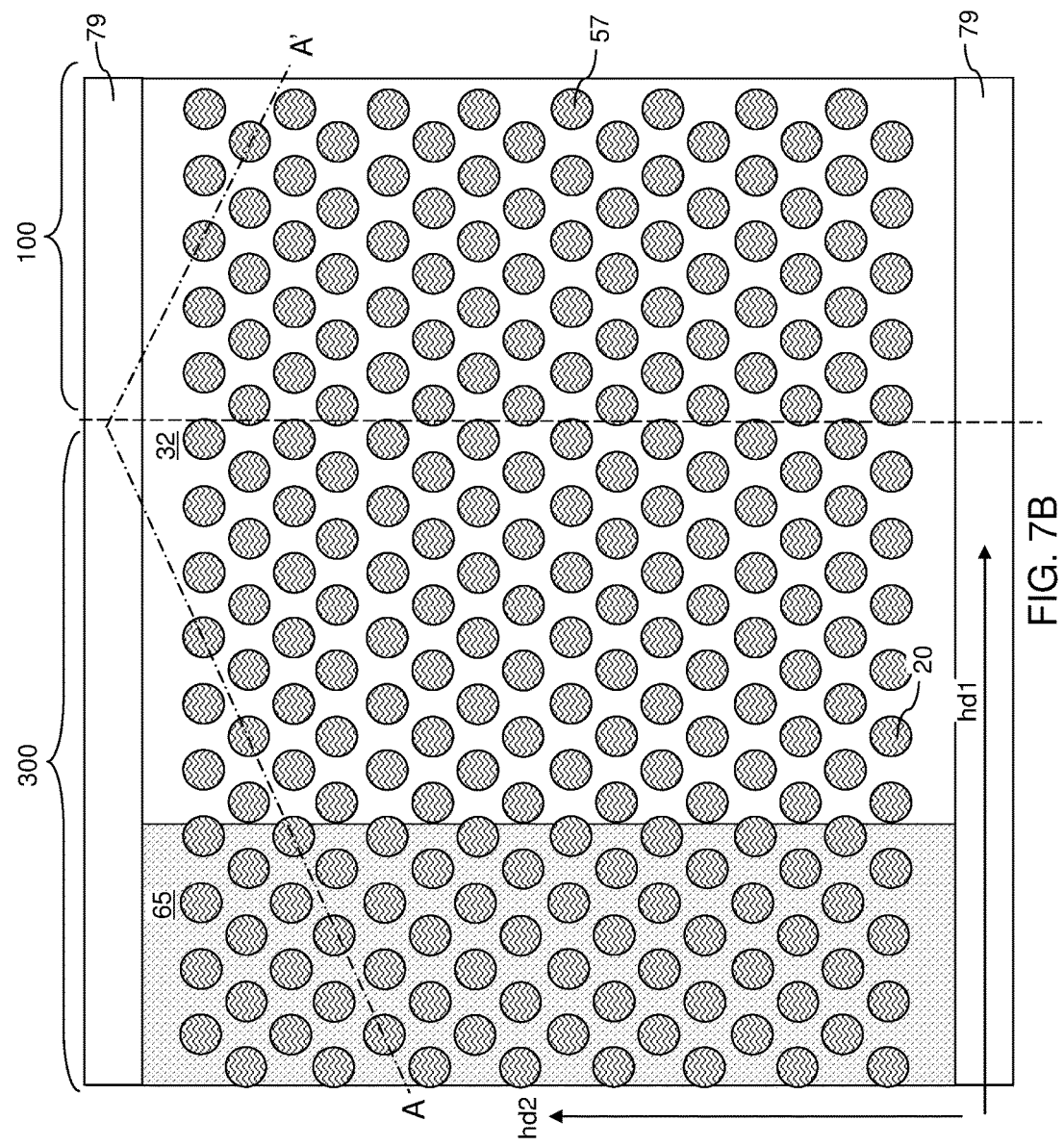
FIG. 7B is a top-down view of the first exemplary structure of FIG. 7A. The zig-zag vertical plane A-A' is the plane of the schematic vertical cross-sectional view of FIG. 7A.

Referring to FIGS. 7A and 7B, a photoresist layer (not shown) can be applied over the alternating stack (32, 42), and can be lithographically patterned to form openings in areas between clusters of memory stack structures 55, i.e., between neighboring arrays of memory stack structures 55. The pattern in the photoresist layer can be transferred through the alternating stack (32, 42) and/or the retro-stepped dielectric material portion 65 employing an anisotropic etch to form lower backside trenches 79, which vertically extend from the top surface of the alternating stack (32, 42) at least to the top surface of the substrate (9, 10), and laterally extend through the memory array region 100 and the contact region 300. In one embodiment, the lower backside trenches 79 can include a source contact opening in which a source conductive via structure (e.g., source contact via structure) can be subsequently formed. In one embodiment, the lower backside trenches 79 can laterally extend along the first horizontal direction hd1 (e.g., in the row/word line direction), and can be laterally spaced among one another along the second horizontal direction hd2 (e.g., in the column/bit line direction). The photoresist layer can be removed, for example, by ashing.

Figure 8:
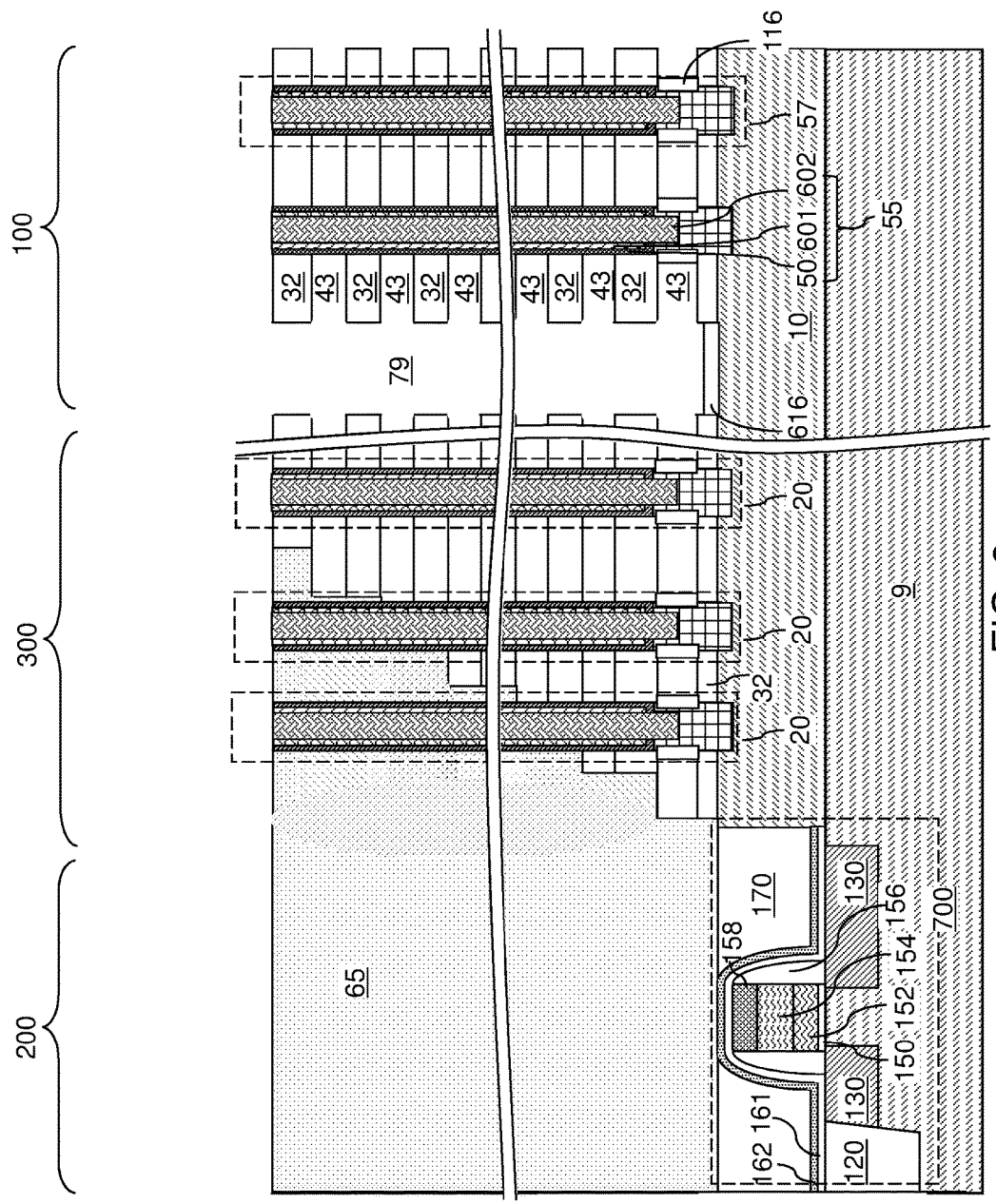
FIG. 8 is a schematic vertical cross-sectional view of the first exemplary structure after formation of backside recesses according to the first embodiment of the present disclosure.

Referring to FIG. 8, an etchant that selectively etches the second material of the sacrificial material layers 42 with respect to the first material of the insulating layers 32 can be introduced into the lower backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the lower backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 9:
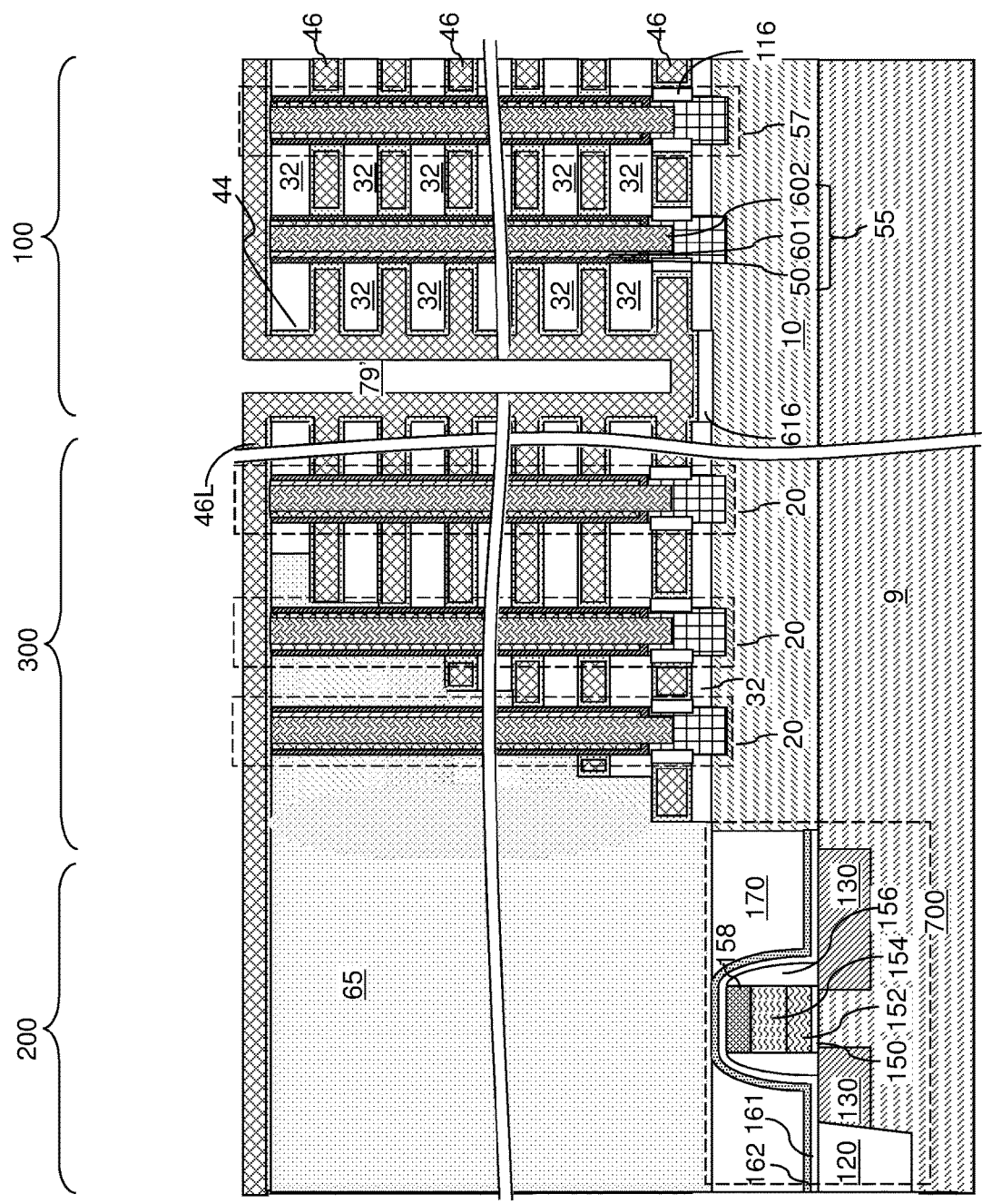
FIG. 9 is a schematic vertical cross-sectional view of the first exemplary structure after depositing at least one conductive material in the backside recesses and a periphery of each backside trench according to the first embodiment of the present disclosure.

Referring to FIG. 9, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the lower backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The thickness of the backside blocking dielectric layer 44 can be in a range from 1 nm to 10 nm, although lesser and greater thicknesses can also be employed. The backside blocking dielectric layer 44 is formed on the sidewalls of the lower backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each lower backside trench 79 that is not filled with the backside blocking dielectric layer 44.

At least one conductive material can be subsequently deposited in the backside recesses 43. The at least one conductive material can include, for example, a metallic barrier layer and a metal fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, on the sidewalls of the at least one the lower backside trench 79, and over the top surface of the topmost insulating layer 32 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer 46B can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each lower backside trench 79 and over the topmost insulating layer 32. Each electrically conductive layer 46 includes a portion of the metallic barrier layer and a portion of the metallic fill material layer that are located between a vertically neighboring pair of dielectric material layers, which can be a pair of insulating layers 32. The continuous metallic material layer 46L includes a continuous portion of the metallic barrier layer and a continuous portion of the metallic fill material layer that are located in the lower backside trenches 79 or above the topmost insulating layer 32.

Each sacrificial material layer 42 can be replaced with an electrically conductive layer 46. A backside cavity 79' is present in the portion of each lower backside trench 79 that is not filled with the backside blocking dielectric layer 44 and the continuous metallic material layer 46L. A tubular dielectric spacer 116 laterally surrounds an epitaxial channel portion 11. A bottommost electrically conductive layer 46 laterally surrounds each tubular dielectric spacer 116 upon formation of the electrically conductive layers 46.

Figure 10:
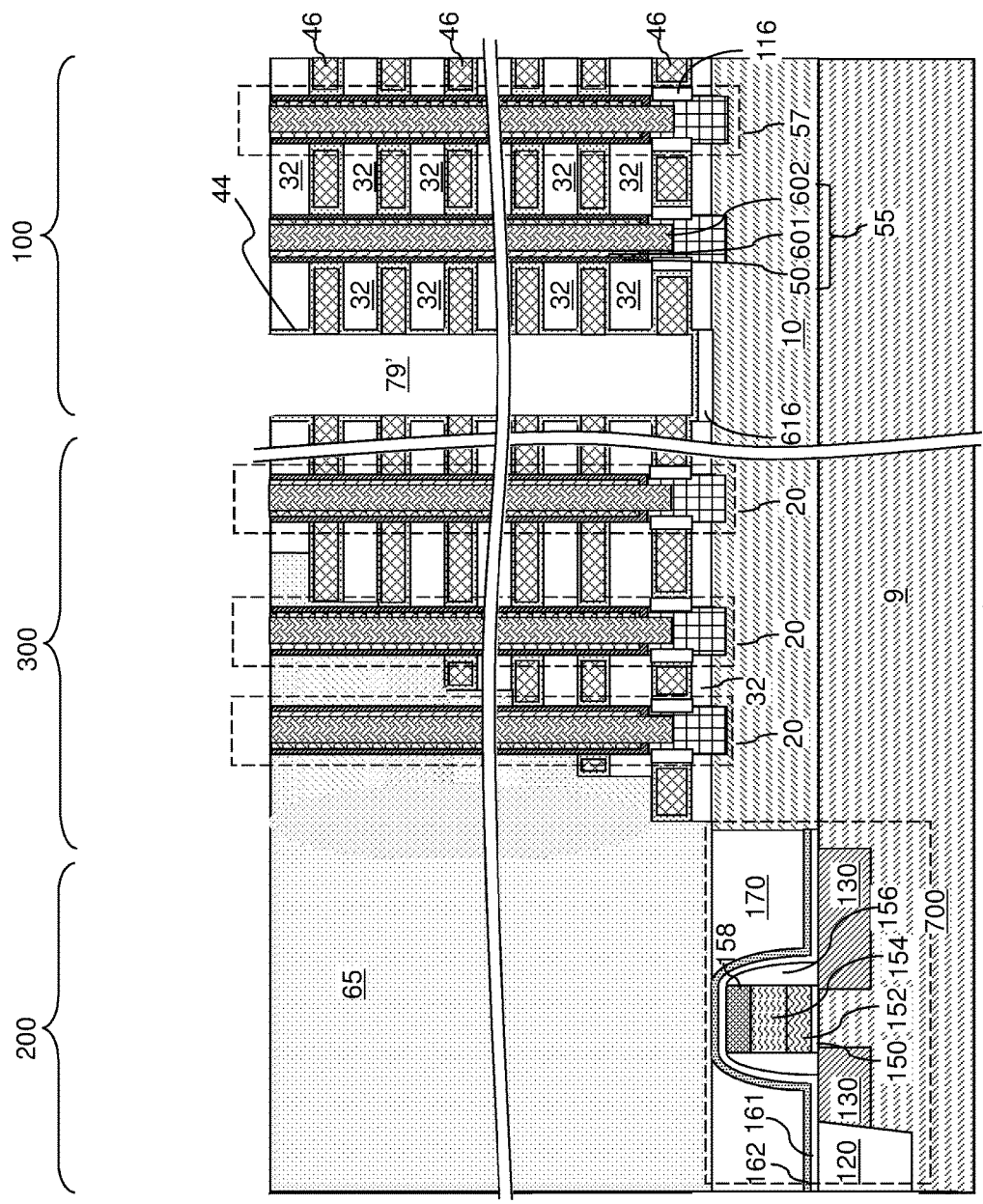
FIG. 10 is a schematic vertical cross-sectional view of the first exemplary structure after removal of the at least one deposited conductive material from within the backside trenches according to an embodiment of the present disclosure.

Referring to FIG. 10, the deposited metallic material of the continuous electrically conductive material layer 46L is etched back from the sidewalls of each lower backside trench 79 and from above the topmost insulating layer 32, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each lower backside trench 79. A backside cavity 79' is present within each lower backside trench 79.

Figure 11:
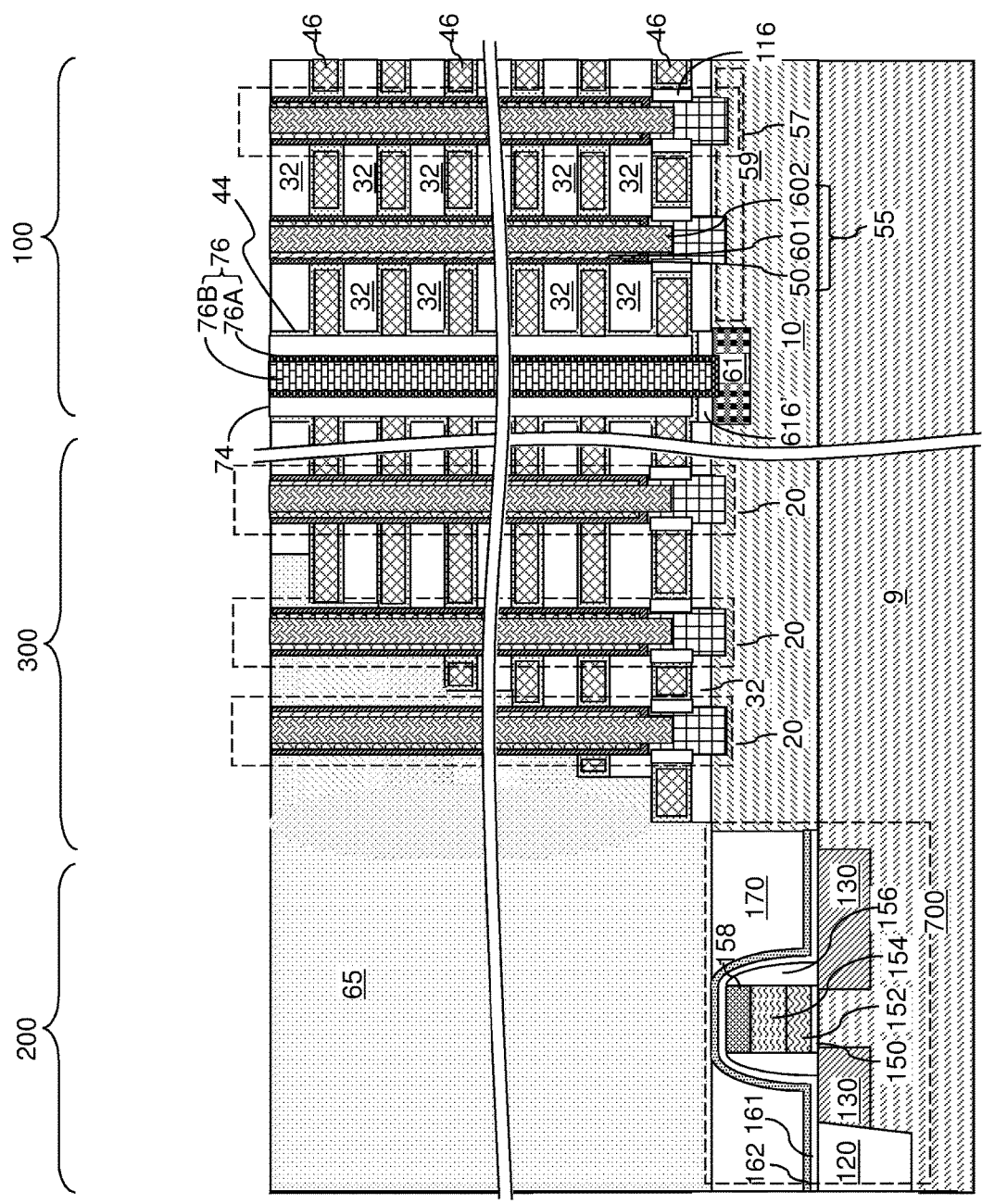
FIG. 11 is a schematic vertical cross-sectional view of the first exemplary structure after formation of an insulating spacer and a backside contact structure within each backside trench according to the first embodiment of the present disclosure.

Referring to FIG. 11, an insulating material layer can be formed in the at least one lower backside trench 79 and over the topmost insulating layer 32 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof.

In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the topmost insulating layer 32 and at the bottom of each lower backside trench 79. Each remaining portion of the insulating material layer constitutes a lower insulating spacer 74. A backside cavity 79' is present within a volume surrounded by each lower insulating spacer 74.

The anisotropic etch process can continue with, or without, a change in the etch chemistry to remove portions of the optional backside blocking dielectric layer 44 and the planar dielectric portion 616 that underlies the opening through the lower insulating spacer 74. An opening is formed though the planar dielectric portion 616 underneath each backside cavity 79', thereby vertically extending the backside cavity 79'. A top surface of the semiconductor material layer 10 can be physically exposed at the bottom of each lower backside trench 79. The remaining portion of each planar dielectric portion 616 is herein referred to as an annular dielectric portion 616', which can include a dielectric oxide of the semiconductor material of the semiconductor material layer 10, have a uniform thickness, and an opening therethrough.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the lower insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the lower insulating spacer 74.

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10).

A lower conductive via structure 76 can be formed within each backside cavity 79'. The lower conductive via structure 76 is also referred to as a first conductive via structure. Each conductive via structure 76 can fill a respective cavity 79'. The conductive via structures 76 can be formed by depositing at least one conductive material in the remaining unfilled volume (i.e., the backside cavity 79') of the lower backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be removed from above the topmost insulating layer 32. If chemical mechanical planarization (CMP) process is employed, the topmost insulating layer 32 can be employed as a CMP stopping layer. Each remaining continuous portion of the at least one conductive material in the lower backside trenches 79 constitutes a lower conductive via structure 76. The lower conductive via structure 76 extends through the alternating stack (32, 46), and contacts a top surface of the source region 61. If a backside blocking dielectric layer 44 is employed, the lower conductive via structure 76 can contact a sidewall of the backside blocking dielectric layer 44.

Figure 12A:
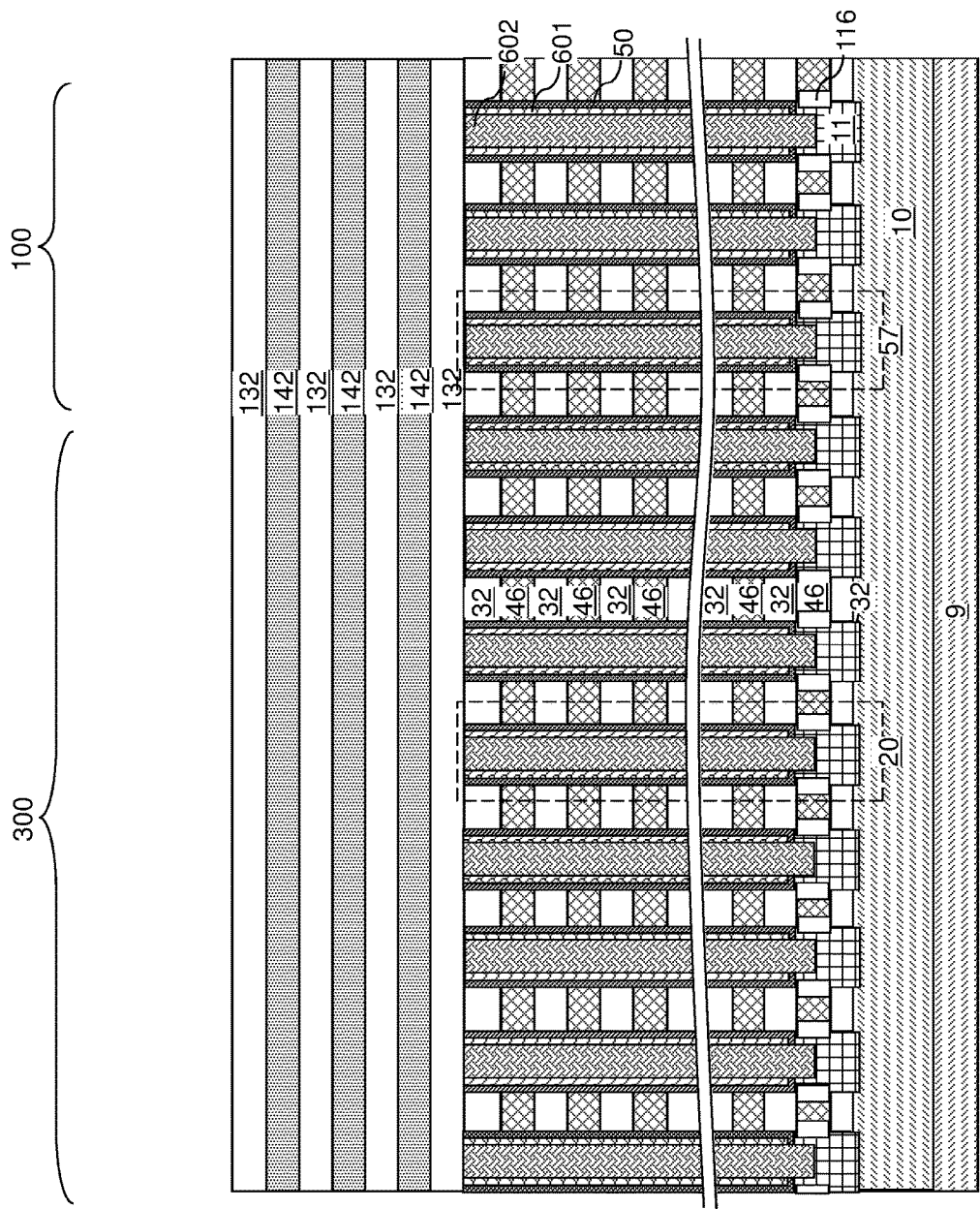
FIG. 12A is a schematic vertical cross-sectional view of the first exemplary structure after formation of drain select level layers according to the first embodiment of the present disclosure.
Figure 12B:
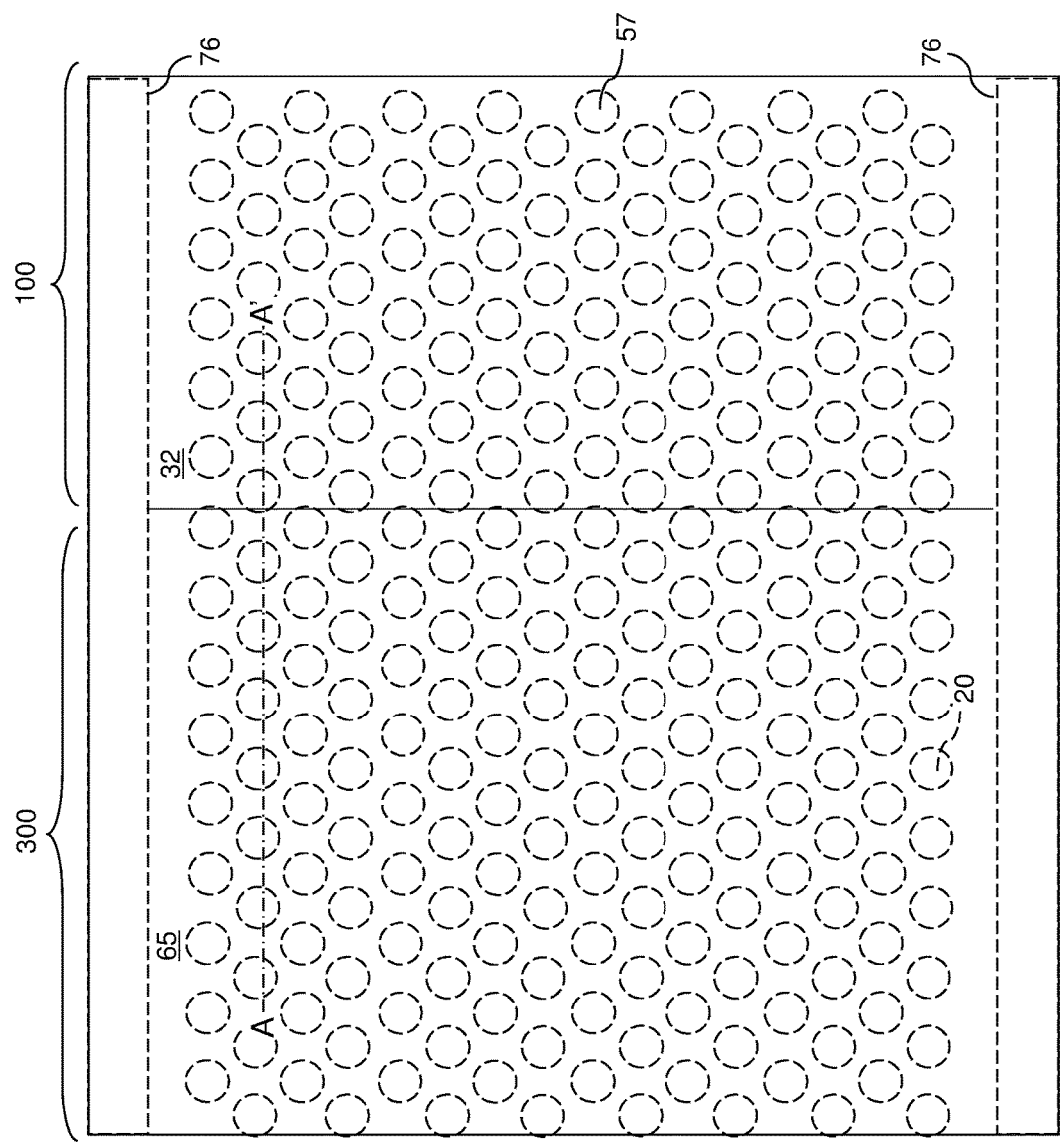
FIG. 12B is a top-down view of the first exemplary structure of FIG. 12A. The vertical plane A-A' is the plane of the schematic vertical cross-sectional view of FIG. 12A.

Referring to FIGS. 12A and 12B, drain select level layers (132, 142) are formed over the alternating stack (32, 46) of the insulating layers 32 and electrically conductive layers 46. Henceforth, the insulating layers 32 are also referred to as memory-level insulating layers, and the electrically conductive layers 46 are also referred to as memory-level electrically conductive layers to distinguish from layers in the drain select level layers (132, 142). The alternating stack (32, 46) is also referred to as a memory-level alternating stack (32, 46). The electrically conductive layers 46 include word lines (i.e., control gate electrodes) for vertical NAND strings. One or more of the electrically conductive layers 46 at the bottom of the alternating stack (32, 46) adjacent to the epitaxial pedestals 11 may be source select gate electrodes (i.e., select gate electrodes on the source side of the vertical NAND strings) of source select transistors for the vertical NAND strings. In that case, a gate dielectric layer rather than a memory film is located between the epitaxial pedestal 11 and the source select gate electrode(s) 46.

The drain select level layers (132, 142) includes at least one drain select level dielectric layer 142 that is subsequently replaced partially, and at least one drain select level insulating layer 132 that is not replaced in subsequent processing steps. Each drain select level insulating layer 132 is also referred to an additional insulating layer, which provides vertical electrical isolation in a manner similar to the insulating layers 32 within the alternating stack (32, 46). In one embodiment, the drain select level layers (132, 142) can include only a single drain select level dielectric layer 142 or a plurality of drain select level dielectric layers 142. The topmost layer of the drain select level layers (132, 142) can be a topmost drain select level insulating layer 132. The bottommost layer of the drain select level layers (132, 142) may be a drain select level insulating layer 132 or a drain select level dielectric material layer 142.

In one embodiment, the drain select level layers (132, 142) can include an alternating stack of the drain select level insulating layers 132 and the drain select level dielectric layers 142. In this case, the alternating stack of the drain select level insulating layers 132 and the drain select level dielectric layers 142 is herein referred to as a drain select level alternating stack (132, 142). The material of the drain select level insulating layers 132 is an insulating material such as silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the material of the drain select level insulating layers 132 can be silicon oxide. In one embodiment, the material of the drain select level insulating layers 132 can be the same as the first material, i.e., the material of the insulating layers 32. The material of the drain select level dielectric layers 142 can be a dielectric material (i.e., an insulating material) that can be removed selective to the material of the drain select level insulating layers 132. For example, the material of the drain select level dielectric layers 142 can be selected from silicon nitride or other suitable dielectric material. In one embodiment, the drain select level dielectric layers 142 can be spacer material layers that comprise silicon nitride. In one embodiment, the material of the drain select level dielectric layers 142 can be the same as the second material, i.e., the material of the sacrificial material layers 42.

In one embodiment, the drain select level insulating layers 132 can include silicon oxide, and drain select level dielectric layers 142 can include silicon nitride sacrificial material layers. The drain select level insulating layers 132 and the drain select level dielectric layers 142 can be deposited, for example, by chemical vapor deposition (CVD). The thicknesses of the drain select level insulating layers 132 and the drain select level dielectric layers 142 can be in a range from 20 nm to 50 nm, although lesser and greater thicknesses can be employed for each drain select level insulating layer 132 and for each drain select level dielectric layer 142. The number of repetitions of the pairs of a drain select level insulating layer 132 and a drain select level dielectric layer 142 can be in a range from 2 to 16, although a greater number of repetitions can also be employed. In one embodiment, each drain select level dielectric layer 142 in the drain select level alternating stack (132, 142) can have a uniform thickness that is substantially invariant within each respective drain select level dielectric layer 142.

Figure 13:
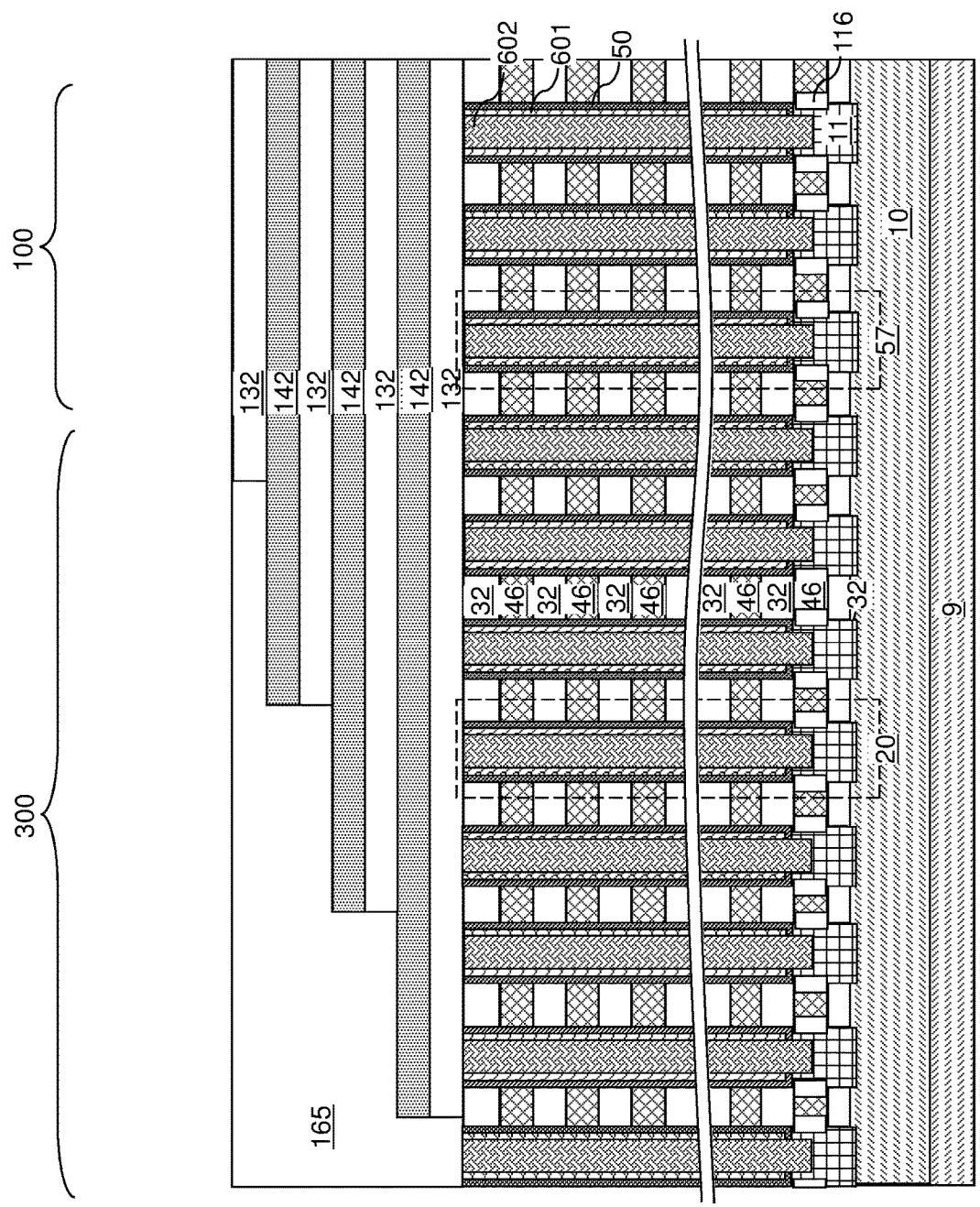
FIG. 13 is a schematic vertical cross-sectional view of the first exemplary structure after formation of drain select level stepped surfaces and a drain select level retro-stepped dielectric material portion according to the first embodiment of the present disclosure.

Referring to FIG. 13, another terrace region is formed by patterning the drain select level alternating stack (132, 142), which is herein referred to as a drain select level terrace region. If multiple drain select level dielectric layers 142 are present, each drain select level dielectric layer 142 other than a topmost drain select level dielectric layer 142 within the drain select level alternating stack (132, 142) laterally extends farther than any overlying drain select level dielectric layer 142 within the drain select level alternating stack (132, 142). Each electrically conductive layer 46 can laterally extend farther than the drain select level dielectric layers 142. A drain select level stepped cavity can be formed above the drain select level terrace region.

A drain select level retro-stepped dielectric material portion 165 (i.e., an insulating fill material portion) can be formed in the drain select level stepped cavity by deposition of a dielectric material therein. For example, a dielectric material such as silicon oxide can be deposited in the stepped cavity. Excess portions of the deposited dielectric material can be removed from above the top surface of the topmost drain select level insulating layer 132, for example, by chemical mechanical planarization (CMP). The remaining portion of the deposited dielectric material filling the stepped cavity constitutes the drain select level retro-stepped dielectric material portion 165. If silicon oxide is employed for the drain select level retro-stepped dielectric material portion 165, the silicon oxide of the retro-stepped dielectric material portion 165 may, or may not, be doped with dopants such as B, P, and/or F.

Figure 14A:
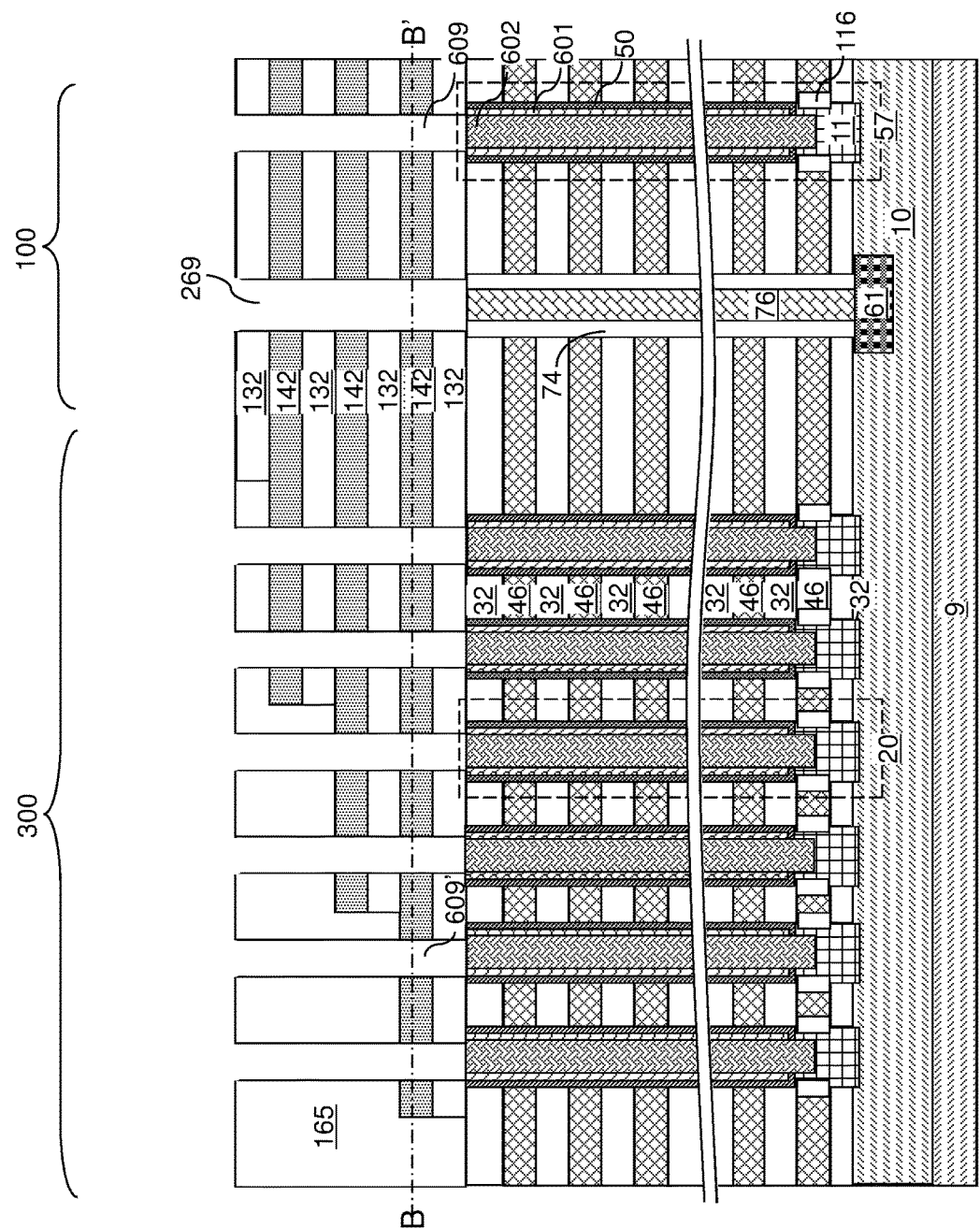
FIG. 14A is a schematic vertical cross-sectional view of the first exemplary structure after formation of drain select level openings through the drain select level layers according to the first embodiment of the present disclosure.
Figure 14B:
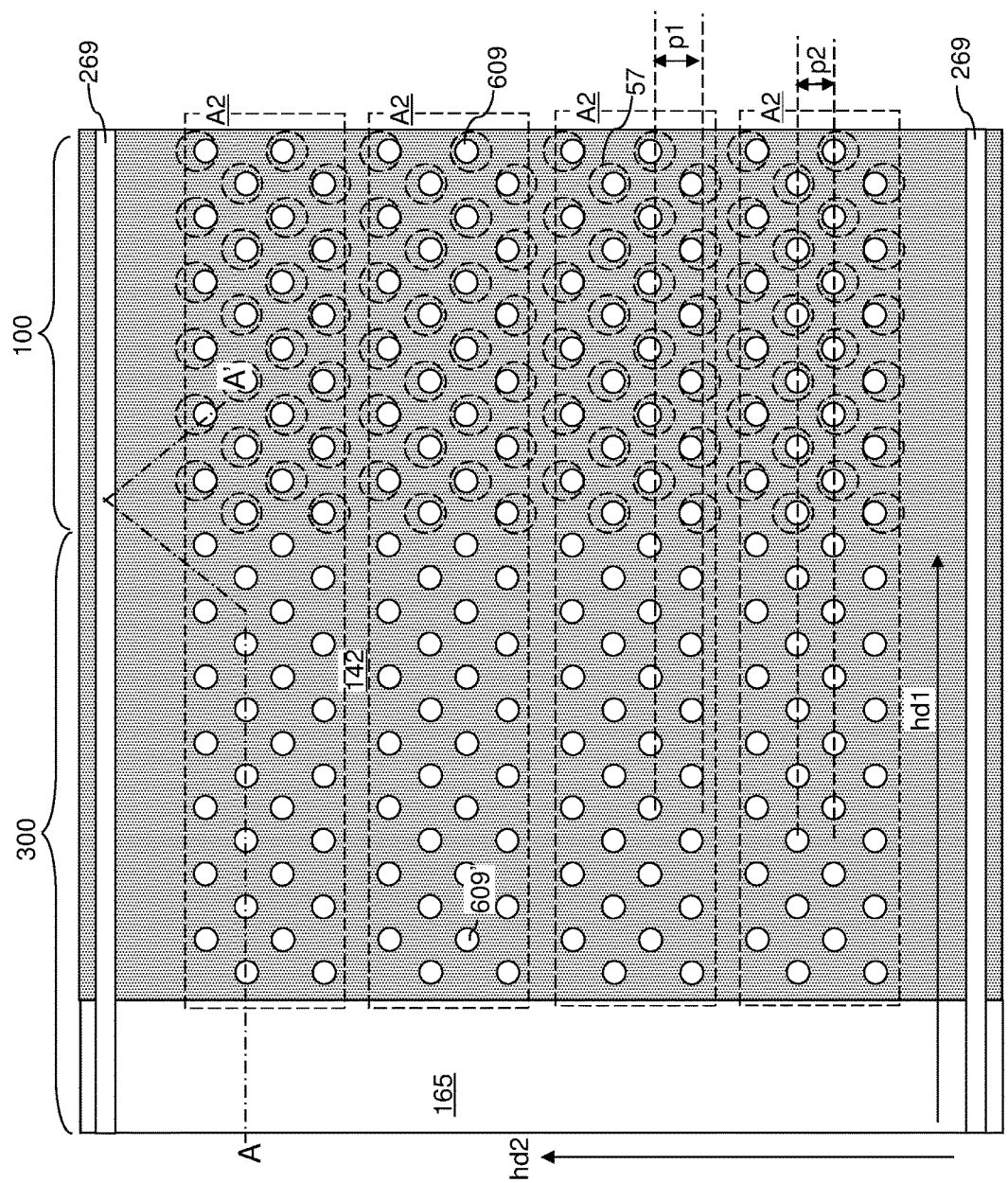
FIG. 14B is a top-down view of the first exemplary structure of FIG. 14A. The vertical plane A-A' is the plane of the schematic vertical cross-sectional view of FIG. 14A.

Referring to FIGS. 14A and 14B, drain select level openings (609, 609') and upper backside trenches 269 are formed through the drain select level layers (132, 142). For example, a photoresist layer can be applied over the drain select level layers (132, 142), and can be lithographically patterned to form openings and line trenches in the memory array region 100 and in the contact region 300. The pattern of the openings and the line trenches can be transferred through the drain select level alternating stack (132, 142) by an anisotropic etch to form drain select level openings (609, 609') and upper backside trenches 269.

The drain select level openings (609, 609') include drain select level memory openings 609 that overlie the memory opening fill structures 57 which contain memory stack structures 55 and drain select level support openings 609' that overlie the support pillar structures 20. A top surface of a memory level channel portion 60 in a respective memory stack structure 55 is physically exposed underneath each of the drain select level memory openings 609. A top surface of a memory level channel portion 60 in a respective support pillar structure 20 is physically exposed underneath each of the drain select level support openings 609'. The upper backside trenches 269 are formed in areas that overlie the lower conductive via structures 76. A top surface of a lower conductive via structure 76 is physically exposed at the bottom of each upper backside trench 269.

In one embodiment, the drain select level openings (609, 609') can be formed as two-dimensional periodic arrays A2. Each of the two-dimensional periodic arrays A2 can include rows that extend along the first horizontal direction hd1 and having a uniform inter-row pitch (which is herein referred to as a second pitch p2) along the second horizontal direction hd2, which can be perpendicular to the first horizontal direction hd1. In one embodiment, a plurality of drain select level memory openings 609 can be formed within the area of a single array of memory openings 49 (each of which includes a respective memory stack structure 55). Thus, the plurality of two-dimensional periodic arrays A2 of drain select level openings (609, 609') can include a plurality of two-dimensional arrays of drain select level memory openings 609 formed between a neighboring pair of upper backside trenches 269. In one embodiment, a plurality of drain select level support openings 609' can be formed within the area of a single array of support openings 19 (each of which includes a respective support pillar structure 20). Thus, the plurality of two-dimensional periodic arrays A2 of drain select level openings (609, 609') can include a plurality of two-dimensional arrays of drain select level support openings 609' formed between a neighboring pair of upper backside trenches 269. Each two-dimensional periodic array A2 can include respective rows that extend along the first horizontal direction hd1 and have a uniform inter-row pitch (i.e., the second pitch p2) along the second horizontal direction hd2. The second pitch p2 is less than the first pitch p1, and may be in a range from 60% to 90% of the first pitch.

In one embodiment, the memory stack structures 55 between a neighboring pair of lower backside trenches 79 can be arranged as a first periodic hexagonal array having a first row-to-row pitch (the first pitch p1) along the second horizontal direction hd2, and each array A2 of drain select level memory openings 609 can be arranged as a respective second periodic hexagonal array having a second row-to-row pitch (the second pitch p2) along the second horizontal direction hd2. In one embodiment, the first periodic hexagonal array A1 and each second periodic hexagonal array A2 has the same periodicity along the first horizontal direction hd1 (i.e., the pitch within each row of memory stack structures 55 along the first horizontal direction hd1 and the pitch within each row of drain select level memory openings 609) and different periodicities (i.e., the first pitch p1 for the first periodic hexagonal array A1 and the second pitch p2 for the second periodic hexagonal array A2) along the second horizontal direction hd2. The second periodic hexagonal arrays A2 are laterally spaced from each other by a separation distance that is greater than the separation distance of neighboring rows within each of the second periodic hexagonal arrays A2.

Each upper backside trench 269 is formed through the at least one drain select level dielectric layer 142 (which may be in the drain select level alternating stack (132, 142)) and directly above a respective lower conductive via structure 76 (i.e., a first conductive via structure).

Figure 15A:
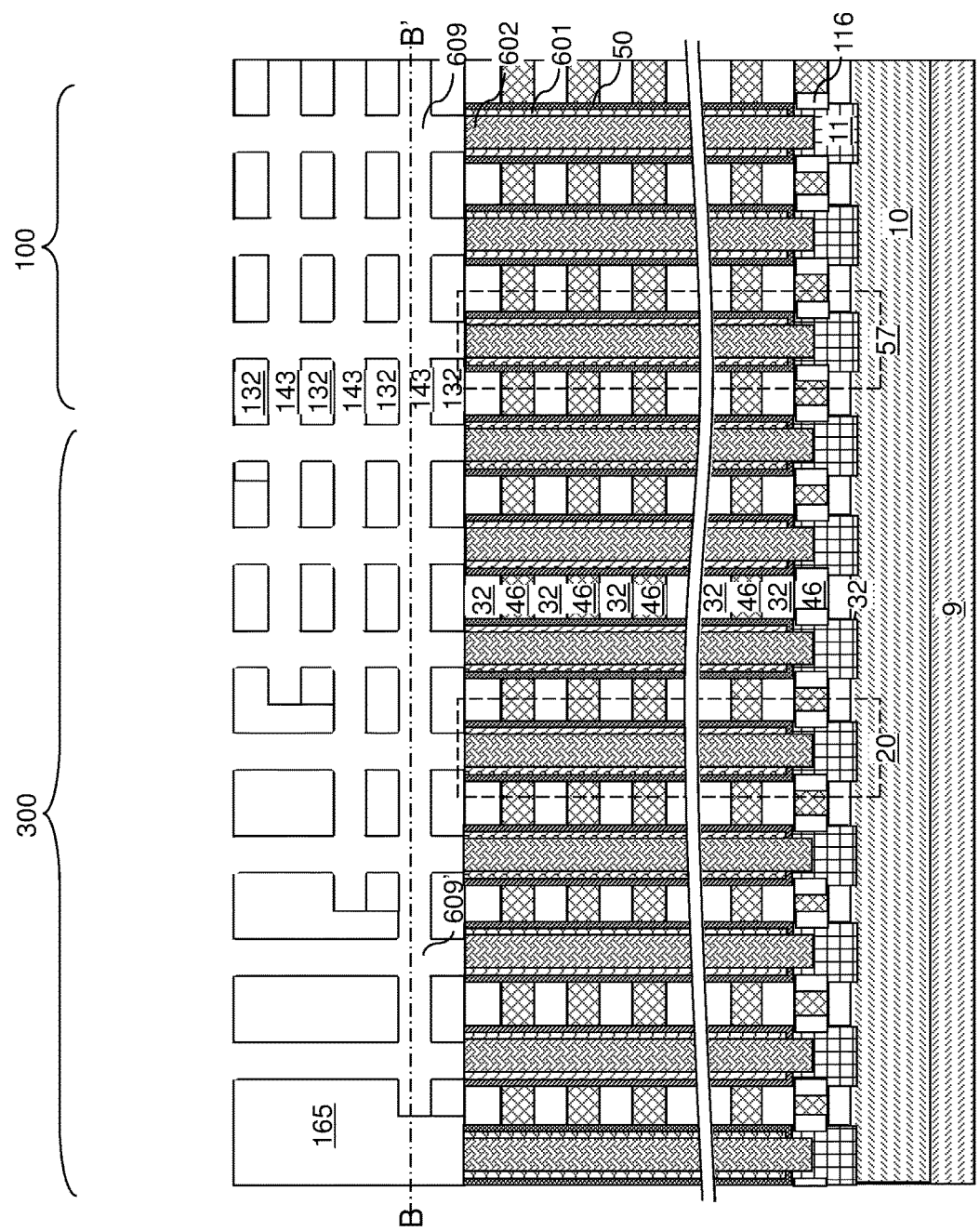
FIG. 15A is a schematic vertical cross-sectional view of the first exemplary structure after partially etching the drain select level dielectric layers to form drain select level lateral recesses according to the first embodiment of the present disclosure.
Figure 15B:
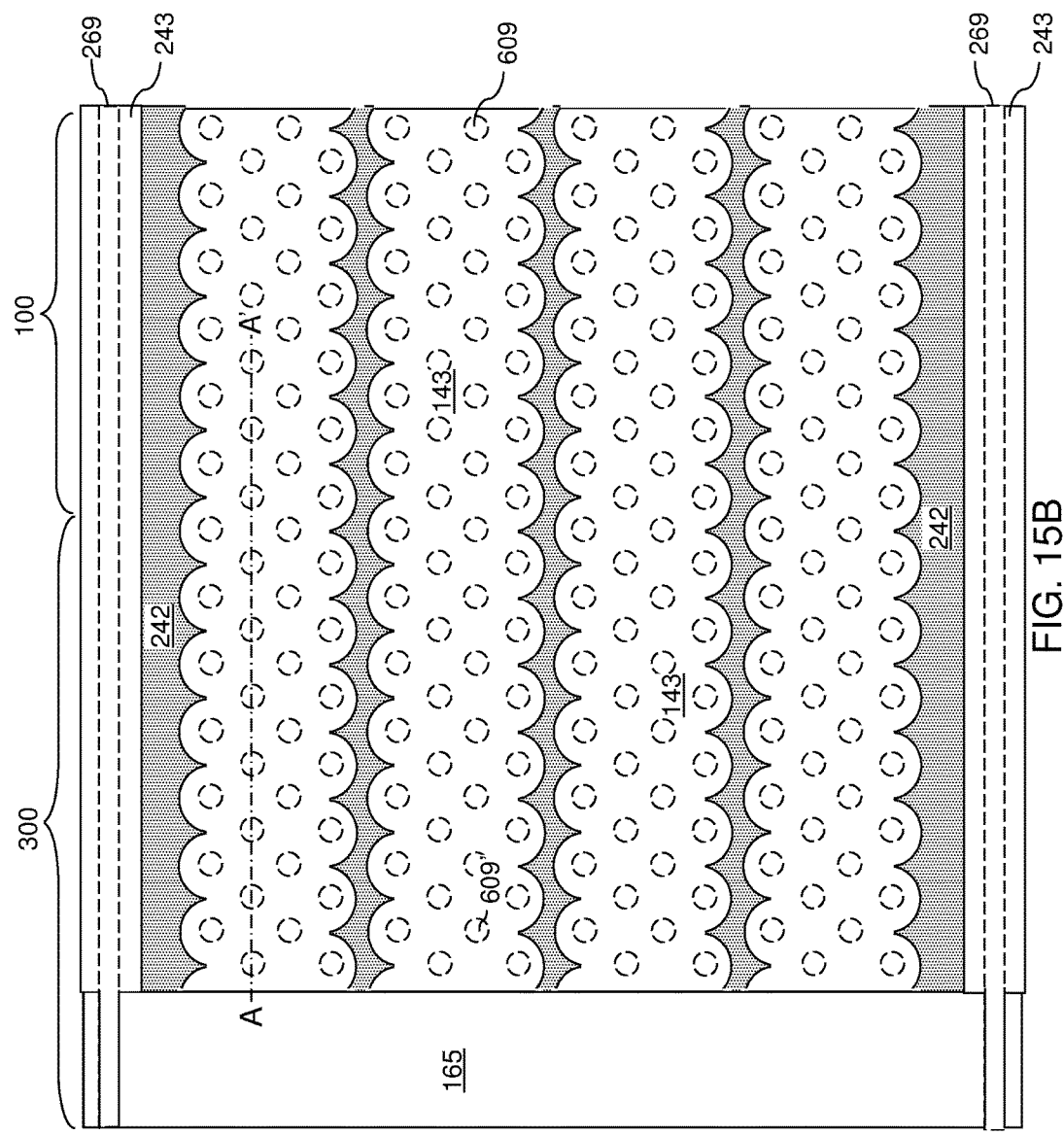
FIG. 15B is a top-down view of the first exemplary structure of FIG. 15A. The vertical plane A-A' is the plane of the schematic vertical cross-sectional view of FIG. 15A.

Referring to FIGS. 15A and 15B, an etchant that isotropically etches the dielectric material of the drain select level dielectric layers 142 selective to the material of the drain select level insulating layers 132, the material of the memory level insulating layers 32, the memory level channel portions 60 of the memory stack structures 55, and the support pillar structures 20. For example, the drain select level dielectric layers 142 can include silicon nitride, the drain select level insulating layers 132 and the memory level insulating layers 32 can include silicon oxide, and the etchant can be hot phosphoric acid that etches silicon nitride selective to silicon oxide and semiconductor materials.

Drain select level lateral recesses 143 are formed by removing portions of the at least one drain select level dielectric layer 142 from around the drain select level memory openings 609. The drain select level lateral recesses 143 are formed by isotropically etching the material of the at least one drain select level dielectric layer 142 employing an etchant that is provided into the drain select level openings (609, 609'), as shown in FIG. 15B. Lateral cavities formed around the drain select level memory openings 609 within a same second periodic hexagonal array A2 are connected among one another such that a void continuously extends over a subset of the first periodic hexagonal array A1 of the memory stack structures 55 and the support pillar structures 20 located within the second periodic hexagonal array A2. The duration of etch isotropic etch of the material of the drain select level dielectric layers 142 can be selected to leave remaining portions of the drain select level dielectric layers 142 between neighboring pairs of second periodic hexagonal arrays A2 of the drain select level openings (609, 609'). Thus, the drain select level lateral recesses 143 are laterally spaced among one another by electrically insulating line structures 242 that are remaining portions of the at least one drain select level dielectric layer 142, as shown in FIG. 15B.

Trench side recesses 243 are formed by removing portions of the at least one drain select level dielectric layer 142 from around the upper backside trenches 269 concurrently with formation of the drain select level lateral recesses 143. The trench side recesses 243 are formed by isotropically etching the material of the at least one drain select level dielectric layer 142 employing the isotropic etchant that forms the drain select level backside recesses 143. The trench side recesses 243 are formed at the same level as the drain select level lateral recesses 143. Each drain select level lateral recess 143 can be laterally spaced from one another and from the trench side recesses 243 by the electrically insulating line structures 242, which includes a set of concave sidewalls at least on one side, as shown in FIG. 15B.

Figure 16A:
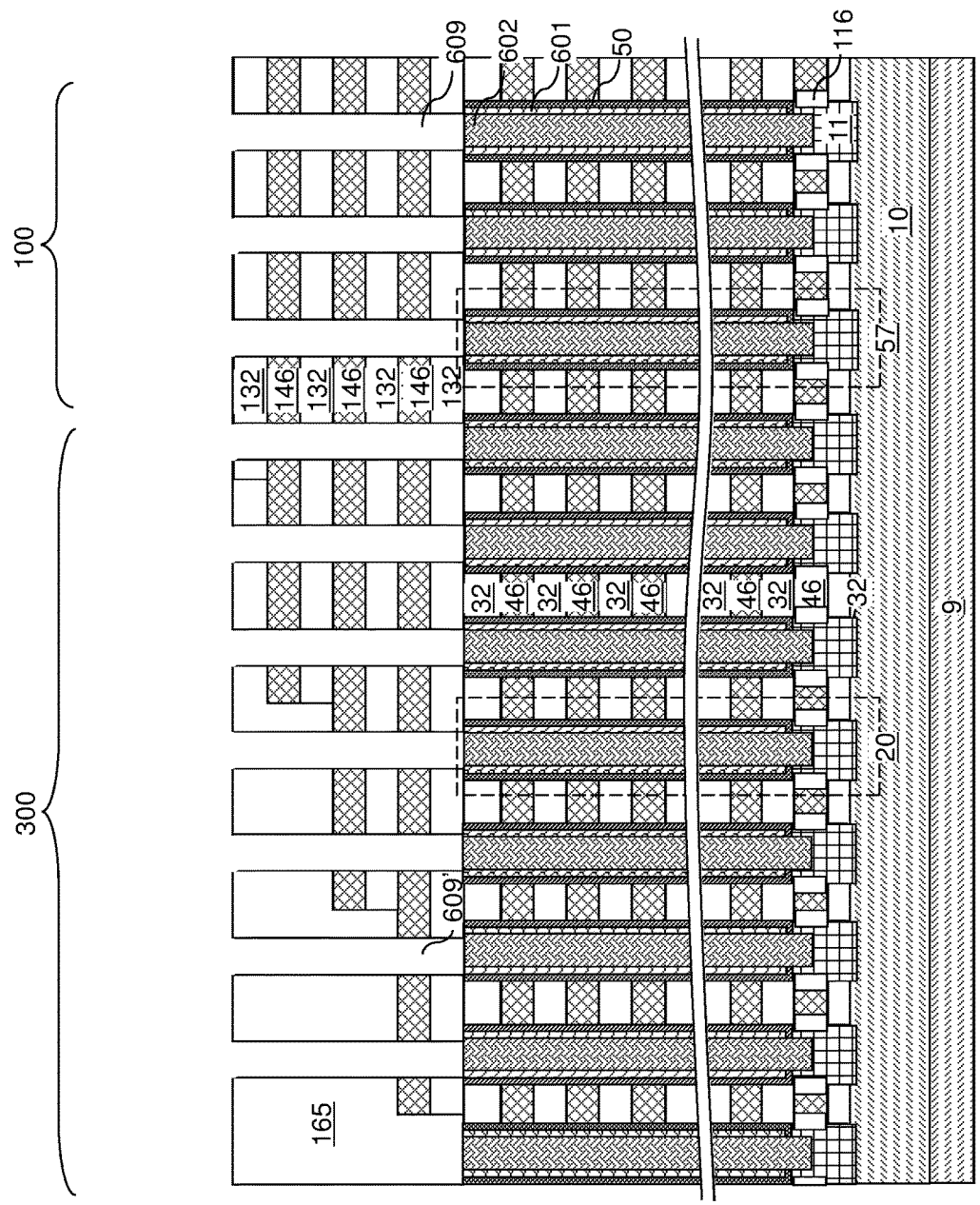
FIG. 16A is a schematic vertical cross-sectional view of the first exemplary structure after formation of drain select level conductive layers in the drain select level lateral recesses according to the first embodiment of the present disclosure.
Figure 16B:
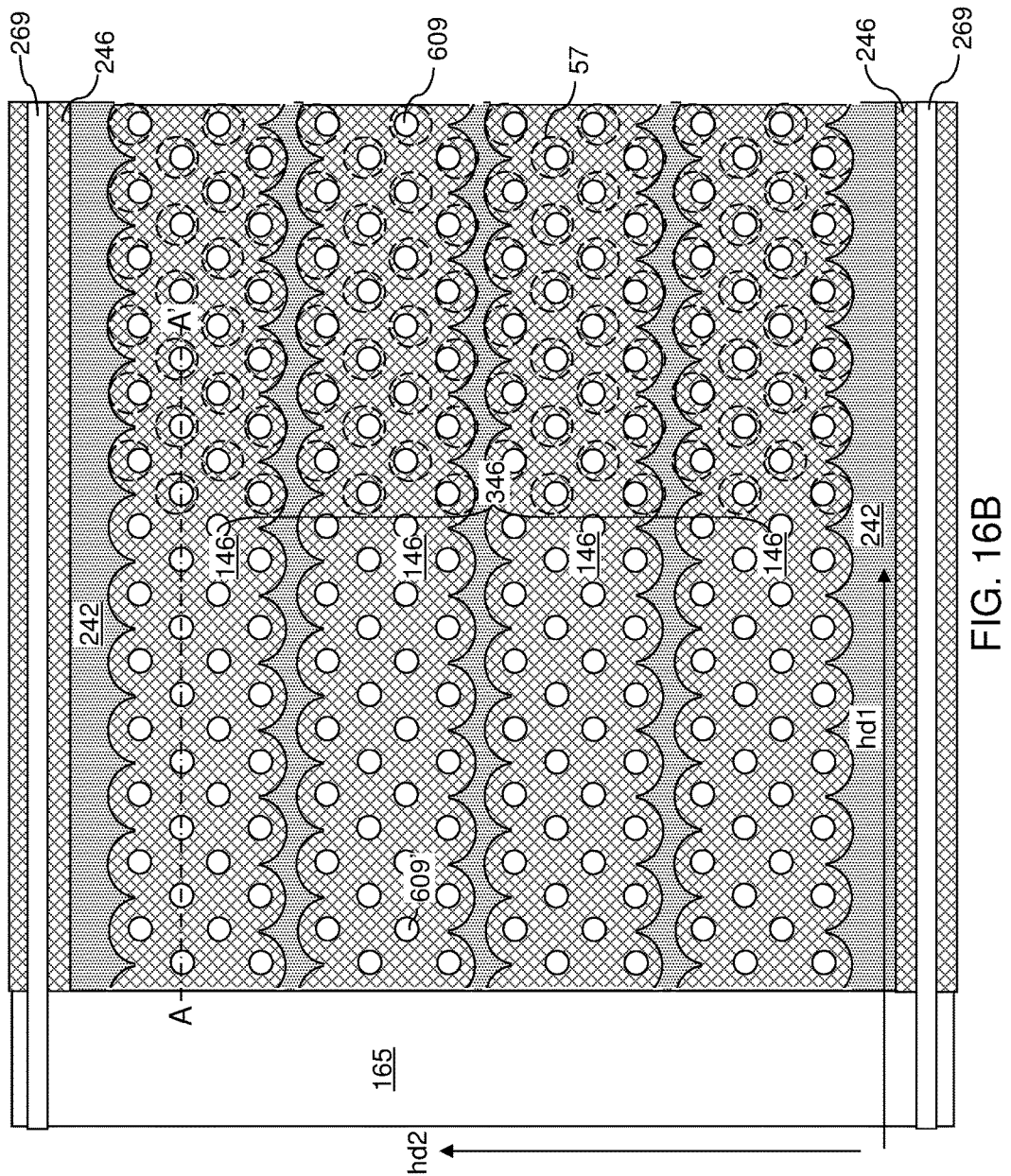
FIG. 16B is a top-down view of the first exemplary structure of FIG. 16A. The vertical plane A-A' is the plane of the schematic vertical cross-sectional view of FIG. 16A.

Referring to FIGS. 16A and 16B, at least one conductive material (such as a metallic liner (e.g., TiN) and a metallic fill material portion (e.g., a tungsten portion)) can be deposited in the drain select level lateral recesses 143 and the trench side recesses 243 by a conformal deposition process (such as chemical vapor deposition, atomic layer deposition, and/or electroplating). Each drain select level backside recess 143 is filled with a respective electrically conductive line structure 146 that laterally extend along the first horizontal direction hd1 and are laterally spaced apart among one another along the second horizontal direction hd2 by the respective electrically insulating line structures 142, as shown in FIG. 16B. The set of all electrically conductive line structures 146 located within a same level constitute a drain select level conductive layer 346. Thus, each drain select level conductive layer 346 is formed in the drain select level lateral recesses 143 located at a same level. Each of the at least one drain select level conductive layer 346 comprises electrically conductive line structures 146 between a pair of upper backside trenches 269.

Concurrently with formation of the at least one drain select level conductive layer 346, drain select level metal strips 246 are formed in the trench side recesses 243, as shown in FIG. 16B. Excess portions of the deposited at least one conductive material in the drain select level openings (609, 609') can be removed by an anisotropic etch process that is selective to the materials of the drain select level insulating layers 132 and the semiconductor materials of the memory level channel portions 60. Thus, the at least one drain select level conductive layer 346 is formed by depositing at least one conductive material in the drain select level lateral recesses 143 employing the drain select level openings (609, 609') as a conduit for transporting the conductive material, and by removing portions of the conductive material from inside the drain select level openings (609, 609'). Each drain select level metal strip 246 is formed by depositing at least one conductive material in the trench side recesses 243 employing the upper backside trenches 269 as a conduit for transporting the conductive material, and by removing portions of the conductive material from inside the upper backside trenches 269.

The at least one drain select level conductive layer 346 is formed after formation of the memory level electrically conductive layers 46 employing a different deposition process than the deposition process employed to form the memory level electrically conductive layers 46. Each of the electrically insulating line structures 242 (which are remaining portions of the at least one drain select level dielectric layer 142) laterally extends along the first horizontal direction hd1 and includes multiple concave sidewalls that are adjoined among one another. Each of the electrically conductive line structures 146 laterally extends along the first horizontal direction hd1 and includes multiple convex sidewalls that are adjoined among one another and physically contacts a set of adjoined concave sidewalls of a respective electrically insulating line structure 242. The electrically conductive line structures 146 comprise drain select gate electrodes of the vertical NAND strings (i.e., drain side select gate electrodes). Since the drain select gate electrodes of adjacent memory blocks are separated by the respective electrically insulating line structures 142, shallow trench isolation between the drain select gate electrodes of adjacent memory blocks can be omitted, which results in a higher density device having less wasted space on the substrate.

In one embodiment, a pair of backside trenches (79, 269) that include a lower backside trench 79 and an upper backside trench 269 can vertically extend through the alternating stack (32, 46) and the at least one drain select level dielectric layer 242 (which can be within a drain select level alternating stack of drain select level insulating layers 132 and the drain select level conductive layers 346). Each of the pair of backside trenches (79, 269) can laterally extend along the first horizontal direction hd1, and can be laterally spaced from each other along the second horizontal direction hd2. Each of the memory level electrically conductive layers 46 within the alternating stack (32, 46) can laterally extend continuously between the pair of backside trenches (79, 269), and a plurality of electrically conductive line structures 146 that are laterally spaced among one another along the second horizontal direction hd2 can be located between the pair of backside trenches (79, 269). Thus, each of a plurality of electrically conductive line structures 146 (e.g., plural drain select gate electrodes) overlying a single continuous structure of a memory level electrically conductive layer 46 (e.g., word lines and source select gate electrode(s)) can be located between the pair of backside trenches (79, 269).

The electrically conductive line structures 146 can function as self-aligned drain select gate electrodes that can select a subset of the memory stack structures 55 (e.g., vertical NAND strings) among the entire set of memory stack structures 55 provided between the pair of backside trenches (79, 269). In other words, by activating only one electrically conductive line structure 146 among the set of all electrically conductive line structures 146 located at the same level and between the pair of backside trenches (79, 269), only the subset of the memory stack structures 55 that underlie the activated electrically conductive line structure 146 can be accessed by bit lines, each of which can be connected to the semiconductor channels of memory stack structures 55 laterally surrounded by different electrically conductive line structures 146.

Figure 17:
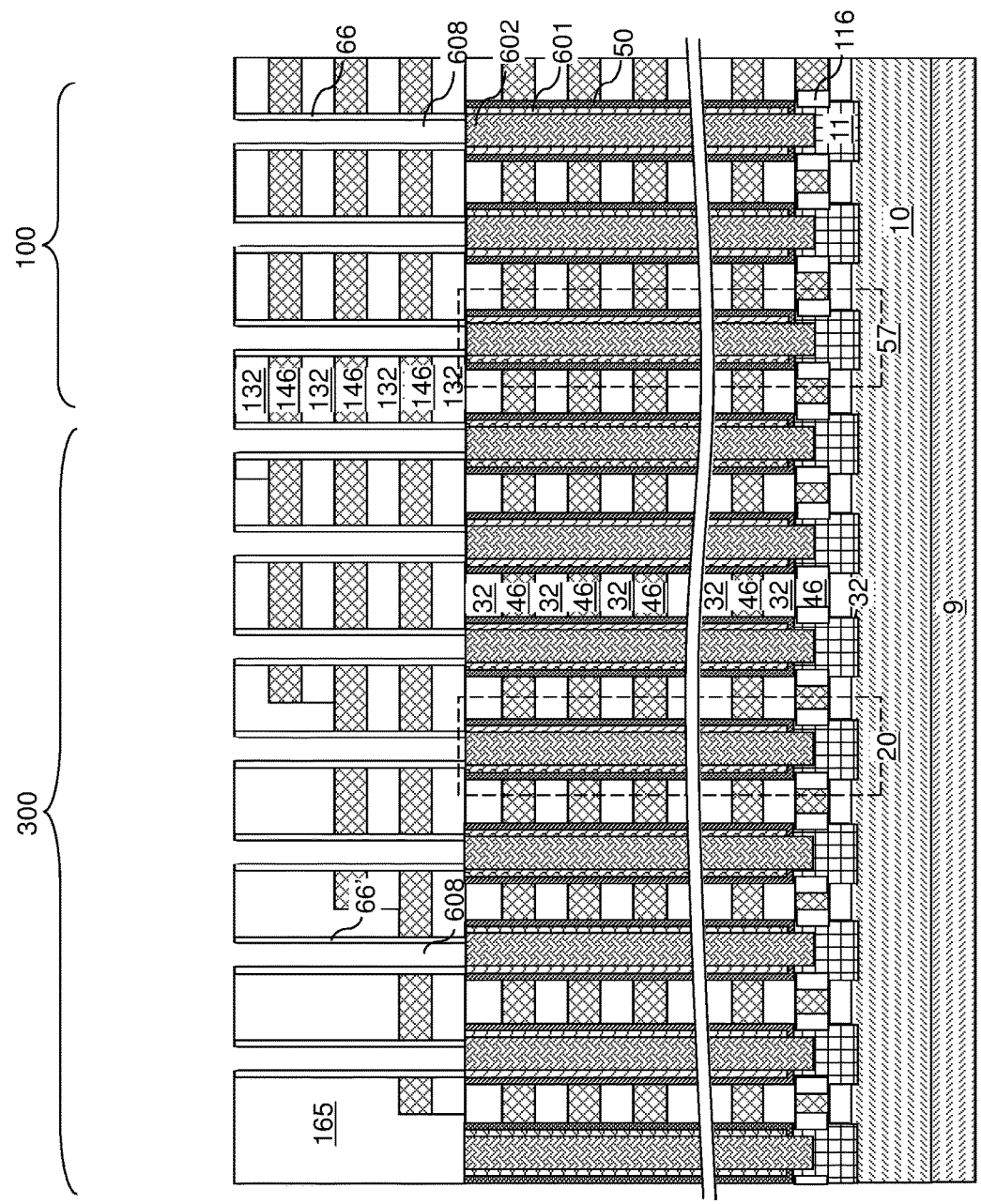
FIG. 17 is a schematic vertical cross-sectional view of the first exemplary structure after formation of drain select level gate dielectrics in the drain select level openings according to the first embodiment of the present disclosure.

Referring to FIG. 17, drain select level gate dielectrics 66 can be formed at a periphery of each of the drain select level openings (609, 609'). For example, a continuous dielectric material layer can be deposited by a conformal deposition method in the drain select level openings (609, 609') and in the upper backside trenches 269, and can be anisotropically etched. Each remaining vertical portion of the continuous dielectric material layer within the drain select level openings (609, 609') constitutes a drain select level gate dielectric 66 (e.g., a gate dielectric of a drain select transistor), which can have a tubular shape. A drain select level cavity 608 is provided within each drain select level gate dielectric 66. Each remaining vertical portion of the continuous dielectric material layer within the upper backside trenches 269 constitutes an upper insulating spacer (not shown).

Figure 18B:
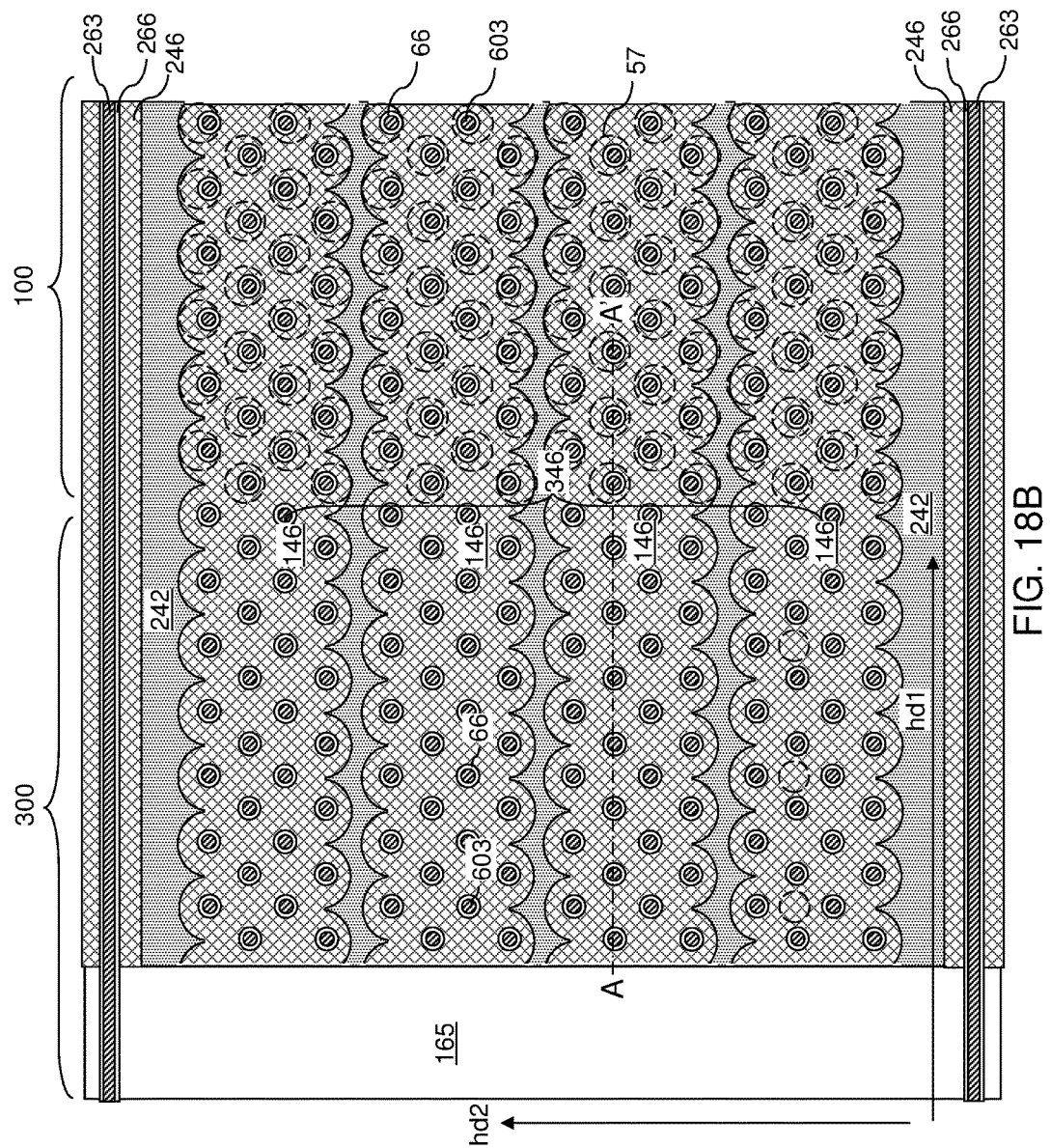
FIG. 18B is a top-down view of the first exemplary structure of FIG. 18A. The vertical plane A-A' is the plane of the schematic vertical cross-sectional view of FIG. 18A.

Referring to FIGS. 18A and 18B, a doped semiconductor material is deposited in the drain select level cavities 608 and within each volume laterally surrounded by the upper insulating spacer 266. Excess portions of the doped semiconductor material can be removed from above the top surface of the topmost drain select level insulating layer 132 by a planarization process, which can include a recess etch and/or chemical mechanical planarization. Each portion of the doped semiconductor material that fills the drain select level cavities constitute a drain select level channel portions 603 (i.e., channels of the drain select transistors), which is a portion of a vertical semiconductor channel 64 that also includes a memory level channel portion 60 (which may include a first semiconductor channel portion 601 and a second semiconductor channel portion 602). Each portion of the doped semiconductor material that fills remaining volumes of the upper backside trenches 269 constitutes an upper conductive via structure 263, which is also referred to as a second conductive via structure. Each vertical stack of a lower conductive via structure 76 and an upper conductive via structure 263 constitutes a backside contact via structure (76, 263) (e.g., source line or electrode) that contacts a respective source region 61.

The lateral offset between the geometrical center of each drain select level channel portion 603 and the underlying memory level channel portion 60 can be different from row to row within each two-dimensional array of drain select level channel portions 603 in which the drain select level portions 603 form rows that extend along the first horizontal direction. The difference between the first pitch p1 between rows of the memory level channel portions 60 (that extend along the first horizontal direction hd1) and the second pitch p2 between rows of the drain select level channel portions 603 is the mechanism for the variations in the lateral offset between the geometrical center of each drain select level channel portion 603 and the underlying memory level channel portion 60 along the second horizontal direction hd2.

Each of the drain select level channel portions 603 can be formed directly on a respective one of the memory level channel portions 60. In one embodiment, the memory stack structures 55 (e.g., vertical NAND strings) can be arranged in rows that extend along the first horizontal direction hd1 with a first row-to-row pitch (i.e., the first pitch p1) along the second horizontal direction hd2 across an area including two or more electrically conductive line structures 146 of a same drain select level. For each electrically conductive line structure 146, a respective array of drain select level channel portions 603 extends through the electrically conductive line structure 146, and drain select level channel portions 603 within the respective array are arranged in rows that extend along the first horizontal direction hd1 with a second row-to-row pitch (i.e., the second pitch p2) along the second horizontal direction hd2. The second row-to-row pitch p2 is less than the first row-to-row pitch p1.

In one embodiment, the row-to-row distance (as measured between the two lines that pass through geometrical centers of the select level channel portions 603 within each row) between the outer most rows of two neighboring hexagonal arrays of drain select level channel portions 603 can be greater than the second row-to-row pitch p2 by a factor in a range from 1.5 to 3. The difference between the row-to-row distance between the outer most rows of two neighboring hexagonal arrays of drain select level channel portions 603 and the second row-to-row pitch p2 ensures that the electrically insulating line structures 242 can be formed from remaining portions of the at least one drain select level dielectric layer 142 by controlling the duration of the isotropic etch that removes the material of at least one drain select level dielectric layer 142 at the processing steps of FIGS. 15A and 15B.

Figure 19A:
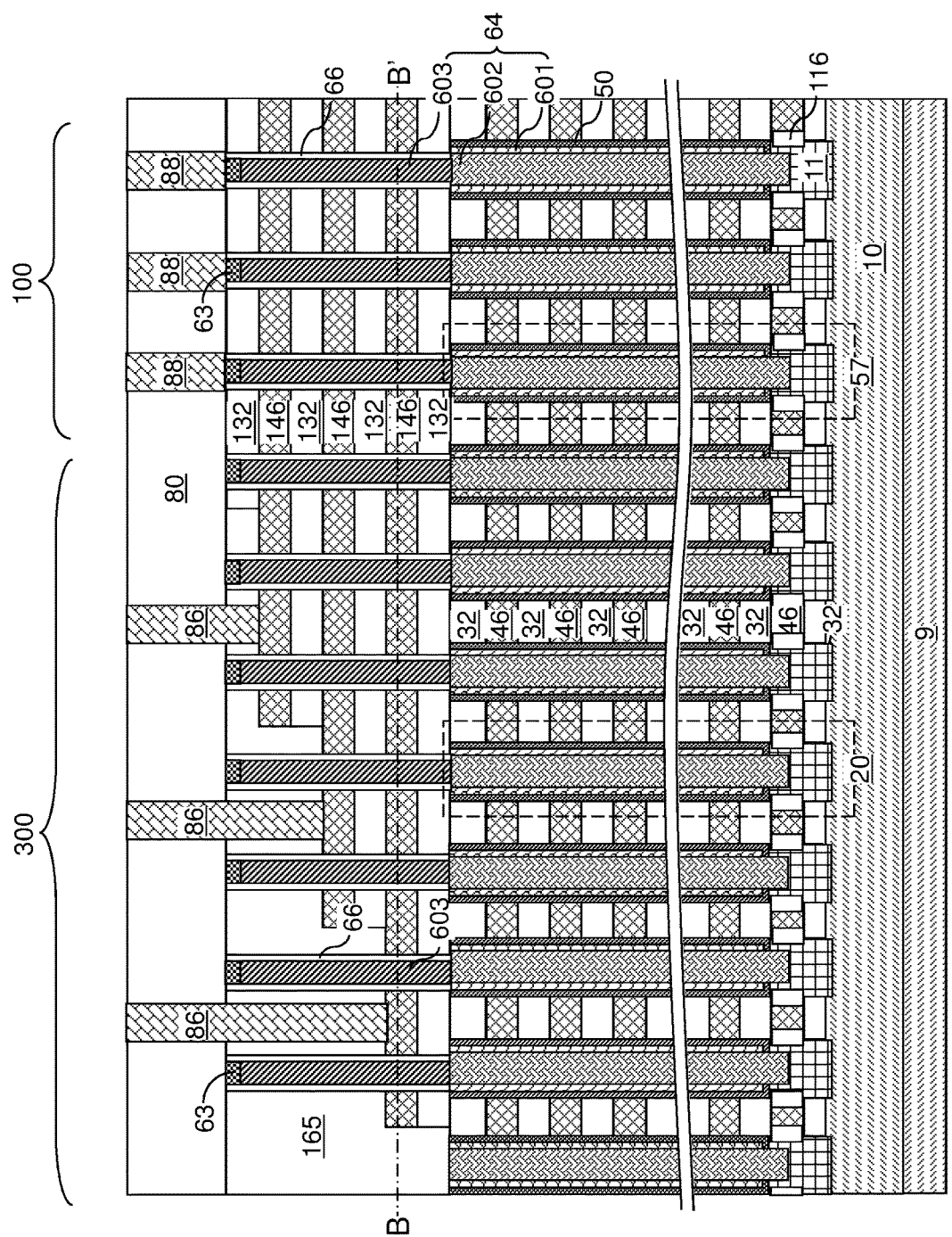
FIG. 19A is a schematic vertical cross-sectional view of the first exemplary structure after formation of various conductive via structures according to the first embodiment of the present disclosure.
Figure 19B:
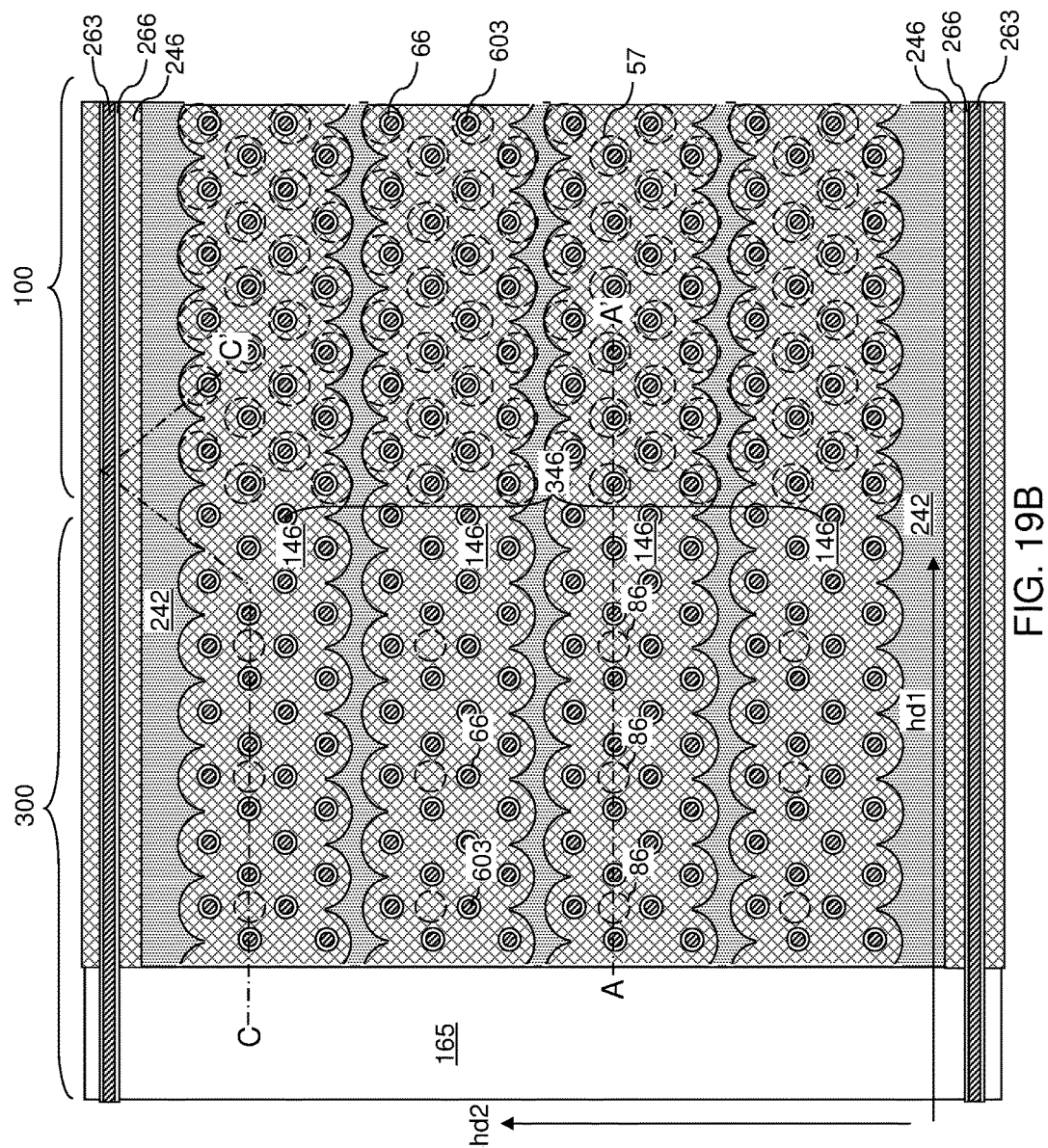
FIG. 19B is a top-down view of the first exemplary structure of FIG. 19A. The vertical plane A-A' is the plane of the schematic vertical cross-sectional view of FIG. 19A.
Figure 19C:
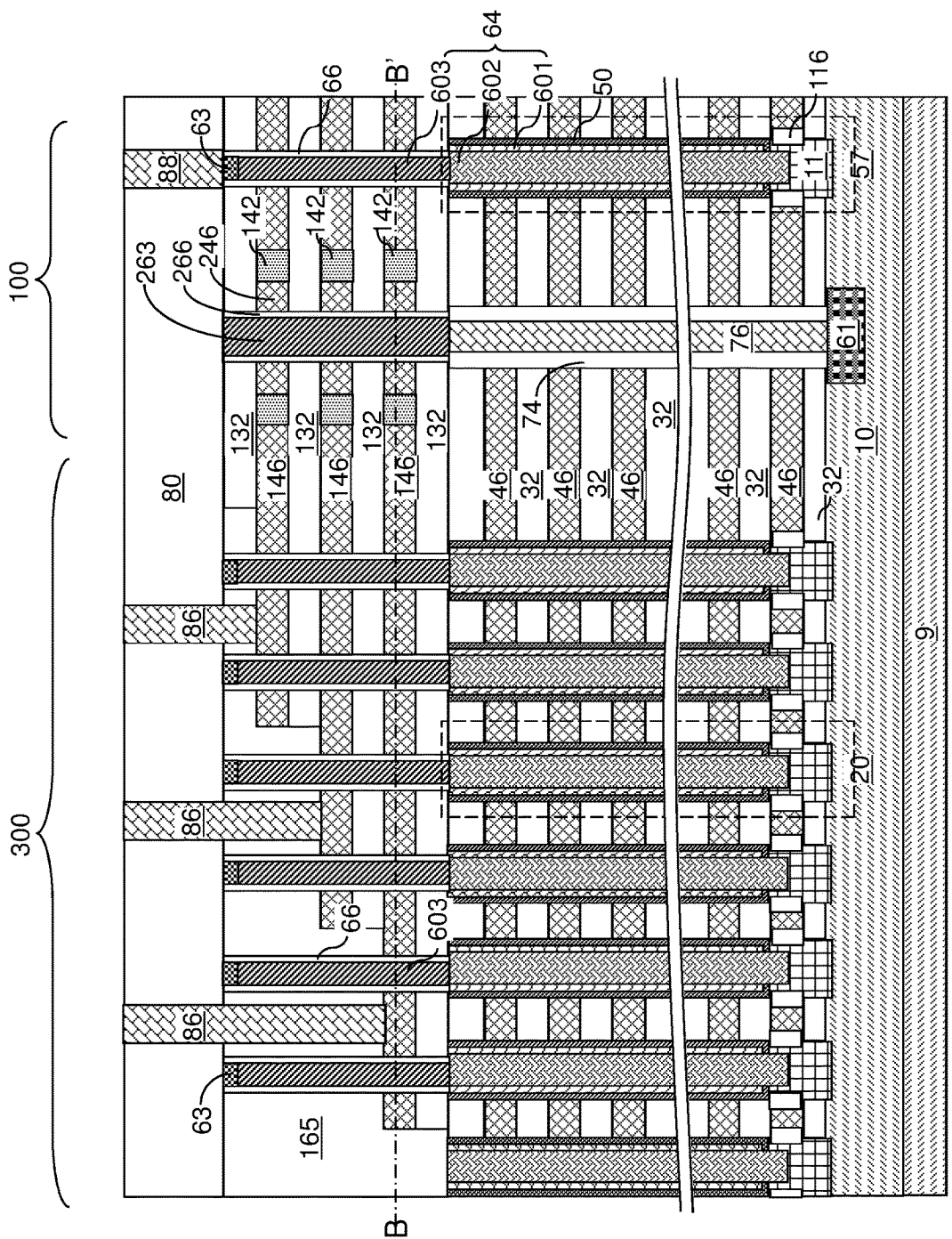
FIG. 19C is another schematic vertical cross-sectional view of the first exemplary structure of FIGS. 19A and 19B along the zig-zag vertical plane C-C' shown in FIG. 19B.

Referring to FIGS. 19A-19C, drain regions 63 can be formed by implanting dopants of the first conductivity type into an upper portion of each drain select level channel portion 603. In one embodiment, the source regions 61 and the drain regions 63 can have a doping of the first conductivity type, and the vertical semiconductor channels 64, the semiconductor material layer 10, and the epitaxial pedestals 11 can have a doping of the second conductivity type. The bottom surface of each drain region 63 can be located above the horizontal plane including the top surface of the topmost drain select level conductive layer 346. Semiconductor channels (59, 11, 64) extend between each source region 61 and a respective set of drain regions 63. The semiconductor channels (59, 11, 64) include the memory level channel portions 60 of the memory stack structures 55.

A contact level dielectric material layer 80 can be deposited over the drain select level layers (132, 146). The contact level dielectric material layer 80 includes a dielectric material such as silicon oxide. The contact level dielectric material layer 80 can be deposited by a conformal deposition method or by a non-conformal deposition method. The thickness of the contact level dielectric material layer 80 can be in a range from 50 nm to 500 nm, although lesser and greater thicknesses can also be employed.

Contact via cavities can be formed through the contact level dielectric material layer 80 and the drain select level retro-stepped dielectric material portion 165. For example, a photoresist layer (not shown) can be applied and patterned over the contact level dielectric material layer 80 to form openings therein, and the pattern of the openings in the photoresist layer can be transferred through the contact level dielectric material layer 80 and the drain select level retro-stepped dielectric material portion 165 to form various contact via cavities. At least one conductive material can be deposited in the contact via cavities to form conductive via structures, which include drain contact via structures 88 that contact a respective drain region 63 and control gate contact via structures 86 that contact a respective one of the memory level electrically conductive layers 46 and the drain select level conductive layers 346.

Figure 20:
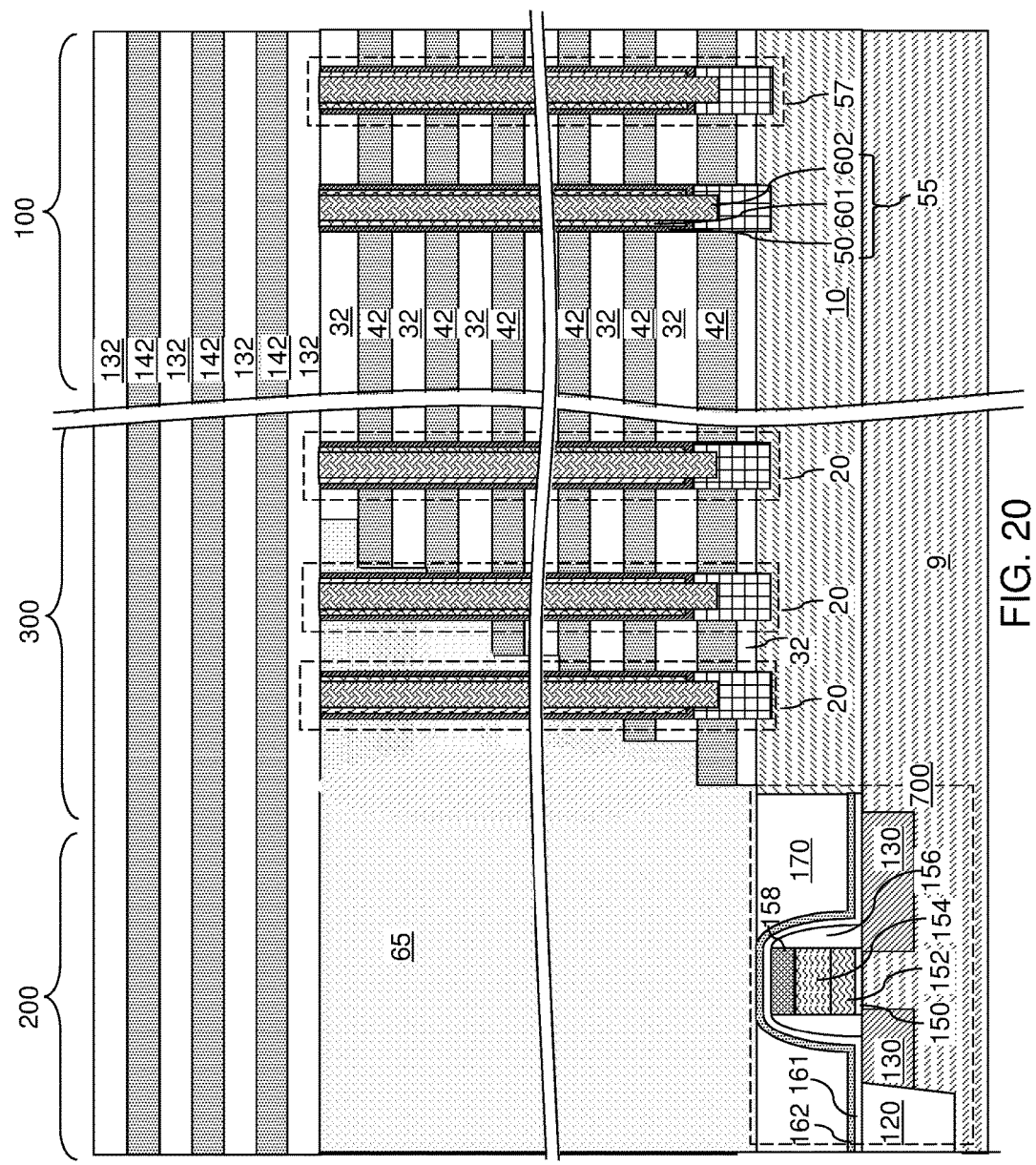
FIG. 20 is a schematic vertical cross-sectional view of a second exemplary structure after formation of drain select level layers according to a second embodiment of the present disclosure.

Referring to FIG. 20, a second exemplary structure according to a second embodiment of the present disclosure is illustrated. In this embodiment, the drain select level layers are formed before formation of the electrically conductive layers (e.g., word lines) 46, and the drain side select gate electrodes 146 are formed before the word lines 46. The structure of FIG. 20 can be derived from the first exemplary structure of FIG. 6 by forming drain select level layers (132, 142) over the alternating stack (32, 42) of the insulating layers 32 and the sacrificial material layers 42. For example, the processing steps of FIGS. 12A and 12B can be performed to form the drain select level layers (132, 142).

The drain select level layers (132, 142) includes at least one drain select level dielectric layer 142 that is subsequently replaced partially, and at least one drain select level insulating layer 132 that is not replaced in subsequent processing steps. Each drain select level insulating layer 132 is also referred to an additional insulating layer, which provides vertical electrical isolation in a manner similar to the insulating layers 32 within the alternating stack (32, 42). In one embodiment, the drain select level layers (132, 142) can include only a single drain select level dielectric layer 142 or a plurality of drain select level dielectric layers 142. The topmost layer of the drain select level layers (132, 142) can be a topmost drain select level insulating layer 132. The bottommost layer of the drain select level layers (132, 142) may be a drain select level insulating layer 132 or a drain select level dielectric material layer 142.

Figure 21A:
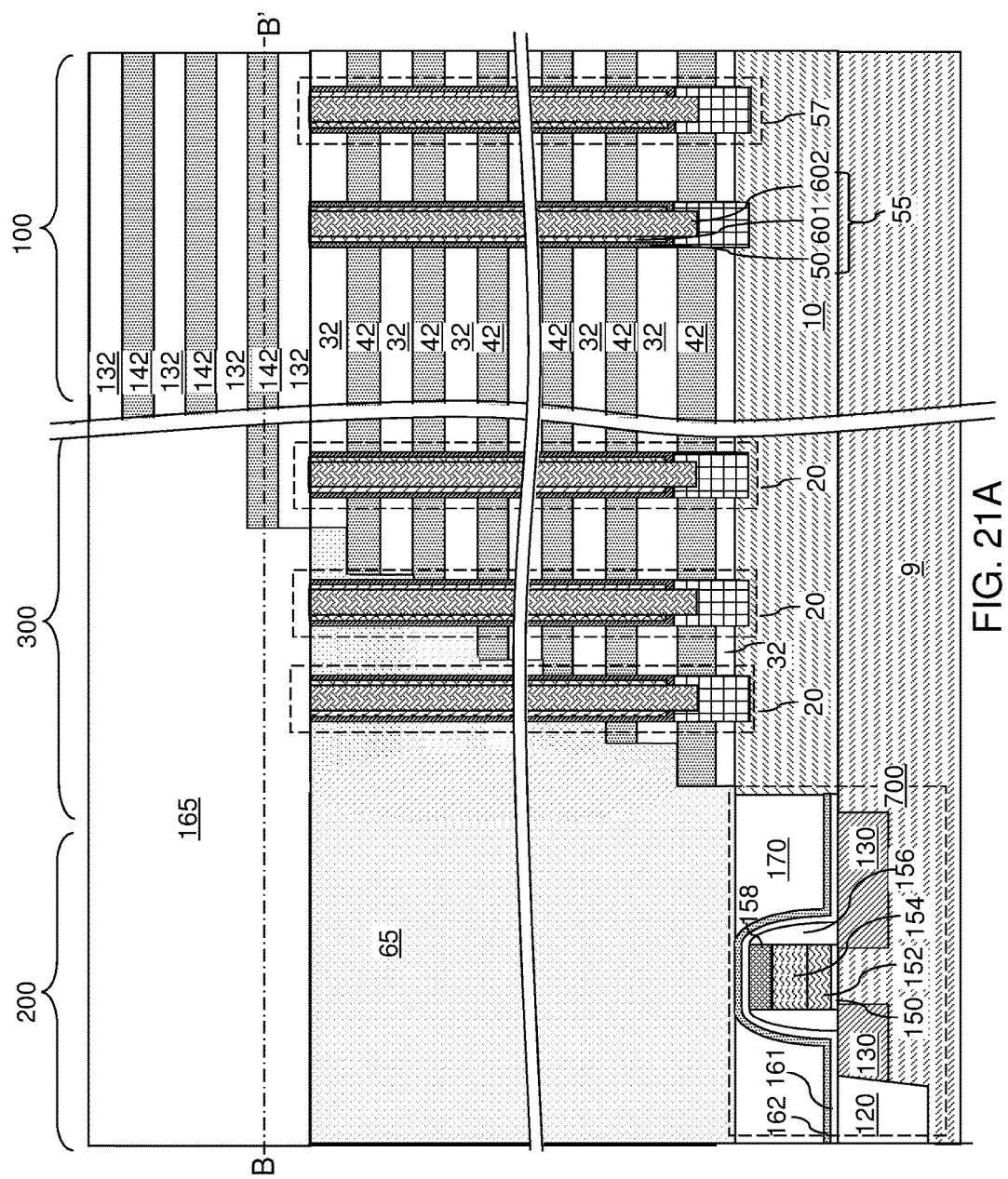
FIG. 21A is a schematic vertical cross-sectional view of the second exemplary structure after formation of drain select level stepped surfaces and a drain select level retro-stepped dielectric material portion according to the second embodiment of the present disclosure.
Figure 21B:
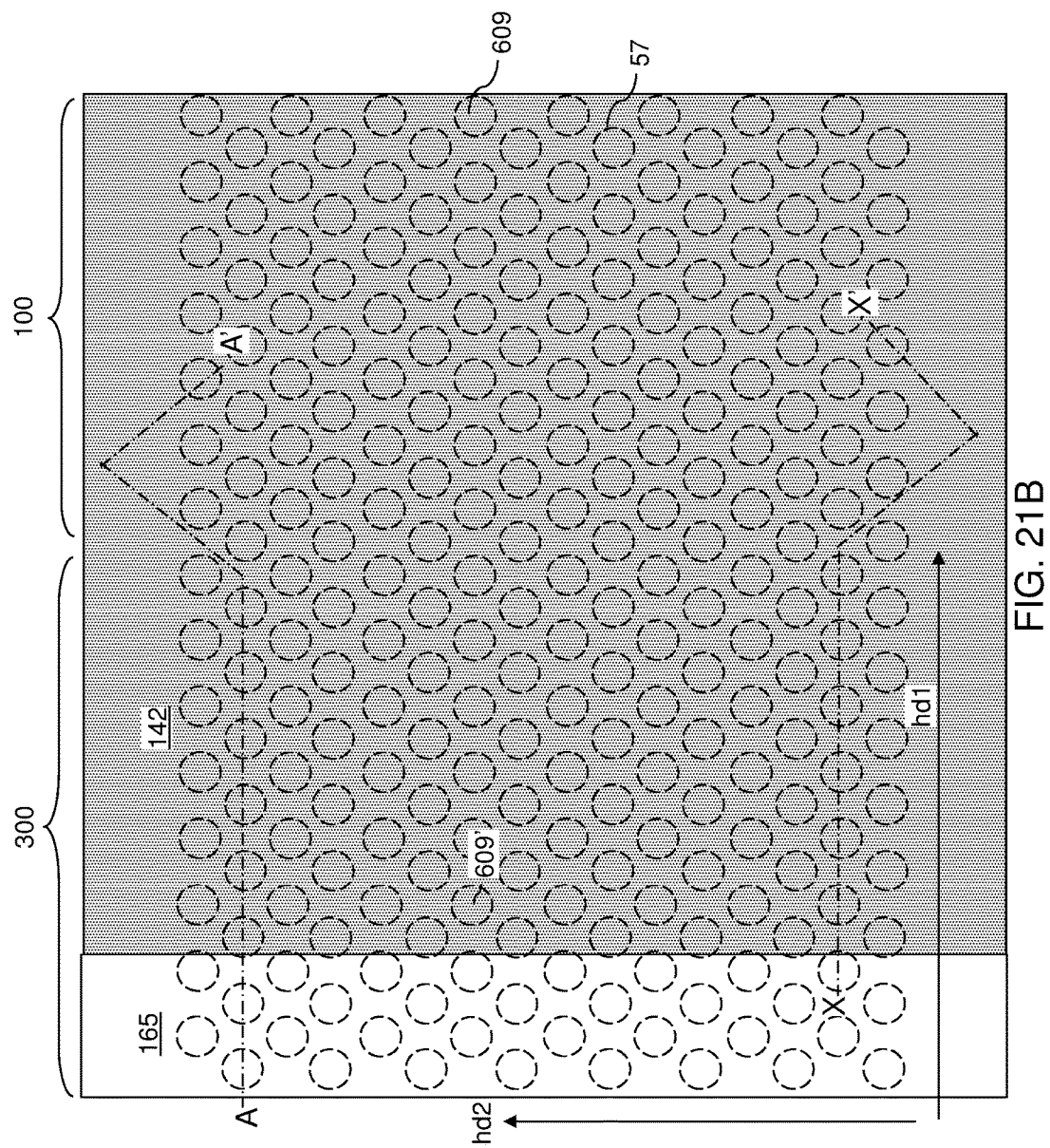
FIG. 21B is a top-down view of the second exemplary structure of FIG. 21A. The vertical plane A-A' is the plane of the schematic vertical cross-sectional view of FIG. 21A.
Figure 22:
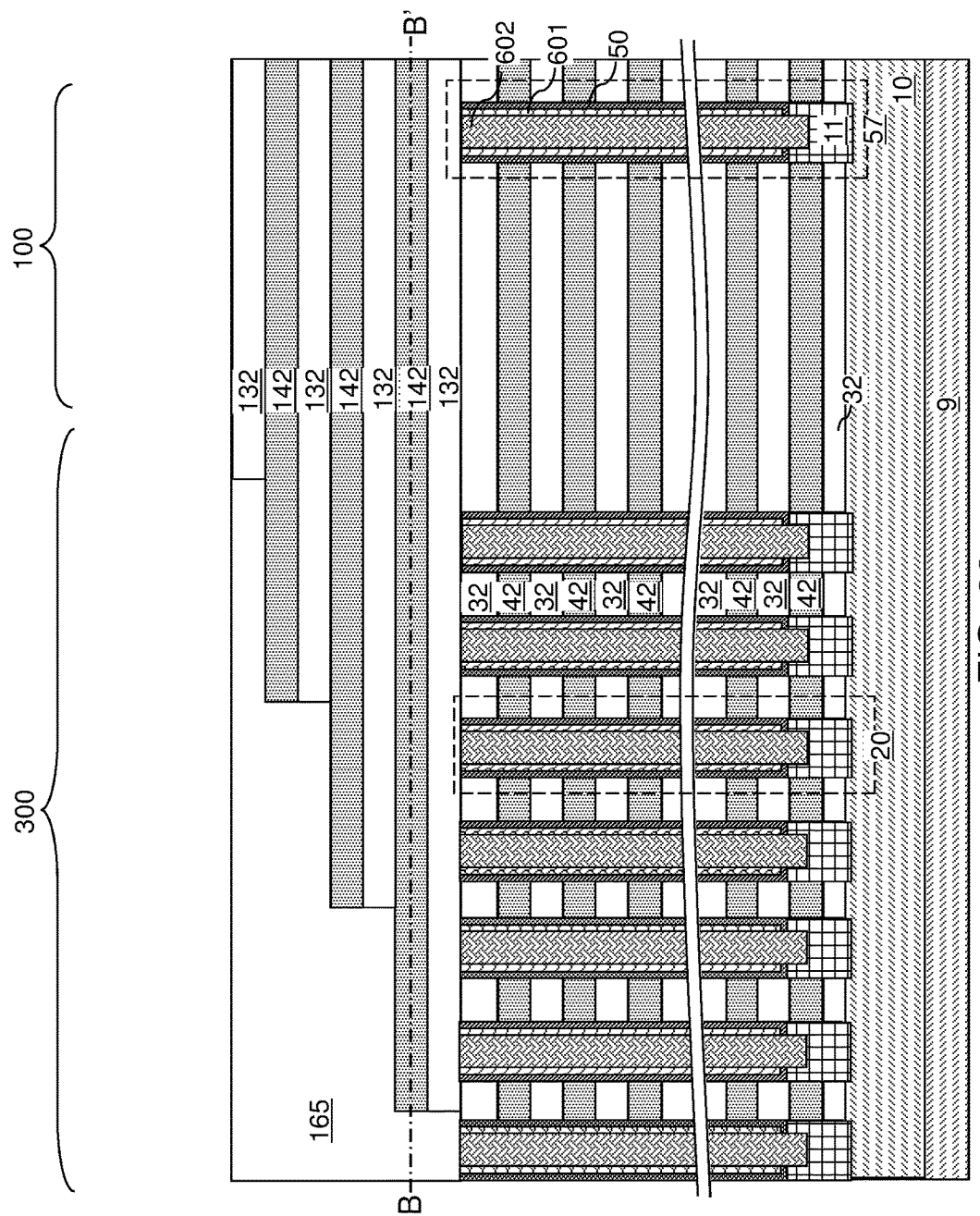
FIG. 22 is a vertical cross-sectional view of the second exemplary structure of FIGS. 21A and 21B along the zig-zag vertical plane X-X' in FIG. 21B. The horizontal plane B-B' corresponds to the plane of the horizontal cross-sectional view of FIG. 21B.

Referring to FIGS. 21A, 21B, and 22, another terrace region is formed by patterning the drain select level alternating stack (132, 412), which is herein referred to as a drain select level terrace region. The zig-zag vertical plane A-A' in FIG. 21B is the plane of the vertical cross-sectional view of FIG. 21A, and the zig-zag vertical plane X-X' in FIG. 22 is the plane of the vertical cross-sectional view of FIG. 22. If multiple drain select level dielectric layers 142 are present, each drain select level dielectric layer 142 other than a topmost drain select level dielectric layer 142 within the drain select level alternating stack (132, 142) laterally extends farther than any overlying drain select level dielectric layer 142 within the drain select level alternating stack (132, 142). Each sacrificial material layer 42 can laterally extend farther than the drain select level dielectric layers 142. A drain select level stepped cavity can be formed above the drain select level terrace region.

A drain select level retro-stepped dielectric material portion 165 (i.e., an insulating fill material portion) can be formed in the drain select level stepped cavity by deposition of a dielectric material therein. For example, a dielectric material such as silicon oxide can be deposited in the stepped cavity. Excess portions of the deposited dielectric material can be removed from above the top surface of the topmost drain select level insulating layer 132, for example, by chemical mechanical planarization (CMP). The remaining portion of the deposited dielectric material filling the stepped cavity constitutes the drain select level retro-stepped dielectric material portion 165. If silicon oxide is employed for the drain select level retro-stepped dielectric material portion 165, the silicon oxide of the retro-stepped dielectric material portion 65 may, or may not, be doped with dopants such as B, P, and/or F. In one embodiment, the processing steps of FIG. 13 can be performed to form the drain select level retro-stepped dielectric material portion 165.

Figure 23A:
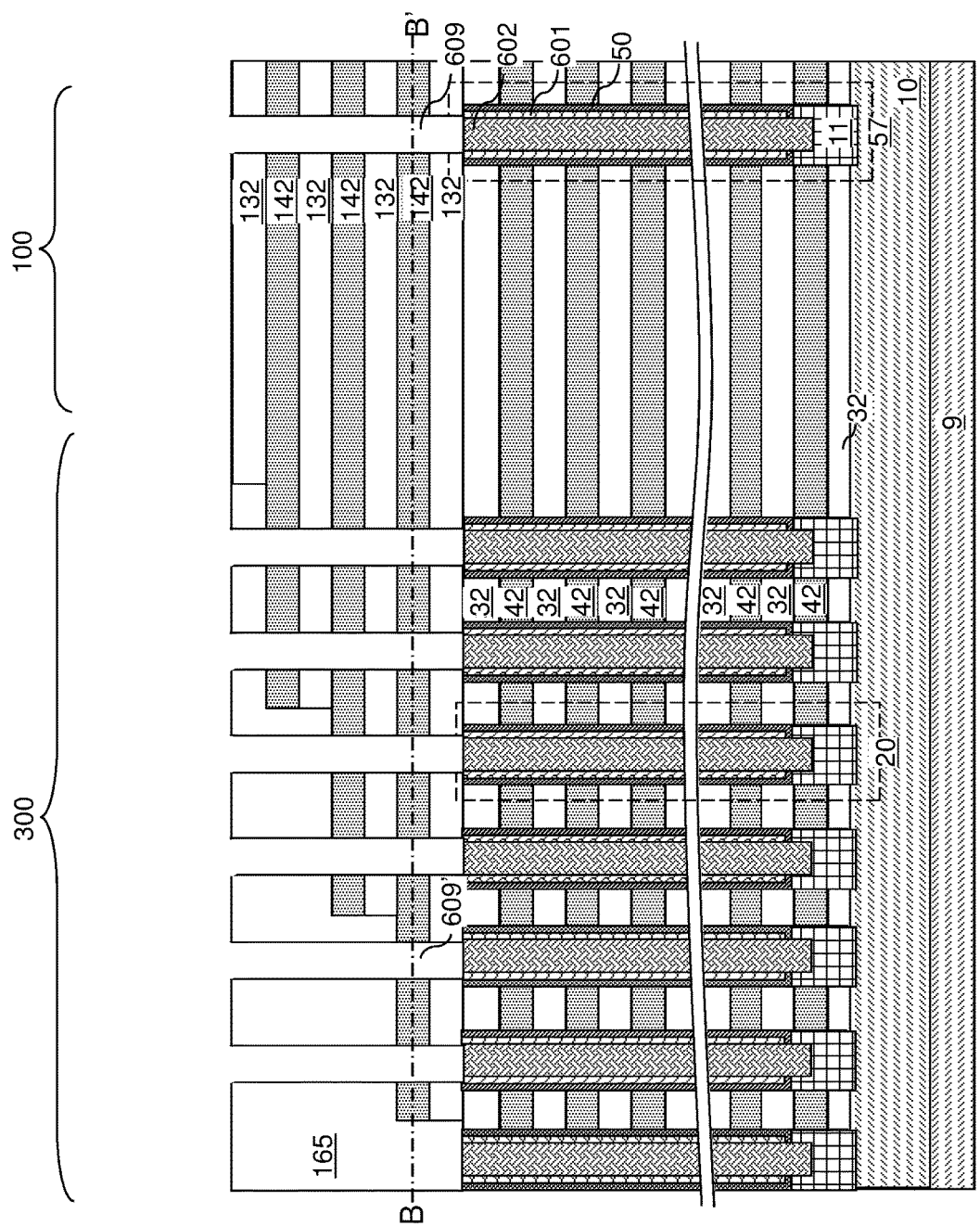
FIG. 23A is a schematic vertical cross-sectional view of the second exemplary structure after formation of drain select level openings through the drain select level layers according to the second embodiment of the present disclosure.
Figure 23B:
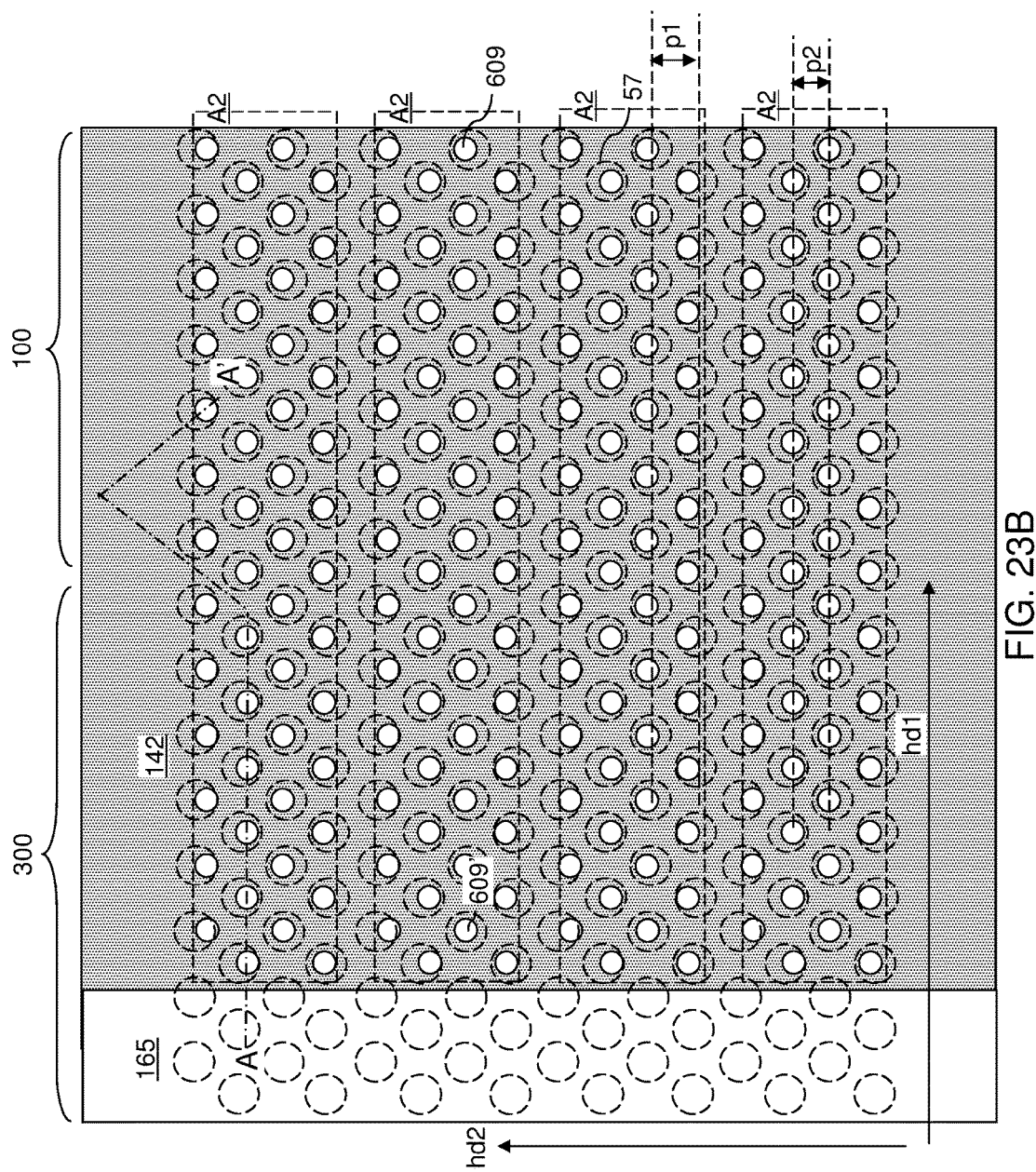
FIG. 23B is a top-down view of the second exemplary structure of FIG. 23A. The vertical plane A-A' is the plane of the schematic vertical cross-sectional view of FIG. 23A.

Referring to FIGS. 23A and 23B, drain select level openings (609, 609') are formed through the drain select level layers (132, 142). For example, a photoresist layer can be applied over the drain select level layers (132, 142), and can be lithographically patterned to form openings in the memory array region 100 and in the contact region 300. The pattern of the openings can be transferred through the drain select level alternating stack (132, 142) by an anisotropic etch to form drain select level openings (609, 609').

The drain select level openings (609, 609') include drain select level memory openings 609 that overlie the memory stack structures 55 and drain select level support openings 609' that overlie the support pillar structures 20. A top surface of a memory level channel portion 60 in a respective memory stack structure 55 is physically exposed underneath each of the drain select level memory openings 609. A top surface of a memory level channel portion 60 in a respective support pillar structure 20 is physically exposed underneath each of the drain select level support openings 609'.

In one embodiment, the drain select level openings (609, 609') can be formed as two-dimensional periodic arrays A2. Each of the two-dimensional periodic arrays A2 can include rows that extend along the first horizontal direction hd1 and having a uniform inter-row pitch (which is herein referred to as a second pitch p2) along the second horizontal direction hd2, which can be perpendicular to the first horizontal direction hd1. In one embodiment, a plurality of drain select level memory openings 609 can be formed within the area of a single array of memory openings 49 (each of which includes a respective memory stack structure 55). Thus, the plurality of two-dimensional periodic arrays A2 of drain select level openings (609, 609') can include a plurality of two-dimensional arrays of drain select level memory openings 609 formed between a neighboring pair of regions in which drain select level openings (609, 609') are absent and in which backside trenches are to be subsequently formed. In one embodiment, a plurality of drain select level support openings 609' can be formed within the area of a single array of support openings 19 (each of which includes a respective support pillar structure 20). Thus, the plurality of two-dimensional periodic arrays A2 of drain select level openings (609, 609') can include a plurality of two-dimensional arrays of drain select level support openings 609'. Each two-dimensional periodic array A2 can include respective rows that extend along the first horizontal direction hd1 and have a uniform inter-row pitch (i.e., the second pitch p2) along the second horizontal direction hd2. The second pitch p2 is less than the first pitch p1, and may be in a range from 60% to 90% of the first pitch.

In one embodiment, the memory stack structures 55 between a neighboring pair of regions free of memory openings 49, support openings 19, and drain select level openings (609, 609') can be arranged as a first periodic hexagonal array having a first row-to-row pitch (the first pitch p1) along the second horizontal direction hd2, and each array A2 of drain select level memory openings 609 can be arranged as a respective second periodic hexagonal array having a second row-to-row pitch (the second pitch p2) along the second horizontal direction hd2. In one embodiment, the first periodic hexagonal array A1 and each second periodic hexagonal array A2 has the same periodicity along the first horizontal direction hd1 (i.e., the pitch within each row of memory stack structures 55 along the first horizontal direction hd1 and the pitch within each row of drain select level memory openings 609) and different periodicities (i.e., the first pitch p1 for the first periodic hexagonal array A1 and the second pitch p2 for the second periodic hexagonal array A2) along the second horizontal direction hd2. The second periodic hexagonal arrays A2 are laterally spaced from each other by a separation distance that is greater than the separation distance of neighboring rows within each of the second periodic hexagonal arrays A2.

Figure 24A:
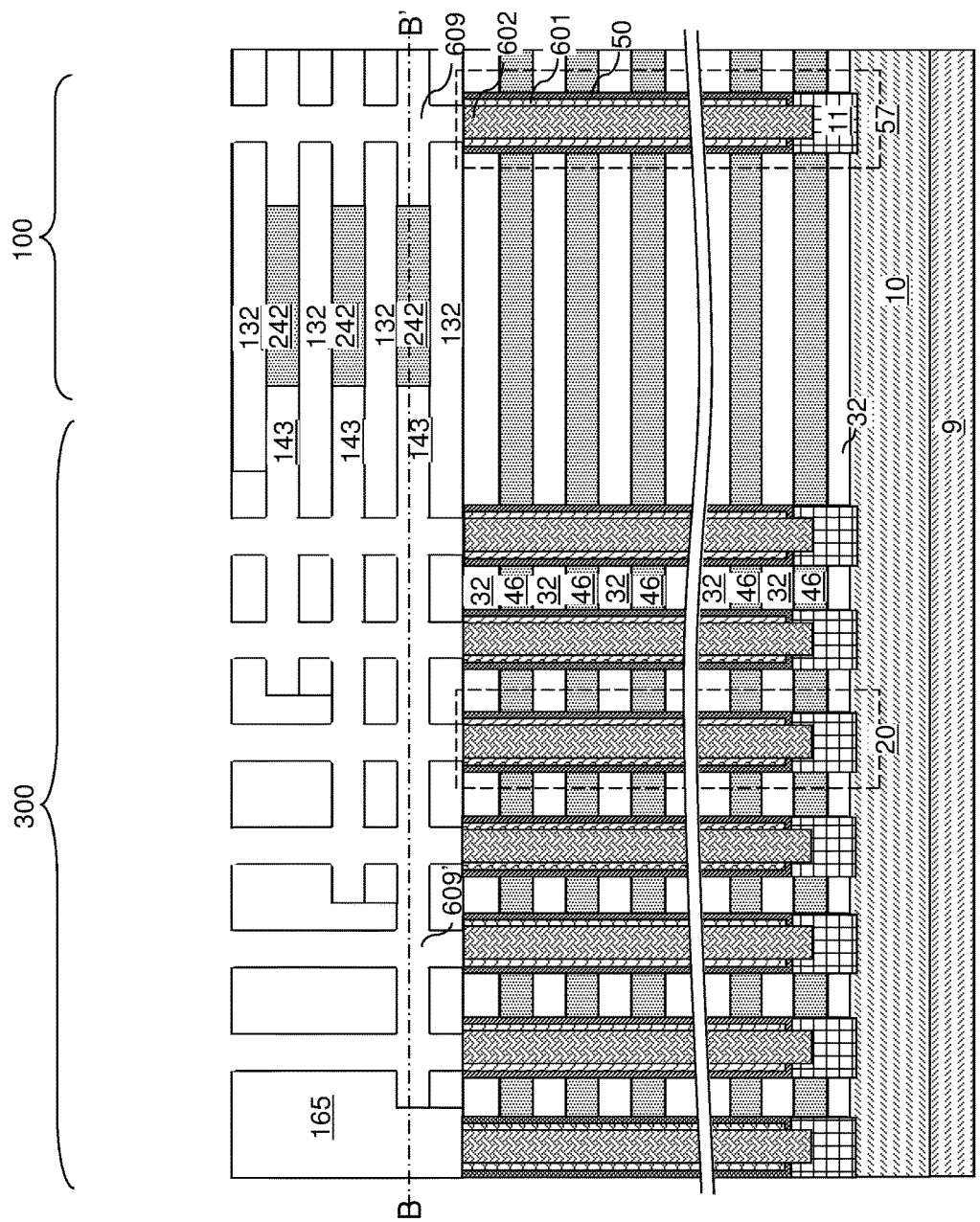
FIG. 24A is a schematic vertical cross-sectional view of the second exemplary structure after partially etching the drain select level dielectric layers to form drain select level lateral recesses according to the second embodiment of the present disclosure.

Referring to FIGS. 24A and 24B, an etchant that isotropically etches the dielectric material of the drain select level dielectric layers 142 selective to the material of the drain select level insulating layers 132, the material of the memory level insulating layers 32, the memory level channel portions 60 of the memory stack structures 55, and the support pillar structures 20. For example, the drain select level dielectric layers 142 can include silicon nitride, the drain select level insulating layers 132 and the memory level insulating layers 32 can include silicon oxide, and the etchant can be hot phosphoric acid that etches silicon nitride selective to silicon oxide and semiconductor materials.

Drain select level lateral recesses 143 are formed by removing portions of the at least one drain select level dielectric layer 142 from around the drain select level memory openings 609. The drain select level lateral recesses 143 are formed by isotropically etching the material of the at least one drain select level dielectric layer 142 employing an etchant that is provided into the drain select level openings (609, 609'). Lateral cavities formed around the drain select level memory openings 609 within a same second periodic hexagonal array A2 are connected among one another such that a void continuously extends over a subset of the first periodic hexagonal array A1 of the memory stack structures 55 and the support pillar structures 20 located within the second periodic hexagonal array A2. The duration of etch isotropic etch of the material of the drain select level dielectric layers 142 can be selected to leave remaining portions of the drain select level dielectric layers 142 between neighboring pairs of second periodic hexagonal arrays A2 of the drain select level openings (609, 609'). Thus, the drain select level lateral recesses 143 are laterally spaced among one another by electrically insulating line structures 242 that are remaining portions of the at least one drain select level dielectric layer 142.

Figure 25A:
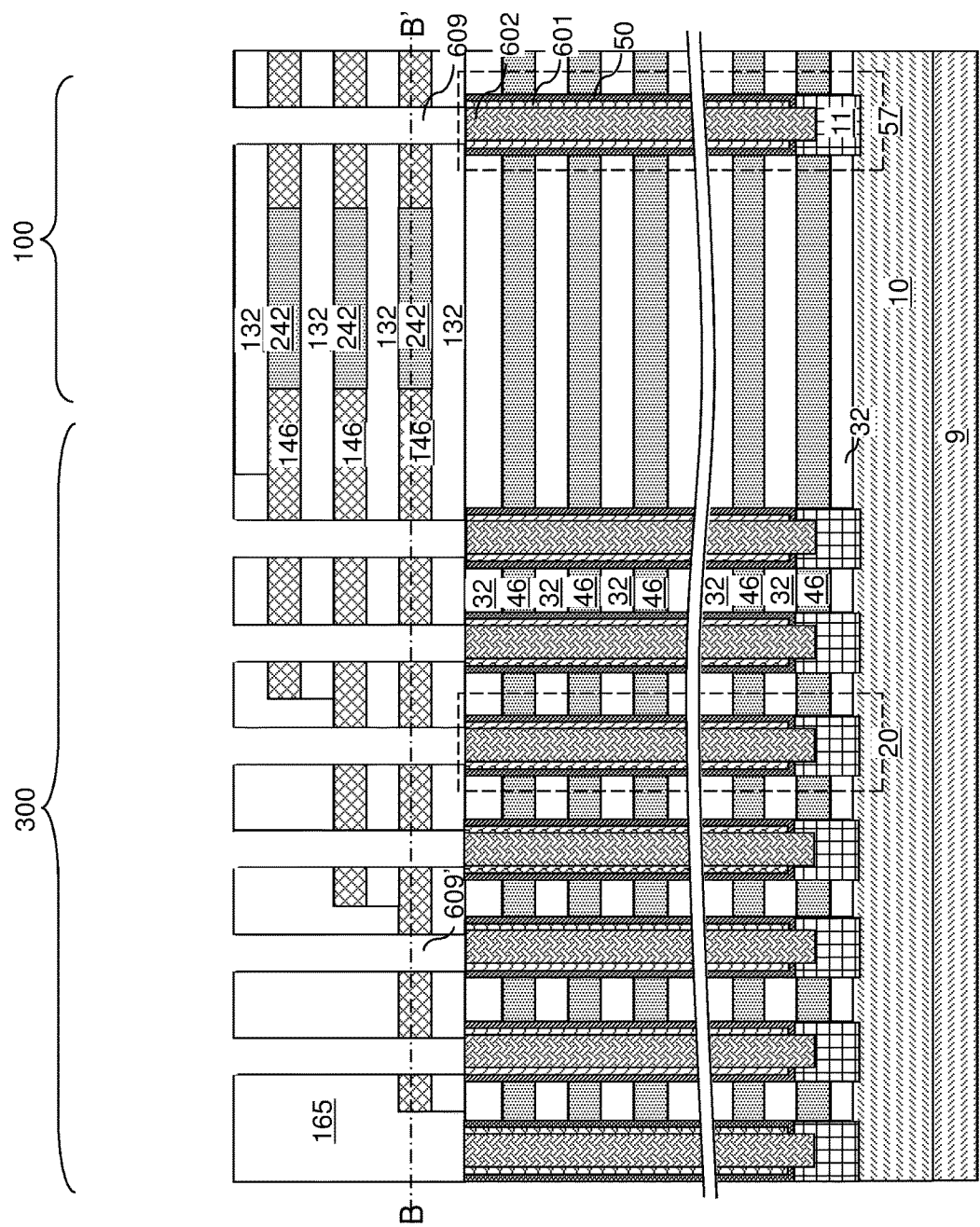
FIG. 25A is a schematic vertical cross-sectional view of the second exemplary structure after formation of drain select level conductive layers in the drain select level lateral recesses according to the second embodiment of the present disclosure.
Figure 25B:
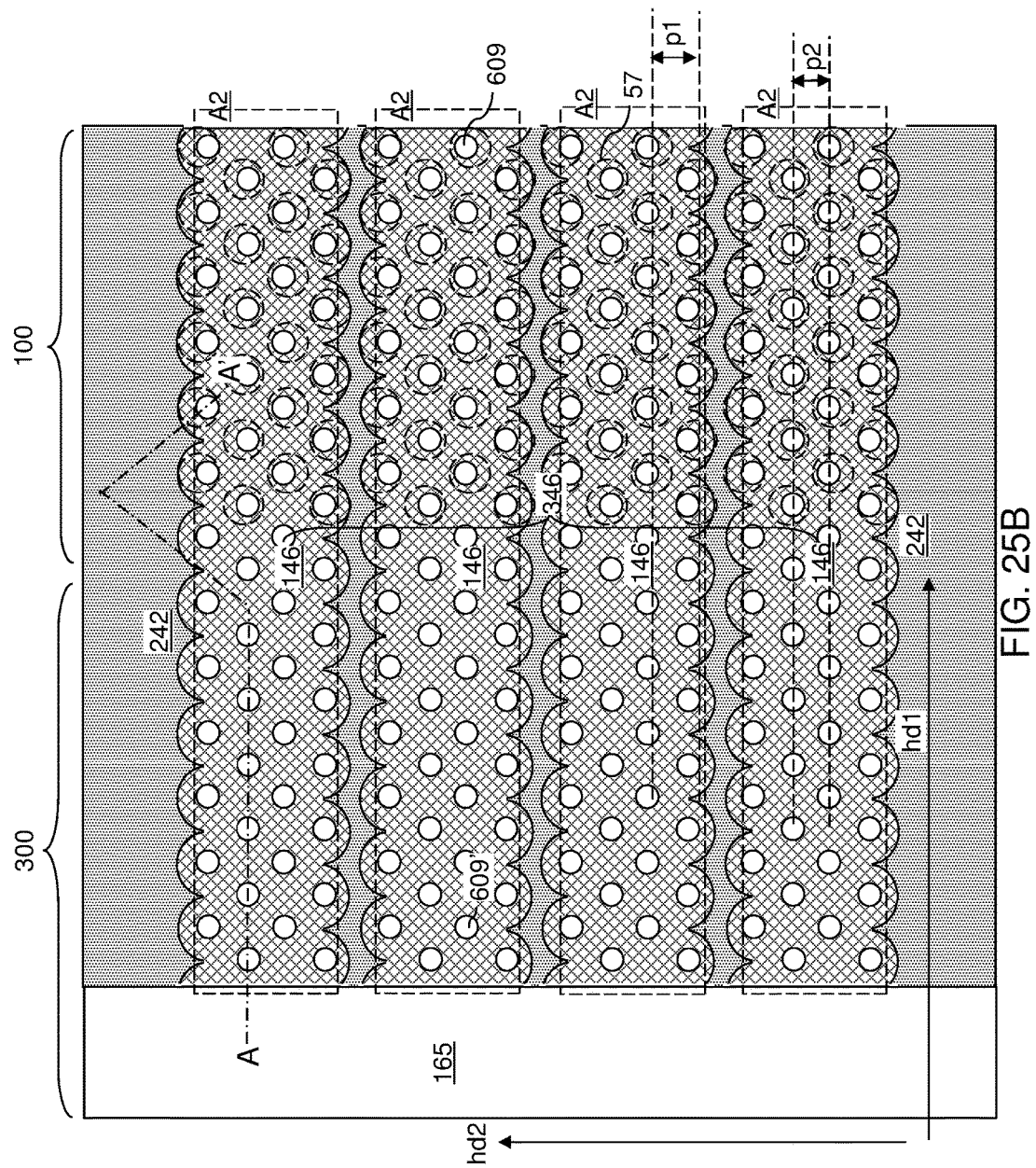
FIG. 25B is a top-down view of the second exemplary structure of FIG. 25A. The vertical plane A-A' is the plane of the schematic vertical cross-sectional view of FIG. 25A.

Referring to FIGS. 25A and 25B, at least one conductive material (such as a metallic liner (e.g., TiN) and a metallic fill material portion (e.g., a tungsten portion)) can be deposited through the drain select level openings (609, 609') into the drain select level lateral recesses 143 by a conformal deposition process (such as chemical vapor deposition, atomic layer deposition, and/or electroplating). Each drain select level backside recess 143 is filled with a respective electrically conductive line structure 146 that laterally extend along the first horizontal direction hd1 and are laterally spaced apart among one another along the second horizontal direction hd2. The set of all electrically conductive line structures 146 located within a same level constitute a drain select level conductive layer 346. Thus, each drain select level conductive layer 346 is formed in the drain select level lateral recesses 143 located at a same level. Each of the at least one drain select level conductive layer 346 comprises electrically conductive line structures 146.

Excess portions of the deposited at least one conductive material in the drain select level openings (609, 609') can be removed by an anisotropic etch process that is selective to the materials of the drain select level insulating layers 132 and the semiconductor materials of the memory level channel portions 60. Thus, the at least one drain select level conductive layer 346 is formed by depositing at least one conductive material in the drain select level lateral recesses 143 employing the drain select level openings (609, 609') as a conduit for transporting the conductive material, and by removing portions of the conductive material from inside the drain select level openings (609, 609').

The at least one drain select level conductive layer 346 is formed prior to formation of the memory level electrically conductive layers 46 (which are subsequently formed by replacement of the sacrificial material layers 42 with conductive material portions) employing a different deposition process than the deposition process employed to form the memory level electrically conductive layers. Each of the electrically insulating line structures 242 (which are remaining portions of the at least one drain select level dielectric layer 142) laterally extends along the first horizontal direction hd1 and includes multiple concave sidewalls that are adjoined among one another. Each of the electrically conductive line structures 146 laterally extends along the first horizontal direction hd1 and includes multiple convex sidewalls that are adjoined among one another and physically contacts a set of adjoined concave sidewalls of a respective electrically insulating line structure 242.

The electrically conductive line structures 146 can function as self-aligned drain select gate electrodes that can select a subset of the memory stack structures 55 among the entire set of memory stack structures 55 in a memory block (e.g., located between a pair of backside trenches to be formed later). In other words, by activating only one electrically conductive line structure 146 among the set of all electrically conductive line structures 146 located at the same level in the same memory block, only the subset of the memory stack structures 55 that underlie the activated electrically conductive line structure 146 can be accessed by bit lines, each of which can be connected to the semiconductor channels of memory stack structures 55 laterally surrounded by different electrically conductive line structures 146.

Figure 26A:
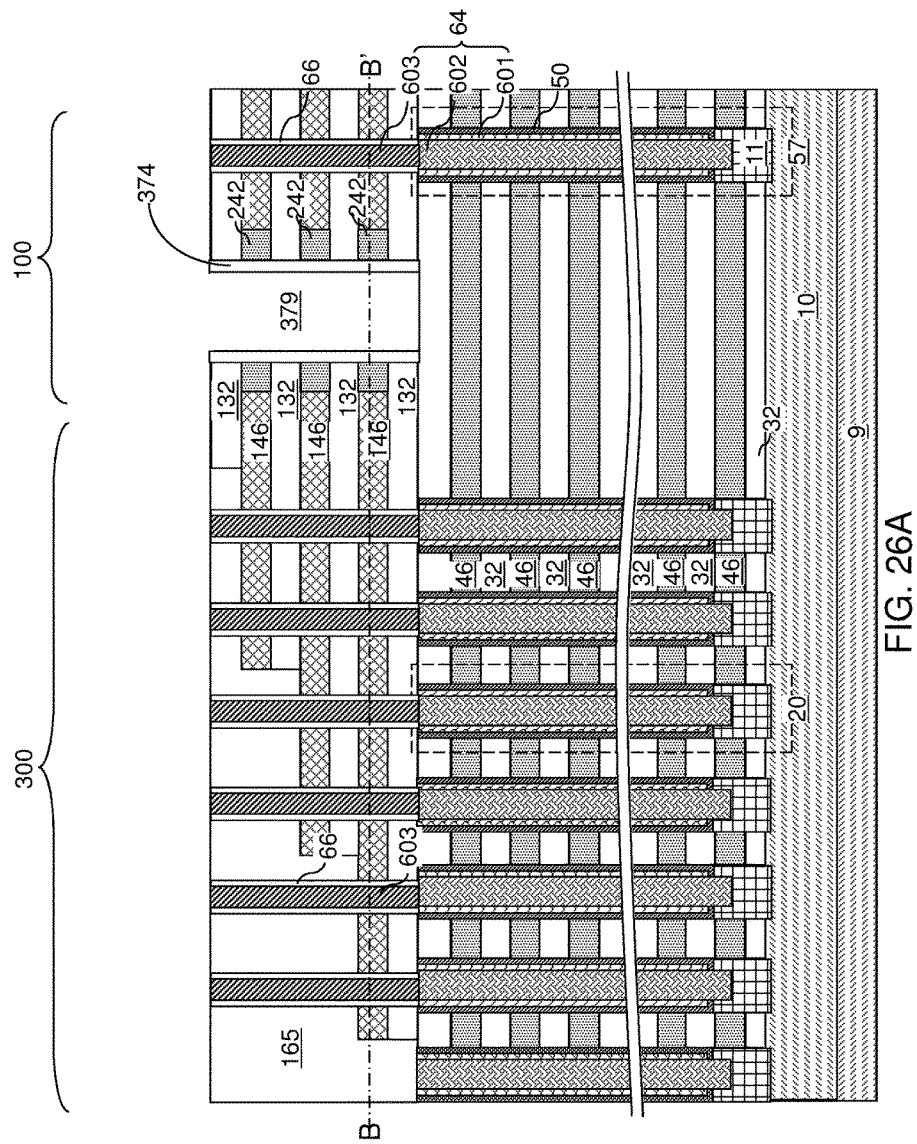
FIG. 26A is a schematic vertical cross-sectional view of the second exemplary structure after formation of upper backside trenches and outer insulating spacers according to the second embodiment of the present disclosure.
Figure 26B:
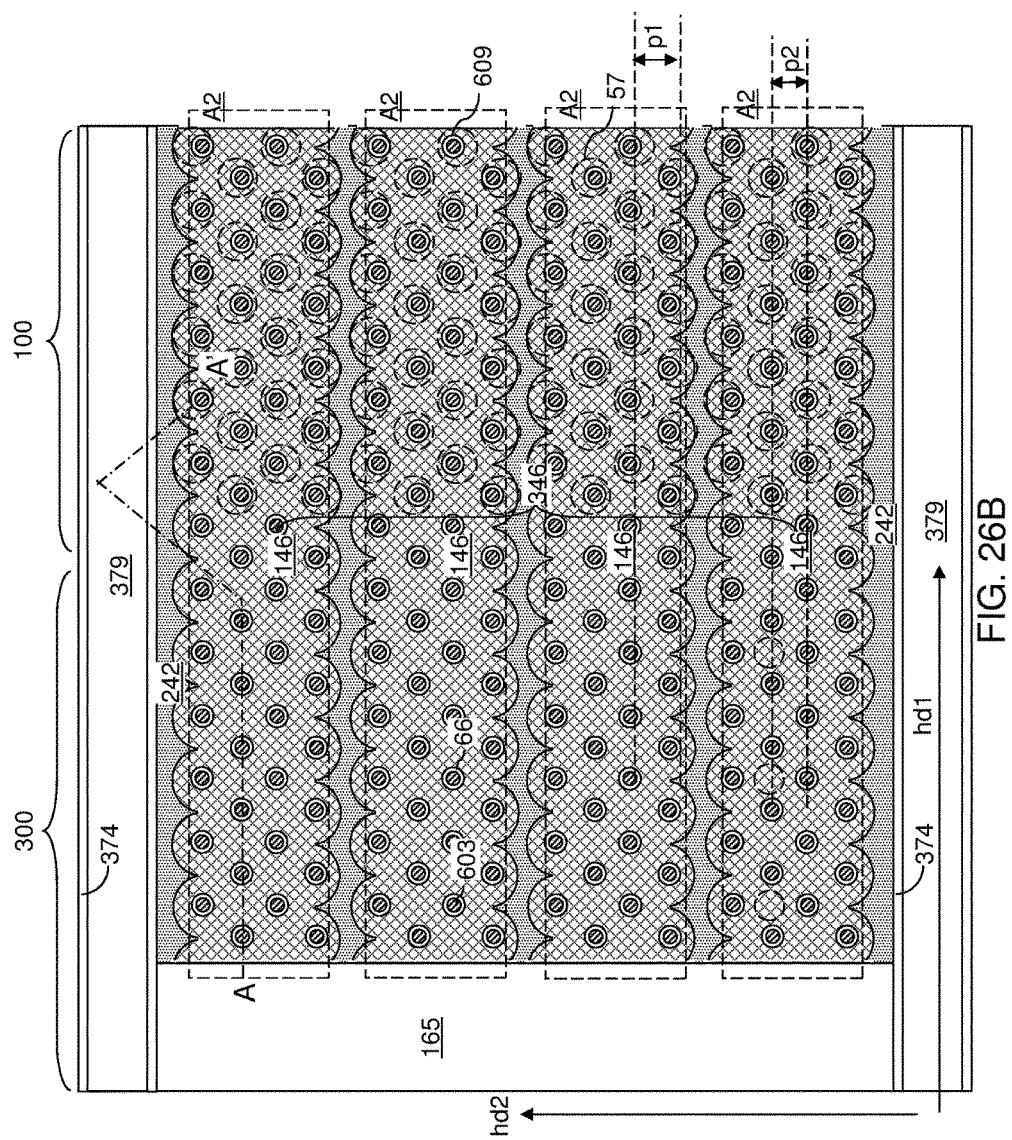
FIG. 26B is a top-down view of the second exemplary structure of FIG. 26A. The vertical plane A-A' is the plane of the schematic vertical cross-sectional view of FIG. 26A.

Referring to FIGS. 26A and 26B, drain select level gate dielectrics 66 can be formed at a periphery of each of the drain select level openings (609, 609'). For example, a continuous dielectric material layer can be deposited by a conformal deposition method in the drain select level openings (609, 609'), and can be anisotropically etched. Each remaining vertical portion of the continuous dielectric material layer within the drain select level openings (609, 609') constitutes a drain select level gate dielectric 66, which can have a tubular shape. A drain select level cavity is provided within each drain select level gate dielectric 66.

A doped semiconductor material is deposited in the drain select level cavities surrounded by the drain select level gate dielectric 66. Excess portions of the doped semiconductor material can be removed from above the top surface of the topmost drain select level insulating layer 132 by a planarization process, which can include a recess etch and/or chemical mechanical planarization. Each portion of the doped semiconductor material that fills the drain select level cavities constitute a drain select level channel portions 603, which is a portion of a vertical semiconductor channel 64 that also includes a memory level channel portion 60 (which may include a first semiconductor channel portion 601 and a second semiconductor channel portion 602).

The lateral offset between the geometrical center of each drain select level channel portion 603 and the underlying memory level channel portion 60 can be different from row to row within each two-dimensional array of drain select level channel portions 603 in which the drain select level portions 603 form rows that extend along the first horizontal direction. The difference between the first pitch p1 between rows of the memory level channel portions 60 (that extend along the first horizontal direction hd1) and the second pitch p2 between rows of the drain select level channel portions 603 is the mechanism for the variations in the lateral offset between the geometrical center of each drain select level channel portion 603 and the underlying memory level channel portion 60 along the second horizontal direction hd2.

Each of the drain select level channel portions 603 can be formed directly on a respective one of the memory level channel portions 60. In one embodiment, the memory stack structures 55 can be arranged in rows that extend along the first horizontal direction hd1 with a first row-to-row pitch (i.e., the first pitch p1) along the second horizontal direction hd2 across an area including two or more electrically conductive line structures 146 of a same drain select level. For each electrically conductive line structure 146, a respective array of drain select level channel portions 603 extends through the electrically conductive line structure 146, and drain select level channel portions 603 within the respective array are arranged in rows that extend along the first horizontal direction hd1 with a second row-to-row pitch (i.e., the second pitch p2) along the second horizontal direction hd2. The second row-to-row pitch p2 is less than the first row-to-row pitch p1.

In one embodiment, the row-to-row distance (as measured between the two lines that pass through geometrical centers of the select level channel portions 603 within each row) between the outer most rows of two neighboring hexagonal arrays of drain select level channel portions 603 can be greater than the second row-to-row pitch p2 by a factor in a range from 1.5 to 3. The difference between the row-to-row distance between the outer most rows of two neighboring hexagonal arrays of drain select level channel portions 603 and the second row-to-row pitch p2 ensures that the electrically insulating line structures 242 can be formed from remaining portions of the at least one drain select level dielectric layer 142 by controlling the duration of the isotropic etch that removes the material of at least one drain select level dielectric layer 142 at the processing steps of FIGS. 24A and 24B.

A photoresist layer (not shown) can be applied over the drain select level alternating stack (132, 346), and can be lithographically patterned to form openings in areas between clusters of memory stack structures 55, i.e., between neighboring arrays of memory stack structures 55. The pattern in the photoresist layer can be transferred through the drain select level alternating stack (132, 346) and/or the drain select level retro-stepped dielectric material portion 165 employing an anisotropic etch to form upper backside trenches 379, which vertically extend from the top surface of the drain select level alternating stack (132, 346) to the top surface of the memory level alternating stack (32, 46), and laterally extend through the memory array region 100 and the contact region 300. In one embodiment, the upper backside trenches 379 can laterally extend along the first horizontal direction hd1, and can be laterally spaced among one another along the second horizontal direction hd2. The photoresist layer can be removed, for example, by ashing.

An insulating material layer can be conformally deposited in the upper backside trenches, and can be anisotropically etched to remove horizontal portions thereof. Remaining portions of the insulating material layer formed at a periphery of each upper backside trench constitutes an outer insulating spacer 374. The outer insulating spacer 374 includes an insulating material, which is different from the material of the sacrificial material layers 42. For example, the outer insulating spacer 374 can include silicon oxide. The thickness of the outer insulating spacer 374 can be in a range from 10 nm to 200 nm, although lesser and greater thicknesses can also be employed. A top surface of the topmost memory level insulating layer 32 can be physically exposed at the bottom of each line cavity 379 that is laterally surrounded by an outer insulating spacer 374.

Figure 27:
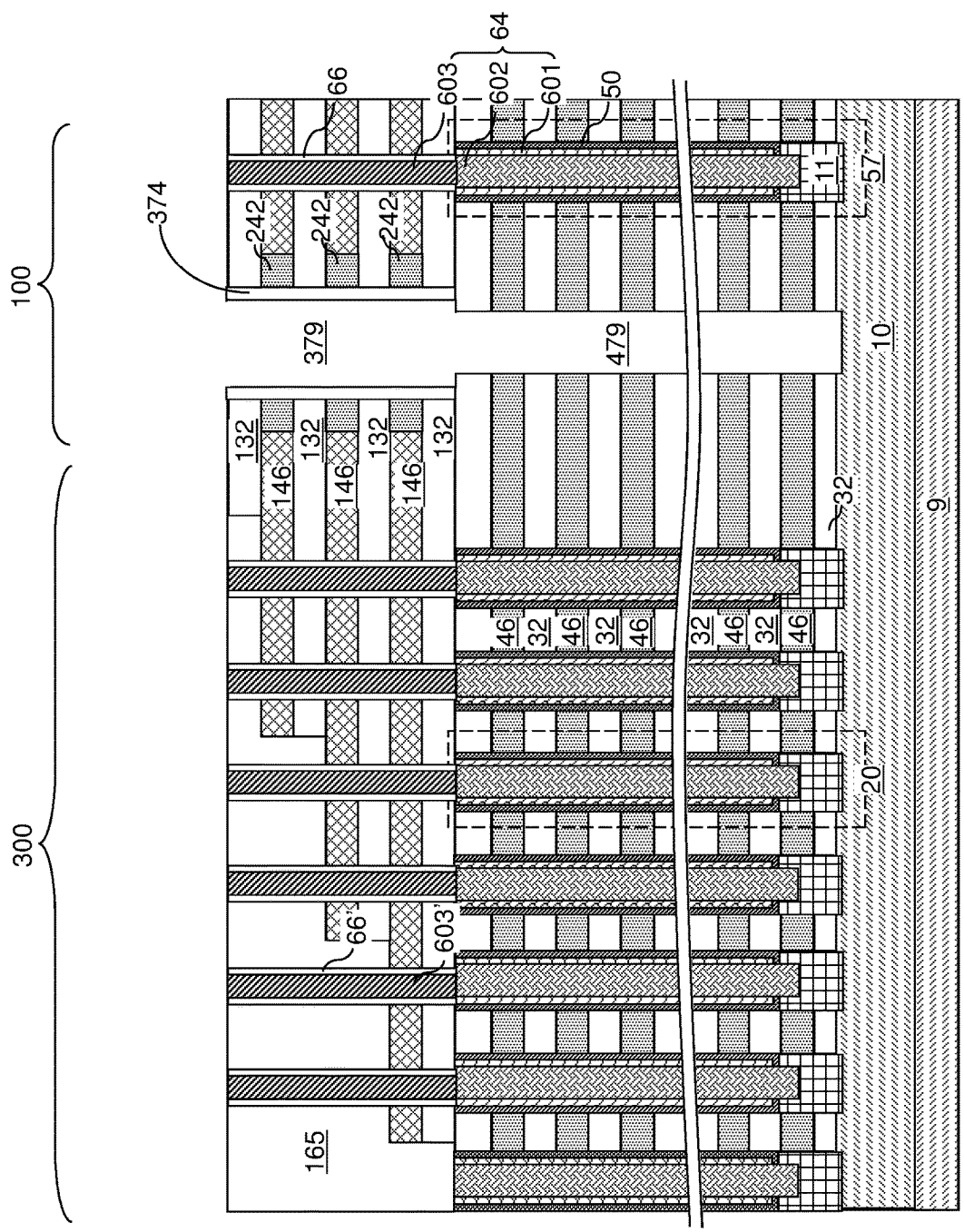
FIG. 27 is a schematic vertical cross-sectional view of the second exemplary structure after formation of lower backside trenches according to the second embodiment of the present disclosure.

Referring to FIG. 27, a photoresist layer (not shown) can be applied over the second exemplary structure, and can be lithographically patterned to form line-shaped openings overlying the cavities within the outer insulating spacers 374. In other words, the areas of the openings in the photoresist layer can be within the areas laterally surrounded by a respective one of the outer insulating spacer 374. An anisotropic etch can be performed to remove portions of the memory level alternating stack (32, 42) from within the areas of the line-shaped openings in the photoresist layer. Lower backside trenches 479 are formed through the memory level alternating stack (32, 42). Each lower backside trench 479 underlies the line cavity 379, and can laterally extend along the first horizontal direction hd1.

Figure 28:
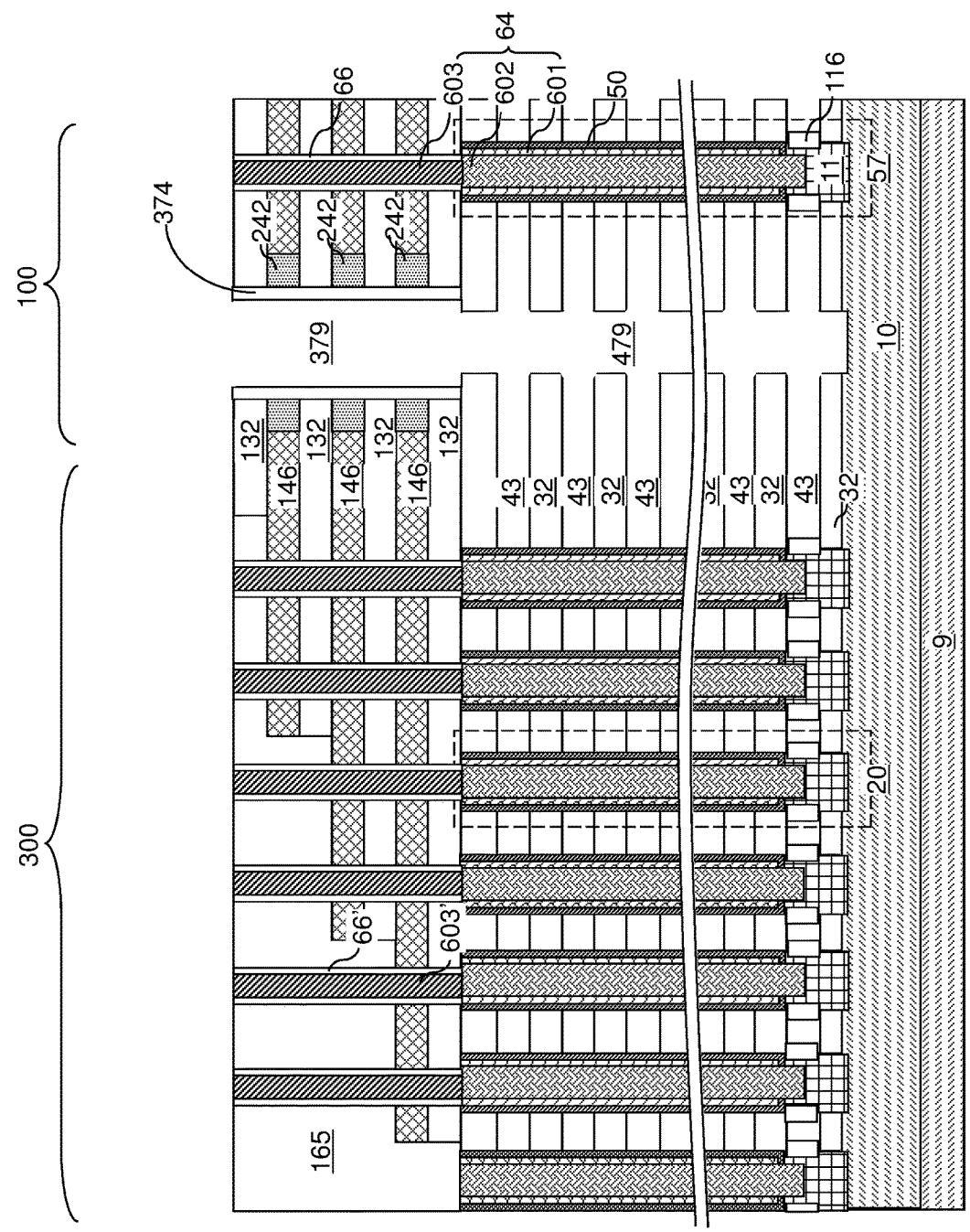
FIG. 28 is a schematic vertical cross-sectional view of the second exemplary structure after formation of backside recesses by removal of sacrificial material layers according to the second embodiment of the present disclosure.

Referring to FIG. 28, an etchant that selectively etches the second material of the sacrificial material layers 42 with respect to the first material of the insulating layers 32 can be introduced into the lower backside trenches 479, for example, employing an etch process. Backside recesses 43 are formed in volumes from which the sacrificial material layers 42 are removed. The removal of the second material of the sacrificial material layers 42 can be selective to material of the outer insulating spacer 374, the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the lower backside trenches 479. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a tubular dielectric spacer 116, and to convert each physically exposed surface portion of the semiconductor material layer 10 into a planar dielectric portion 616 (shown in FIG. 8). In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the epitaxial channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 29:
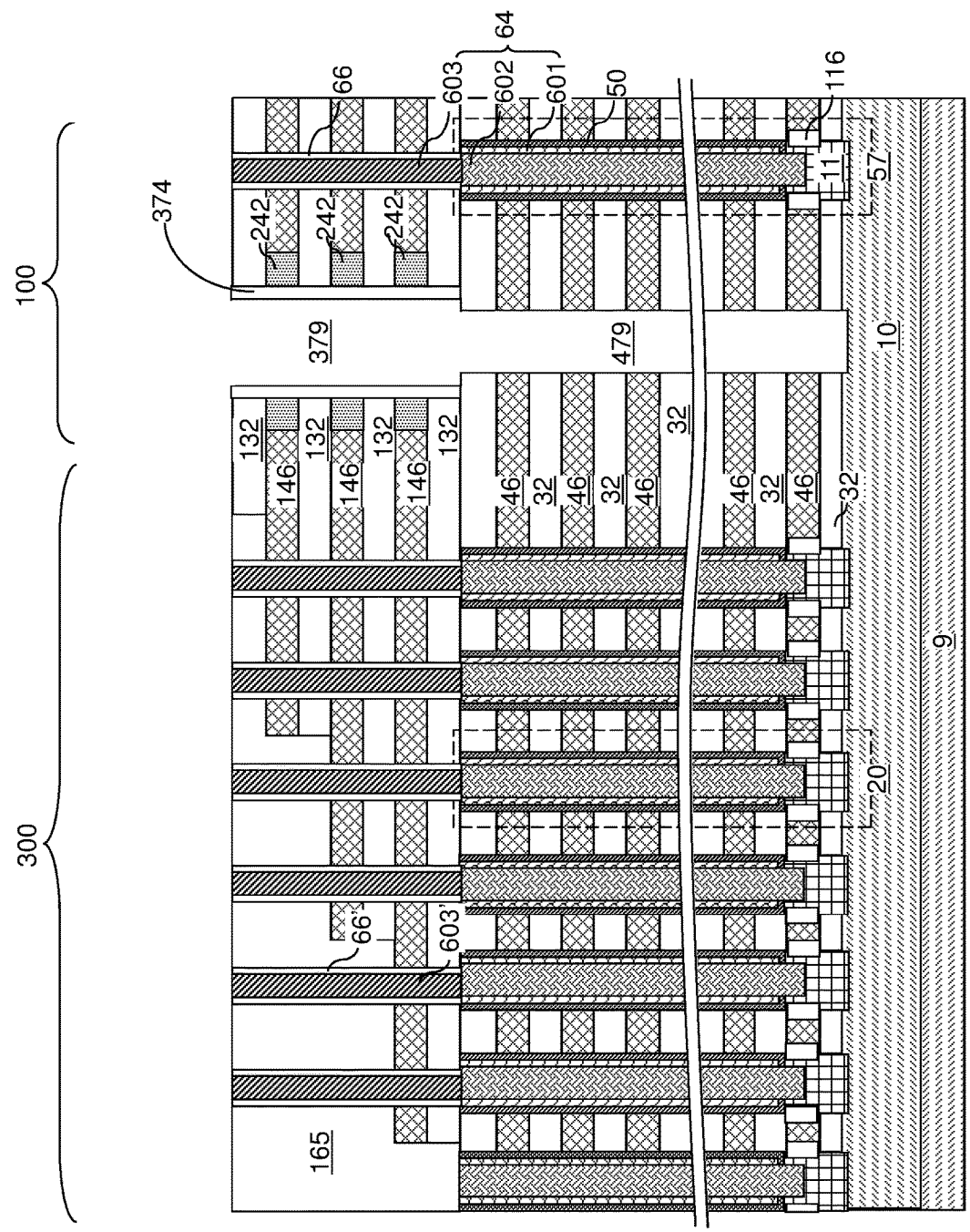
FIG. 29 is a schematic vertical cross-sectional view of the second exemplary structure after formation of electrically conductive layers in the backside recesses according to the second embodiment of the present disclosure.
Figure 30A:
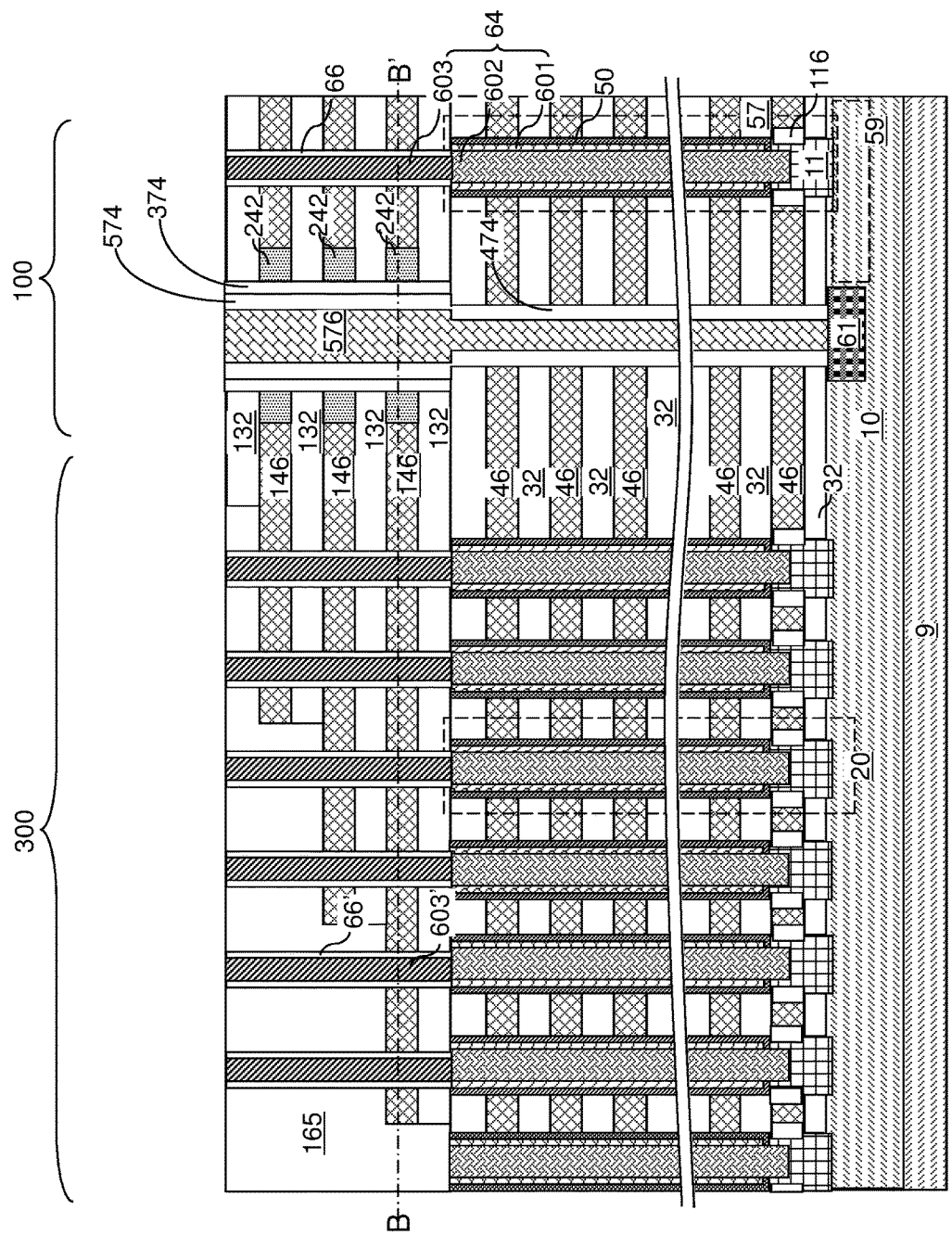
FIG. 30A is a schematic vertical cross-sectional view of the second exemplary structure after formation of a lower insulating spacer, an inner insulating spacer, and a lower conductive via structure within each backside trench according to the second embodiment of the present disclosure.
Figure 30B:
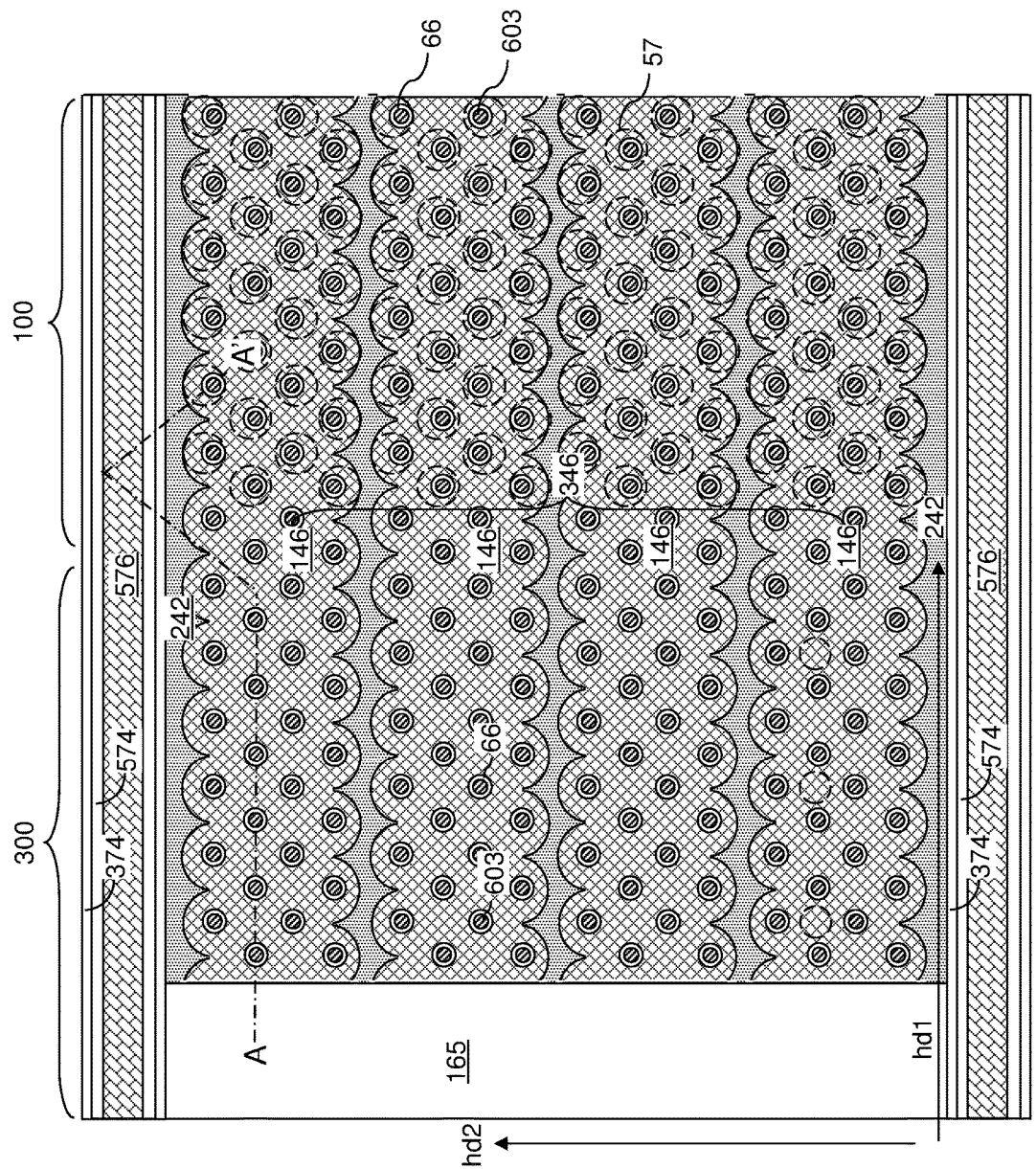
FIG. 30B is a top-down view of the second exemplary structure of FIG. 30A. The vertical plane A-A' is the plane of the schematic vertical cross-sectional view of FIG. 30A.

Referring to FIG. 29, a backside blocking dielectric layer (not shown) can be optionally formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present. The backside blocking dielectric layer can be formed in the same manner as the backside blocking dielectric layer of the first embodiment.

At least one conductive material can be subsequently deposited in the backside recesses 43. The at least one conductive material can include, for example, a metallic barrier layer and a metal fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, on the sidewalls of the at least one the lower backside trench 479, and over the top surface of the topmost insulating layer 32 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer 46B can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each lower backside trench 479 and over the topmost insulating layer 32. Each electrically conductive layer 46 includes a portion of the metallic barrier layer and a portion of the metallic fill material layer that are located between a vertically neighboring pair of dielectric material layers, which can be a pair of insulating layers 32. The continuous metallic material layer includes a continuous portion of the metallic barrier layer and a continuous portion of the metallic fill material layer that are located in the lower backside trenches 479 or above the topmost insulating layer 32.

Each sacrificial material layer 42 can be replaced with an electrically conductive layer 46. A backside cavity is present in the portion of each lower backside trench 479 that is not filled with the backside blocking dielectric layer and the continuous metallic material layer. A tubular dielectric spacer 116 laterally surrounds an epitaxial pedestal 11 (e.g., channel of a source select transistor). A bottommost electrically conductive layer 46 (e.g., source select gate electrode) laterally surrounds each tubular dielectric spacer 116 (e.g., gate dielectric of the source select transistor) upon formation of the electrically conductive layers 46.

The deposited metallic material of the continuous electrically conductive material layer is etched back from the sidewalls of each lower backside trench 479 and from above the topmost insulating layer 32, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer is present, the insulating material layer can be formed directly on surfaces of the backside blocking dielectric layer and directly on the sidewalls of the electrically conductive layers 46. If a backside blocking dielectric layer is not employed, the insulating material layer can be formed directly on sidewalls of the insulating layers 32 and directly on sidewalls of the electrically conductive layers 46.

An anisotropic etch is performed to remove horizontal portions of the insulating material layer from above the topmost drain select level insulating layer 132 and at the bottom of each lower backside trench 479. Each remaining portion of the insulating material layer within the line cavities 379 constitutes an inner insulating spacer 574. Each remaining portion of the insulating material layer within the lower backside trenches 479 constitutes a lower insulating spacer 474. Each set of a lower insulating spacer 474, an outer insulating spacer 374, and an inner insulating spacer 574 is herein referred to as an insulating spacer (374, 474, 574). Each vertically neighboring pair of a lower insulating spacer 474 and an inner insulating spacer 574 may be formed as a single continuous structure, or may be formed as two discrete structures that do not physically contact each other. A backside cavity is present within a volume surrounded by each insulating spacer (374, 474, 574).

A top surface of the semiconductor material layer 10 can be physically exposed at the bottom of each backside trench. A source region 61 can be formed at a surface portion of the semiconductor material layer 10 under each backside cavity by implantation of electrical dopants into physically exposed surface portions of the semiconductor material layer 10. Each source region 61 is formed in a surface portion of the substrate (9, 10) that underlies a respective cavity within the insulating spacer (374, 474, 574). Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer (374, 474, 574).

An upper portion of the semiconductor material layer 10 that extends between the source region 61 and the plurality of epitaxial channel portions 11 constitutes a horizontal semiconductor channel 59 for a plurality of field effect transistors. The horizontal semiconductor channel 59 is connected to multiple vertical semiconductor channels 60 through respective epitaxial channel portions 11. The horizontal semiconductor channel 59 contacts the source region 61 and the plurality of epitaxial channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10).

A conductive via structure 576 can be formed within each backside cavity. The conductive via structures 576 vertically extend through the entirety of the memory level alternating stack (32, 46) and the entirety of the drain select level alternating stack (132, 346). The conductive via structures 576 can be formed by depositing at least one conductive material in the remaining unfilled volume inside each insulating spacer (374, 474, 574). For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be removed from above the topmost drain select level insulating layer 132. If chemical mechanical planarization (CMP) process is employed, the topmost drain select level insulating layer 132 can be employed as a CMP stopping layer. Each remaining continuous portion of the at least one conductive material in the backside trenches constitutes a conductive via structure 576, which is herein referred to as a backside contact via structure. Each conductive via structure 576 extends through the alternating stack (32, 46), and contacts a top surface of a source region 61. If a backside blocking dielectric layer is employed, the conductive via structure 576 can contact a sidewall of the backside blocking dielectric layer.

Figure 31A:
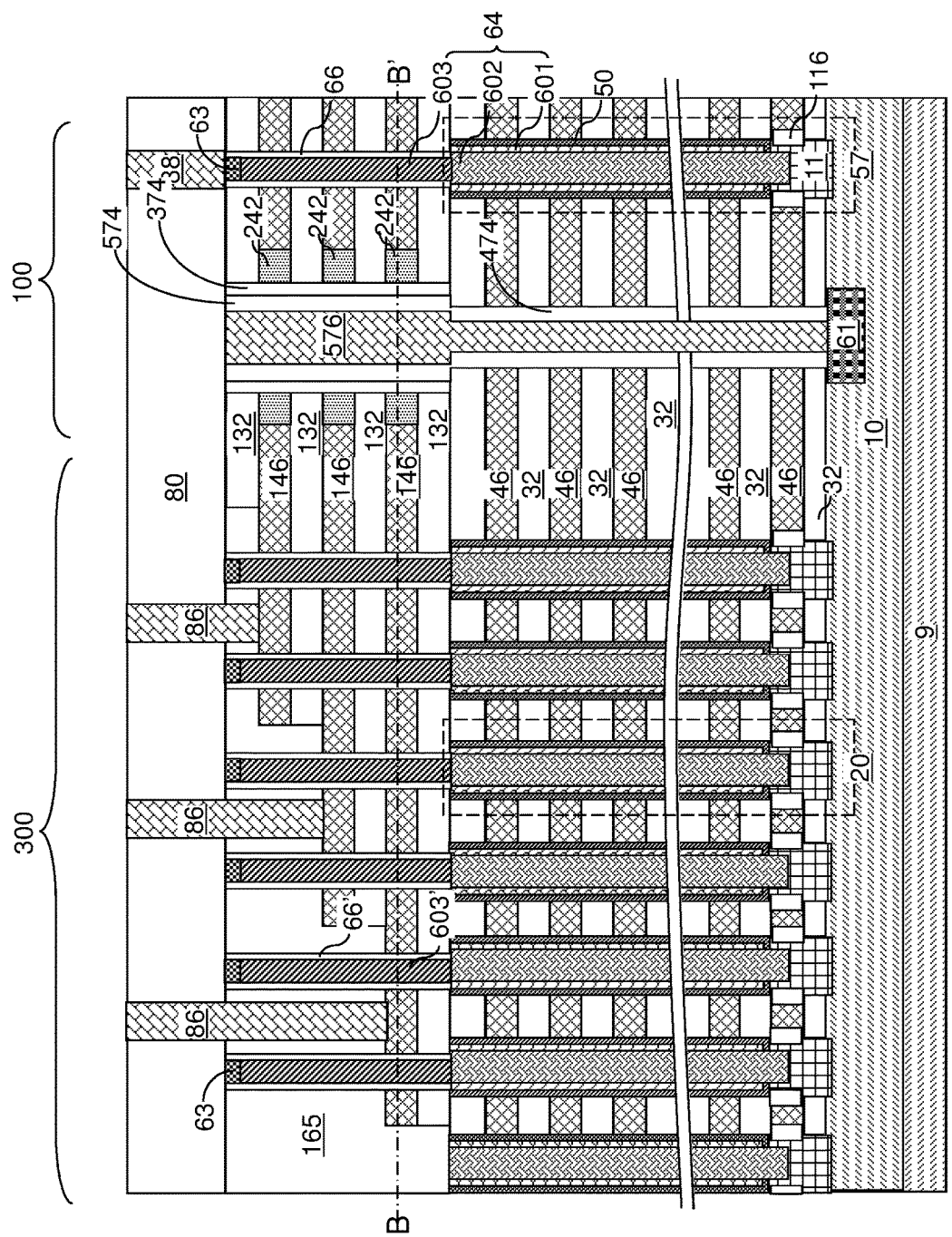
FIG. 31A is a schematic vertical cross-sectional view of the second exemplary structure after formation of various conductive via structures according to the second embodiment of the present disclosure.
Figure 31B:
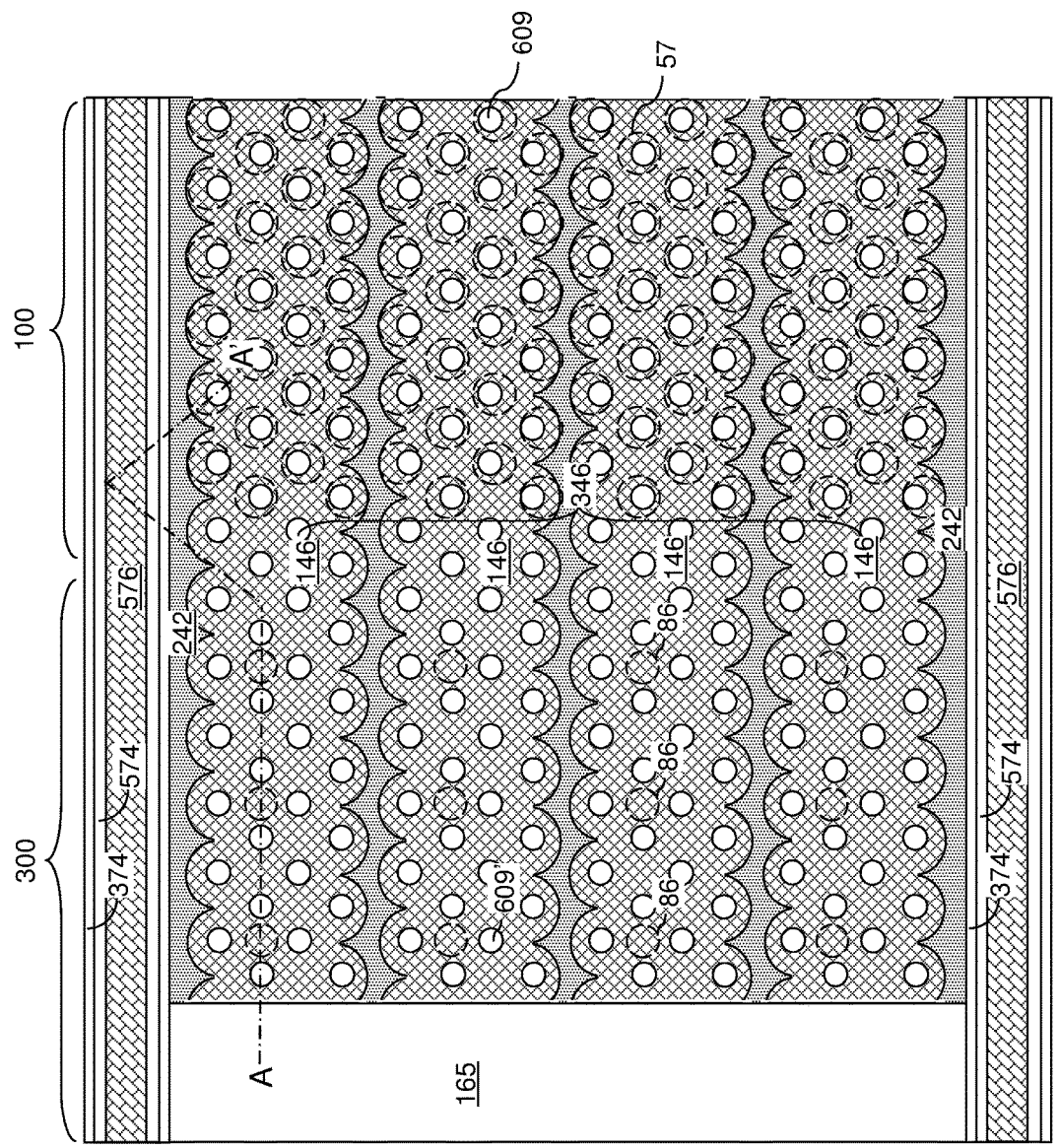
FIG. 31B is a top-down view of the first exemplary structure of FIG. 31A. The vertical plane A-A' is the plane of the schematic vertical cross-sectional view of FIG. 31A.

Referring to FIGS. 31A and 31B, drain regions 63 can be formed by implanting dopants of the first conductivity type into an upper portion of each drain select level channel portion 603. In one embodiment, the source regions 61 and the drain regions 63 can have a doping of the first conductivity type, and the vertical semiconductor channels 64, the semiconductor material layer 10, and the epitaxial pedestals 11 can have a doping of the second conductivity type. The bottom surface of each drain region 63 can be located above the horizontal plane including the top surface of the topmost drain select level conductive layer 346. Semiconductor channels (59, 11, 64) extend between each source region 61 and a respective set of drain regions 63. The semiconductor channels (59, 11, 64) include the memory level channel portions 60 of the memory stack structures 55.

A contact level dielectric material layer 80 can be deposited over the drain select level layers (132, 146). The contact level dielectric material layer 80 includes a dielectric material such as silicon oxide. The contact level dielectric material layer 80 can be deposited by a conformal deposition method or by a non-conformal deposition method. The thickness of the contact level dielectric material layer 80 can be in a range from 50 nm to 500 nm, although lesser and greater thicknesses can also be employed.

Contact via cavities can be formed through the contact level dielectric material layer 80 and the drain select level retro-stepped dielectric material portion 165. For example, a photoresist layer (not shown) can be applied and patterned over the contact level dielectric material layer 80 to form openings therein, and the pattern of the openings in the photoresist layer can be transferred through the contact level dielectric material layer 80 and the drain select level retro-stepped dielectric material portion 165 to form various contact via cavities. At least one conductive material can be deposited in the contact via cavities to form conductive via structures, which include drain contact via structures 88 that contact a respective drain region 63 and control gate contact via structures 86 that contact a respective one of the memory level electrically conductive layers 46 and the drain select level conductive layers 346.

Each of the first and second exemplary structures can include a three-dimensional memory device. The three-dimensional memory device comprises: an alternating stack (32, 46) of insulating layers 32 and electrically conductive layers 46 located over a substrate (9, 10); at least one drain select level conductive layer 346 located over the alternating stack (32, 46), wherein each of the at least one drain select level conductive layer 346 comprises electrically conductive line structures 146 that laterally extend along a first horizontal direction hd1 and are laterally spaced apart among one another along a second horizontal direction hd2; memory stack structures 55 extending through the alternating stack (32, 46), wherein each of the memory stack structures 55 comprises a memory film 50 and a memory level channel portion 60 contacting an inner sidewall of the memory film 50; and drain select level channel portions 603 vertically extending through the at least one drain select level conductive layer 346, contacting a respective memory level channel portion 60, and laterally surrounded by a respective drain select level gate dielectric 66 and a respective one of the electrically conductive line structures 146 at each level of the at least one drain select level conductive layer 346. The memory stack structures 55 are arranged in rows that extend along the first horizontal direction hd1 with a first row-to-row pitch p1 along the second horizontal direction hd2 across an area including two or more electrically conductive line structures 146 of a same drain select level. For each electrically conductive line structure 146, a respective array A2 of drain select level channel portions 603 extends through the electrically conductive line structure 146, and drain select level channel portions 603 within the respective array A2 are arranged in rows that extend along the first horizontal direction hd1 with a second row-to-row pitch p2 along the second horizontal direction hd2. The second row-to-row pitch p2 is less than the first row-to-row pitch p1. Preferably, the drain select level channel portions 603 within the respective array A2 are arranged in at least four rows, such as four to six rows.

Each of the electrically conductive line structures 146 comprises a pair of sidewalls that generally extend along the first horizontal direction hd1 and including vertical convex surface portions that are adjoined among one another. As used herein, a sidewall "generally extends" along a horizontal direction if the overall direction of lateral extension of the sidewall is the horizontal direction. Each of the vertical convex surface portions can be equidistant from a sidewall surface of a most proximal drain select level gate dielectric 66 among the drain select level gate dielectrics 66. This is due to the isotropic nature of the etch process employed to form the drain select level lateral recesses 143.

In one embodiment, the three-dimensional memory device can further comprise additional insulating layers 132 (i.e., drain select level insulating layers 132) overlying the alternating stack (32, 46). Each of the at least one drain select level conductive layer 346 can be located between a respective pair of the additional insulating layers 132. The insulating layers 32 and the additional insulating layers 132 can comprise a first electrically insulating material (such as silicon oxide). Electrically insulating line structures 242 that generally extend along the first horizontal direction hd1 and comprising a second electrically insulating material (such as silicon nitride) can be located between each laterally neighboring pair of the electrically conductive line structures 146 located at a same level. In one embodiment, each of the electrically insulating line structures 242 comprises a pair of sidewalls that generally extend along the first horizontal direction hd1 and including vertical concave surface portions that are adjoined among one another.

In one embodiment, the memory stack structures 55 can be arranged as a first periodic hexagonal array, the respective array of drain select level channel portions 603 can be a respective second periodic hexagonal array, and the first periodic hexagonal array and each second periodic hexagonal array can have a same periodicity along the first horizontal direction hd1 and different periodicities along the second horizontal direction hd2.

In one embodiment, the three-dimensional memory device can further comprise a pair of backside trenches vertically extending through the alternating stack (32, 46) and the at least one drain select level conductive layer 346 and laterally extending along the first horizontal direction hd1. Each of the electrically conductive layers 46 within the alternating stack (32, 46) laterally extends continuously along the second horizontal direction hd2 between the pair of backside trenches, and each of the electrically conductive line structures 146 can be located between the pair of backside trenches.

In one embodiment, each of the pair of backside trenches can comprise a lower backside trench vertically extending through the alternating stack (32, 46) and including a first conductive via structure 76 including a metallic conductive material, and an upper backside trench vertically extending through the at least one drain select level conductive layer 346 and including a second conductive via structure 263 comprising a same doped semiconductor material as the drain select level channel portions 603. In one embodiment, the three-dimensional memory device can further comprise an upper insulating spacer 266 laterally surrounding the second conductive via structure 263, a pair of electrically conductive rails 246 contacting a respective sidewall of the upper insulating spacer 266 and having a uniform vertical cross-sectional shape (such as a rectangular vertical cross-sectional shape in a view that is perpendicular to the first horizontal direction hd1) along the first horizontal direction hd1, and a pair of electrically insulating line structures 242 contacting a respective one of the pair of electrically conductive line structures 146.

In one embodiment, each of the pair of backside trenches comprises: a lower backside trench vertically extending through the alternating stack (32, 46) and including a first insulating spacer 474; an upper backside trench vertically extending through the at least one drain select level conductive layer 346 and including an inner insulating spacer 574 having a same thickness as the first insulating spacer 474 and an outer insulating spacer 374 contacting an outer sidewall of the inner insulating spacer 574; and a conductive material portion 576 that extends through the lower backside trench and the upper backside trench.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

Each of the first and second exemplary structures can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46 can comprise a plurality of control gate electrodes having a strip shape extending substantially parallel to the top surface of the substrate (9, 10), e.g., between a pair of backside trenches. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 64), wherein at least one end portion 64 of each of the plurality of semiconductor channels (59, 11, 64) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 64).

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   at least one drain select level conductive layer located over the alternating stack, wherein each of the at least one drain select level conductive layer comprises electrically conductive line structures that laterally extend along a first horizontal direction and are laterally spaced apart among one another along a second horizontal direction;
   memory stack structures extending through the alternating stack, wherein each of the memory stack structures comprises a memory film and a memory level channel portion contacting an inner sidewall of the memory film; and drain select level channel portions vertically extending through the at least one drain select level conductive layer, contacting a respective memory level channel portion, and laterally surrounded by a respective drain select level gate dielectric and a respective one of the electrically conductive line structures at each level of the at least one drain select level conductive layer; wherein:

the memory stack structures are arranged in rows that extend along the first horizontal direction with a first row-to-row pitch along the second horizontal direction across an area including two or more electrically conductive line structures of a same drain select level;

for each electrically conductive line structure, a respective array of drain select level channel portions extends through the electrically conductive line structure, and drain select level channel portions within the respective array are arranged in at least four rows that extend along the first horizontal direction with a second row-to-row pitch along the second horizontal direction; and the second row-to-row pitch is less than the first row-to-row pitch.

2. The three-dimensional memory device of claim 1, wherein:

the drain select level channel portions within the respective array are arranged in four rows through each electrically conductive line structure; and each of the electrically conductive line structures comprises a pair of sidewalls that generally extend along the first horizontal direction and including vertical convex surface portions that are adjoined among one another.

3. The three-dimensional memory device of claim 2, further comprising additional insulating layers overlying the alternating stack, wherein:

each of the at least one drain select level conductive layer is located between a respective pair of the additional insulating layers; and the insulating layers and the additional insulating layers comprise a first electrically insulating material.

4. The three-dimensional memory device of claim 3, further comprising electrically insulating line structures that generally extend along the first horizontal direction and comprising a second electrically insulating material are located between each laterally neighboring pair of the electrically conductive line structures located at a same level.

5. The three-dimensional memory device of claim 4, wherein each of the electrically insulating line structures comprises a pair of sidewalls that generally extend along the first horizontal direction and including vertical concave surface portions that are adjoined among one another.

6. The three-dimensional memory device of claim 1, wherein:

the memory stack structures are arranged as a first periodic hexagonal array;

the respective array of drain select level channel portions is a respective second periodic hexagonal array; and wherein the first periodic hexagonal array and each second periodic hexagonal array has a same periodicity along the first horizontal direction and different periodicities along the second horizontal direction.

7. The three-dimensional memory device of claim 1, further comprising a pair of backside trenches vertically extending through the alternating stack and the at least one drain select level conductive layer and laterally extending along the first horizontal direction, wherein:

each of the electrically conductive layers within the alternating stack laterally extends continuously along the second horizontal direction between the pair of backside trenches; and each of the electrically conductive line structures is located between the pair of backside trenches.

8. The three-dimensional memory device of claim 7, wherein each of the pair of backside trenches comprises:

a lower backside trench vertically extending through the alternating stack and including a first conductive via structure including a metallic conductive material; and an upper backside trench vertically extending through the at least one drain select level conductive layer and including a second conductive via structure comprising a same doped semiconductor material as the drain select level channel portions.

9. The three-dimensional memory device of claim 8, further comprising:

an upper insulating spacer laterally surrounding the second conductive via structure;

a pair of electrically conductive rails contacting a respective sidewall of the upper insulating spacer and having a uniform vertical cross-sectional shape along the first horizontal direction; and a pair of electrically insulating line structures contacting a respective one of the pair of electrically conductive line structures.

10. The three-dimensional memory device of claim 7, wherein each of the pair of backside trenches comprises:

a lower backside trench vertically extending through the alternating stack and including a first insulating spacer;

an upper backside trench vertically extending through the at least one drain select level conductive layer and including an inner insulating spacer having a same thickness as the first insulating spacer and an outer insulating spacer contacting an outer sidewall of the inner insulating spacer; and a conductive material portion that extends through the lower backside trench and the upper backside trench.

11. The three-dimensional memory device of claim 1, wherein:

the alternating stack comprises a terrace region in which each electrically conductive layer other than a topmost electrically conductive layer within the alternating stack laterally extends farther than any overlying electrically conductive layer within the alternating stack;

the terrace region includes stepped surfaces of the alternating stack that continuously extend from a bottommost layer within the alternating stack to a topmost layer within the alternating stack; and support pillar structures extend through the stepped surfaces and through a retro-stepped dielectric material portion that overlies the stepped surfaces.

12. The three-dimensional memory device of claim 1, wherein:

the three-dimensional memory device comprises a monolithic three-dimensional NAND memory device;

the electrically conductive layers comprise, or are electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:
  a plurality of semiconductor channels, wherein at least one end portion of each of the plurality of semiconductor channels extends substantially perpendicular to a top surface of the substrate, and
  a plurality of charge storage elements, each charge storage element located adjacent to a respective one of the plurality of semiconductor channels.

13. A method of forming a three-dimensional memory device, comprising:
  forming an alternating stack of insulating layers and spacer material layers over a substrate, wherein the spacer material layers are formed as, or are subsequently replaced by, electrically conductive layers;
  forming memory openings through the alternating stack;
  forming memory stack structures in the memory openings, wherein each of the memory stack structures comprises a memory film and a memory level channel portion contacting an inner sidewall of the memory film;
  forming at least one drain select level dielectric layer over the alternating stack;
  forming drain select level openings through the at least one drain select level dielectric layer;
  forming drain select level lateral recesses by removing portions of the at least one drain select level dielectric layer through the drain select level openings, wherein the drain select level lateral recesses are laterally spaced among one another by electrically insulating line structures that are remaining portions of the at least one drain select level dielectric layer;
  forming at least one drain select level conductive layer in the drain select level lateral recesses, wherein each of the at least one drain select level conductive layer comprises electrically conductive line structures that laterally extend along a first horizontal direction and are laterally spaced apart among one another by the electrically insulating line structures along a second horizontal direction;
  forming drain select level gate dielectrics at a periphery of each of the drain select level openings; and
  forming drain select level channel portions in remaining volumes of the drain select level openings.

14. The method of claim 13, wherein the at least one drain select level conductive layer is formed by:
  depositing a conductive material in the drain select level lateral recesses employing the drain select level openings as a conduit for transporting the conductive material; and
  removing portions of the conductive material from inside the drain select level openings.

15. The method of claim 13, wherein:
  each of the drain select level channel portions is formed directly on a respective one of the memory level channel portions,
  the memory stack structures are arranged in rows that extend along the first horizontal direction with a first row-to-row pitch along the second horizontal direction across an area including two or more electrically conductive line structures of a same drain select level;
  for each electrically conductive line structure, a respective array of drain select level channel portions extends through the electrically conductive line structure, and drain select level channel portions within the respective array are arranged in at least four rows that extend along the first horizontal direction with a second row-to-row pitch along the second horizontal direction; and
  the second row-to-row pitch is less than the first row-to-row pitch.

16. The method of claim 15, wherein:
  the memory stack structures are arranged as a first periodic hexagonal array;
  the respective array of drain select level channel portions is a respective second periodic hexagonal array; and
  wherein the first periodic hexagonal array and each second periodic hexagonal array has a same periodicity along the first horizontal direction and different periodicities along the second horizontal direction.

17. The method of claim 13, wherein the at least one drain select level conductive layer is formed prior to, or after, formation of the electrically conductive layers employing a different deposition process than a deposition process employed to form the electrically conductive layers.

18. The method of claim 13, wherein the drain select level lateral recesses are formed by isotropically etching a material of the at least one drain select level dielectric layer employing an etchant that is provided into the drain select level openings.

19. The method of claim 18, wherein:
  each of the electrically insulating line structures laterally extends along a first horizontal direction and includes multiple concave sidewalls that are adjoined among one another; and
  each of the electrically conductive line structures laterally extends along the first horizontal direction and includes multiple convex sidewalls that are adjoined among one another.

20. The method of claim 13, further comprising forming additional insulating layers over the alternating stack, wherein:
  each of the at least one drain select level dielectric layer is located between a respective pair of the additional insulating layers;
  the insulating layers and the additional insulating layers comprise a first electrically insulating material; and
  removal of the portions of the at least one drain select level dielectric layer is performed by an isotropic etch process that is selective a material of the additional insulating layers.

21. The method of claim 13, further comprising forming a pair of backside trenches through the alternating stack and the at least one drain select level dielectric layer, wherein:
  each of the pair of backside trenches laterally extends along a first horizontal direction;
  each of the electrically conductive layers within the alternating stack laterally extends continuously between the pair of backside trenches; and each of the electrically conductive line structures is located between the pair of backside trenches.

22. The method of claim 13, further comprising:
forming a lower backside trench through the alternating stack;
forming a lower insulating spacer and a first conductive via structure in the lower backside trench;
forming an upper backside trench through the at least one drain select level dielectric layer and directly above the first conductive via structure; and
forming an upper insulating spacer laterally surrounding a second conductive via structure within the upper backside trench, wherein the second conductive via structure and the drain select level channel portions are formed by deposition of a doped semiconductor material.

23. The method of claim 13, wherein the spacer material layers are formed as sacrificial material layers, and the method further comprises:
forming an upper backside trench through the at least one drain select level dielectric layer after formation of the at least one drain select level conductive layer through remaining portions of the at least one drain select level dielectric layer;
forming an outer insulating spacer around a periphery of the upper backside trench;
forming a lower backside trench through the alternating stack within an area that is laterally enclosed by the outer insulating spacer;
replacing the sacrificial material layers with the electrically conductive layers by first introducing an etchant that removes the sacrificial material layers and followed by introducing a conductive material that forms the electrically conductive layers through the upper and lower backside trenches.

24. The method of claim 13, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon;
the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
the array of monolithic three-dimensional NAND strings comprises:
a plurality of semiconductor channels, wherein at least one end portion of each of the plurality of semiconductor channels extends substantially perpendicular to a top surface of the substrate, and
a plurality of charge storage elements, each charge storage element located adjacent to a respective one of the plurality of semiconductor channels.

* * * * *